(12) United States Patent
Rashidian et al.

(10) Patent No.: US 10,361,487 B2
(45) Date of Patent: Jul. 23, 2019

(54) POLYMER-BASED RESONATOR ANTENNAS

(75) Inventors: Atabak Rashidian, Saskatoon (CA); David Klymyshyn, Saskatoon (CA); Mohammadreza Tayfeh Aligodarz, Saskatoon (CA); Sven Carsten Achenbach, Saskatoon (CA); Martin Wilfried Börner, Stutensee (DE)

(73) Assignees: University of Saskatchewan, Saskatoon, Saskatchewan (CA); Karlsrúher Institút Für Technologie, Karlsruhe (DE)

( * ) Notice: Subject to any disclaimer, the term of this patent is extended or adjusted under 35 U.S.C. 154(b) by 188 days.

(21) Appl. No.: 14/235,595

(22) PCT Filed: Jun. 11, 2012

(86) PCT No.: PCT/CA2012/050391
§ 371 (c)(1),
(2), (4) Date: Jul. 25, 2014

(87) PCT Pub. No.: WO2013/016815
PCT Pub. Date: Feb. 7, 2013

(65) Prior Publication Data
US 2014/0327597 A1  Nov. 6, 2014

Related U.S. Application Data

(60) Provisional application No. 61/513,354, filed on Jul. 29, 2011.

(51) Int. Cl.
*H01Q 9/04* (2006.01)
*G03F 7/40* (2006.01)
*H01Q 1/50* (2006.01)

(52) U.S. Cl.
CPC ............. *H01Q 9/0485* (2013.01); *G03F 7/40* (2013.01); *H01Q 1/50* (2013.01); *H01Q 9/0492* (2013.01)

(58) Field of Classification Search
CPC .......... H01Q 9/0485; H01Q 1/50; G03F 7/40
(Continued)

(56) References Cited

U.S. PATENT DOCUMENTS

| | | | |
|---|---|---|---|
| 4,907,012 A | 3/1990 | Trumble | |
| 5,940,036 A * | 8/1999 | Oliver | H01Q 9/0485 333/219.1 |

(Continued)

FOREIGN PATENT DOCUMENTS

| | | |
|---|---|---|
| CN | 1653647 A | 8/2005 |
| CN | 101593866 A | 12/2009 |

(Continued)

OTHER PUBLICATIONS

Photolithography (source: Wikipedia).*
(Continued)

*Primary Examiner* — Daniel Munoz
*Assistant Examiner* — Bamidele A Jegede
(74) *Attorney, Agent, or Firm* — Duane Morris LLP

(57) ABSTRACT

Dielectric resonator antennas suitable for use in compact radiofrequency (RF) antennas and devices, and methods of fabrication thereof. Described are dielectric resonator antennas fabricated using polymer-based materials, such as those commonly used in lithographic fabrication of integrated circuits and microsystems. Accordingly, lithographic fabrication techniques can be employed in fabrication. The polymer-based dielectric resonator antennas can be excited using tall metal vertical structures, which are also fabricated using techniques adapted from integrated circuit and microsystems fabrication.

44 Claims, 44 Drawing Sheets

(58) Field of Classification Search
USPC ........................................................ 343/905
See application file for complete search history.

(56) References Cited

U.S. PATENT DOCUMENTS

| | | | |
|---|---|---|---|
| 5,952,972 A * | 9/1999 | Ittipiboon | H01Q 9/0485 |
| | | | 343/700 MS |
| 6,198,450 B1 | 3/2001 | Adachi et al. | |
| 6,323,818 B1 | 11/2001 | Koh et al. | |
| 6,323,824 B1 * | 11/2001 | Heinrichs | H01Q 1/242 |
| | | | 343/785 |
| 6,452,565 B1 | 9/2002 | Kingsley et al. | |
| 6,512,494 B1 | 1/2003 | Diaz | |
| 6,556,169 B1 | 4/2003 | Fukuura et al. | |
| 6,833,816 B2 * | 12/2004 | Hilgers | H01Q 1/243 |
| | | | 343/700 MS |
| 6,952,190 B2 | 10/2005 | Lynch et al. | |
| 7,196,663 B2 | 3/2007 | Bolzer et al. | |
| 7,292,204 B1 * | 11/2007 | Chang | H01Q 9/0485 |
| | | | 343/846 |
| 7,443,363 B2 | 10/2008 | Ying | |
| 7,541,998 B1 * | 6/2009 | Chang | H01Q 9/0492 |
| | | | 343/767 |
| 7,570,219 B1 | 8/2009 | Paulsen et al. | |
| 7,667,666 B2 | 2/2010 | Chang et al. | |
| 7,940,228 B1 | 5/2011 | Buckley | |
| 8,259,032 B1 | 9/2012 | Buckley | |
| 9,374,887 B1 | 6/2016 | Warne et al. | |
| 9,810,823 B2 | 11/2017 | Girard Desprolet et al. | |
| 2002/0024466 A1 * | 2/2002 | Masuda | H01Q 1/243 |
| | | | 343/700 MS |
| 2002/0181646 A1 | 12/2002 | Mehldau | |
| 2003/0011518 A1 | 1/2003 | Sievenpiper et al. | |
| 2003/0052834 A1 | 3/2003 | Sievenpiper et al. | |
| 2003/0142019 A1 * | 7/2003 | Hilgers | H01Q 1/243 |
| | | | 343/700 MS |
| 2004/0119646 A1 * | 6/2004 | Ohno | H01Q 1/1221 |
| | | | 343/700 MS |
| 2004/0130489 A1 * | 7/2004 | Le Bolzer | H01Q 9/0485 |
| | | | 343/700 MS |
| 2005/0030137 A1 | 2/2005 | McKinzie, III et al. | |
| 2005/0057402 A1 * | 3/2005 | Ohno | H01Q 9/0485 |
| | | | 343/700 MS |
| 2005/0062673 A1 | 3/2005 | Wu et al. | |
| 2005/0074961 A1 | 4/2005 | Beyer et al. | |
| 2005/0200540 A1 | 9/2005 | Isaacs et al. | |
| 2006/0092079 A1 | 5/2006 | de Rochemont | |
| 2006/0199380 A1 * | 9/2006 | Liu | H01L 21/76877 |
| | | | 438/638 |
| 2006/0232474 A1 | 10/2006 | Fox | |
| 2006/0267029 A1 | 11/2006 | Li | |
| 2007/0064760 A1 * | 3/2007 | Kragh | B82Y 10/00 |
| | | | 372/92 |
| 2007/0152884 A1 * | 7/2007 | Bouche | H01Q 1/38 |
| | | | 343/700 MS |
| 2007/0182640 A1 | 8/2007 | Oohira | |
| 2007/0222699 A1 | 9/2007 | Modro | |
| 2007/0236406 A1 | 10/2007 | Wen et al. | |
| 2008/0001843 A1 | 1/2008 | Wu et al. | |
| 2008/0018391 A1 | 1/2008 | Bates | |
| 2008/0042903 A1 | 2/2008 | Cheng | |
| 2008/0048915 A1 * | 2/2008 | Chang | H01Q 9/0485 |
| | | | 343/700 MS |
| 2008/0129616 A1 * | 6/2008 | Li | H01Q 9/0485 |
| | | | 343/713 |
| 2008/0129617 A1 * | 6/2008 | Li | H01Q 1/38 |
| | | | 343/713 |
| 2008/0129626 A1 | 6/2008 | Wu et al. | |
| 2008/0272963 A1 * | 11/2008 | Chang | H01Q 1/2291 |
| | | | 343/700 MS |
| 2008/0278378 A1 * | 11/2008 | Chang | H01Q 1/38 |
| | | | 343/700 MS |
| 2008/0286554 A1 | 11/2008 | Schwanke et al. | |
| 2009/0028910 A1 | 1/2009 | DeSimone et al. | |
| 2009/0073332 A1 | 3/2009 | Irie | |
| 2009/0102739 A1 * | 4/2009 | Chang | H01Q 1/2291 |
| | | | 343/846 |
| 2009/0174609 A1 | 7/2009 | Sanada | |
| 2009/0184875 A1 * | 7/2009 | Chang | H01Q 9/0485 |
| | | | 343/700 MS |
| 2009/0278754 A1 | 11/2009 | Tanielian et al. | |
| 2010/0053013 A1 | 3/2010 | Konishi et al. | |
| 2010/0073232 A1 | 3/2010 | Sajuyigbe et al. | |
| 2010/0103052 A1 * | 4/2010 | Ying | H01Q 1/243 |
| | | | 343/702 |
| 2010/0127596 A1 | 5/2010 | Ayazi et al. | |
| 2010/0127798 A1 | 5/2010 | Ayazi et al. | |
| 2010/0147365 A1 | 6/2010 | DeSimone et al. | |
| 2010/0156754 A1 * | 6/2010 | Kondou | H01Q 9/0485 |
| | | | 343/911 R |
| 2011/0057853 A1 | 3/2011 | Kim et al. | |
| 2011/0133991 A1 * | 6/2011 | Lee | H01Q 9/0485 |
| | | | 343/700 MS |
| 2011/0248890 A1 | 10/2011 | Lee et al. | |
| 2011/0248891 A1 | 10/2011 | Han et al. | |
| 2012/0026054 A1 | 2/2012 | Liu et al. | |
| 2012/0242556 A1 | 9/2012 | Ando | |
| 2012/0245016 A1 | 9/2012 | Curry et al. | |
| 2013/0002520 A1 | 1/2013 | Choi et al. | |
| 2013/0088396 A1 | 4/2013 | Han | |
| 2013/0127669 A1 | 5/2013 | Han et al. | |
| 2014/0043124 A1 | 2/2014 | Liu et al. | |
| 2014/0062824 A1 | 3/2014 | Yamaguchi et al. | |
| 2014/0111400 A1 | 4/2014 | Latrach et al. | |
| 2014/0118217 A1 | 5/2014 | Cannon et al. | |
| 2014/0118218 A1 | 5/2014 | Jordan et al. | |
| 2015/0380824 A1 | 12/2015 | Tayfeh Aligodarz et al. | |
| 2016/0111769 A1 | 4/2016 | Pance et al. | |
| 2016/0218437 A1 | 7/2016 | Guntupalli et al. | |
| 2016/0294068 A1 | 10/2016 | Djerafi et al. | |
| 2016/0322708 A1 | 11/2016 | Tayfeh Aligodarz et al. | |
| 2017/0365920 A1 | 12/2017 | Mukai et al. | |

FOREIGN PATENT DOCUMENTS

| | | | | |
|---|---|---|---|---|
| CN | 101710650 A | 5/2010 | | |
| CN | 103337714 A | 10/2013 | | |
| EP | 0 801 436 A2 | 10/1997 | | |
| EP | 1 767 528 B1 | 3/2012 | | |
| GB | 2396747 A | 6/2004 | | |
| WO | 01031746 A1 | 5/2001 | | |
| WO | 2003098737 A1 | 11/2003 | | |
| WO | 2015/089643 A1 | 6/2006 | | |
| WO | 2007147446 A1 | 12/2007 | | |
| WO | WO 2009004361 A1 * | 1/2009 | ............... | H01Q 9/28 |
| WO | 2013/016815 A1 | 2/2013 | | |
| WO | 2014/117259 A1 | 8/2014 | | |
| WO | 2015/000057 A1 | 1/2015 | | |

OTHER PUBLICATIONS

Rashidian, A. et al., SU-8 Resonator Antenna, Proc. IEEE Int. Symp. Antennas & Prop, 2010, Toronto, Canada, 4 pages.

Rashidian, A. et al., "Deep X-ray Lithography Processing for Batch Fabrication of Thick Polymer-based Antenna Structures", Journal of Micromechanics and Microengineering, 2010, 20 025026, 11 pages.

Rashidian, A. et al., "Photodefinable Microcomposites for Antenna Applications", Proc. IEEE Int. Symp. on Antennas and Propagation (APS 2010), Toronto, Canada, 4 pages.

Rashidian, A. et al., "Strip-fed Excitation of Very Low Permittivity Dielectric Resonator Antennas", Proc. 20th Asia-Pacific Microwave Conference (APMC 2008), Hongkong/Macau, pp. 1-4.

Rashidian, A. et al., "A Novel Approach to Enhance the Bandwidth of Miniaturized Microstrip-fed Dielectric Resonator Antennas", Proc. 3rd European Conference on Antennas and Propagation (Eucap 2009), Berlin, Germany, pp. 397-399.

Rashidian, A. et al., "Very Low Permittivity Slot-fed Dielectric Resonator Antennas with Improved Bandwidth for Millimetre-wave Applications", Proc. 3rd European Conference on Antennas and Propagation (Eucap 2009), Berlin, Germany, pp. 3554-3557.

(56) References Cited

OTHER PUBLICATIONS

Rashidian, A. et al., "Development of Polymer-based Dielectric Resonator Antennas for Millimeter-wave Applications", Progress in Electromag. Research (PIER C), 2010, 13:203-216.
Klymyshyn D.M., et al., "Photoresist-based Resonator Antenna Array", Proc. 6th German Microwave Conf., 2011, Darmstadt, Germany, pp. 14-16.
Rashidian, A. et al., "Photoresist-based polymer resonator antennas: lithography fabrication, strip-fed excitation, and multimode operation", IEEE Antennas and Propagation Magazine, Aug. 2011, 53(4):16-27.
Smith, N.A. et al., "Microstrip-Fed Circular Substrate Integrated Waveguide (SIW) Cavity Resonator and Antenna", Antennas and Propagation Society International Symposium, Jul. 201, pp. 11-17.
International Search Report/Written Opinion dated Sep. 24, 2012, in corresponding International Application No. PCT/CA2012/050391.
European Search Report dated Mar. 15, 2015 in counterpart European patent application No. 12820623.2.
Petosa, A. et al., "Design and Analysis of Multisegment Dielectric Resonator Antennas", IEEE Transactions on Antennas and Propagation, May 2000, 48(5):738-742.
Official Action dated Jan. 13, 2015 in counterpart Chinese patent application No. 2012800476924.
Office Action for Chinese Patent Application No. 201280047692.4 dated Aug. 20, 2015.
Certificate of Invention Patent for ZL 2012 8 0047692.4, dated May 4, 2016.
International Search Report and Written Opinion dated Mar. 12, 2015 in corresponding International Patent Application No. PCT/CA2014/000905.
International Preliminary Report on Patentability dated Jun. 21, 2016 in corresponding International Patent Application No. PCT/CA2014/000905.
Mohd, et al., "Dual-segment corporate feed four elements array antenna for broadband application", In IEEE Asia-Pacific Conference on Antennas and Propagation (APCAP), 2012, Singapore, 4 pages.
Haneishi, et al., "Array Antenna Composed of Circularly Polarized Dielectric Resonator Antennas", In IEEE Antennas & Propagation Society International Symposium, 1999, Orlando, FL, pp. 252-255.
Extended European Search Report dated Jun. 21, 2017 in corresponding EP Patent Application No. 14871362.1.
International Search Report and Written Opinion dated Apr. 30, 2014 in related International Patent Application No. PCT/CA2014/000074.
Sabah, "Multiband Metamaterials Based on Multiple Concentric Open-Ring Resonators Topology", IEEE Journal of Selected Topics in Quantum Electronics, 2013, 19(1): 8500808 (8 pages).
Kabiri, et al., "A Super-miniaturized Low Profile Antenna on a Substrate of Rose Curve Resonators", In Progress in Electromagnetics Research Symposium (PIERS) Proceedings, Marrakesh, Morocco, 2011, pp. 106-109.
Njoku, et al., "Effective Permittivity of Heterogeneous Substrates with Cubes in a 3-D Lattice", IEEE Antennas and Wireless Propagation Letters, 2011; 10: 1480-1483.
International Preliminary Report on Patentability dated Aug. 13, 2015 in related International Patent Application No. PCT/CA2014/000074.
Extended European Search Report dated Aug. 19, 2016 in related EP Patent Application No. 14746755.9.
Rashidian, et al., "Microwave Performance of Photoresist-Alumina Microcomposites for Batch Fabrication of Thick Polymer-Based Dielectric Structures", Journal of Micromechanics and Microengineering, 2012, 22(10): 1-9.
Sahbani, et al., "New Tunable Coplanar Microwave Phase Shifter With Nematic Crystal Liquid", In the 3rd International Design and Test Workshop, 2008, Monastir, Tunisia, pp. 78-81.
International Search Report and Written Opinion dated Oct. 2, 2014 in related International Patent Application No. PCT/CA2014/000535.
Chaudhary, et al., "Wideband Two-layer Rectangular Dielectric Resonator Antenna with (Zr0.8Sn0.2)TiO4-Epoxy Composite System", 2011 Indian Antenna Week (IAW), Kolkata, India, 4 pages.
Office Action dated Oct. 24, 2017 in related U.S. Appl. No. 14/764,764.
Müller, et al., "Fabrication of ceramic microcomponents using deep X-ray lithography", Microsystem Technologies, 2005, 11(4-5): 271-277.
Petosa, et al., "Dielectric Resonator Antennas: A Historical Review and the Current State of the Art", IEEE Antennas and Propagation Magazine, 2010, 52(5): 91-116.
Extended European Search Report dated Mar. 11, 2015 in corresponding EP Patent Application No. 12820623.2.
Schumacher, et al., "Temperature treatment of nano-scaled barium titanate filler to improve the dielectric properties of high-k polymer based composites", Microelectronic Engineering, 2009, 87: 1978-1983.
Weil, et al., "Highly-anisotropic liquid-crystal mixtures for tunable microwave devices", Electronics Letters, 2003, 39(24): 1732-1734.
Second Office Action dated Aug. 20, 2015 in corresponding CN Patent Application No. 2012800476924.
Hanemann, et al., "Development of new polymer—BaTiO3-composites with improved permittivity for embedded capacitors", Microsyst Technol., 2011, 17(2): 195-201.
Tayfeh Aligodarz, "Air-Gap Standing Parallel Strips Waveguide for X-Ray Lithography Fabrication: Characteristics and Antenna Application", Proceedings of the 5th European Conference on Antennas and Propagation (EUCAP), Rome, Italy, 2011, pp. 1440-1443.
Examination Report dated Mar. 23, 2018 in related EP Patent Application No. 14746755.9.
Final Office Action and Notice of References Cited dated Jun. 26, 2018 in related U.S. Appl. No. 14/764,764.
Examiner's Report dated Nov. 13, 2018 in corresponding CA Patent Application No. 2,843,415.
Notice of Allowance and Notice of References Cited dated Feb. 25, 2019 in related U.S. Appl. No. 14/764,764.

\* cited by examiner

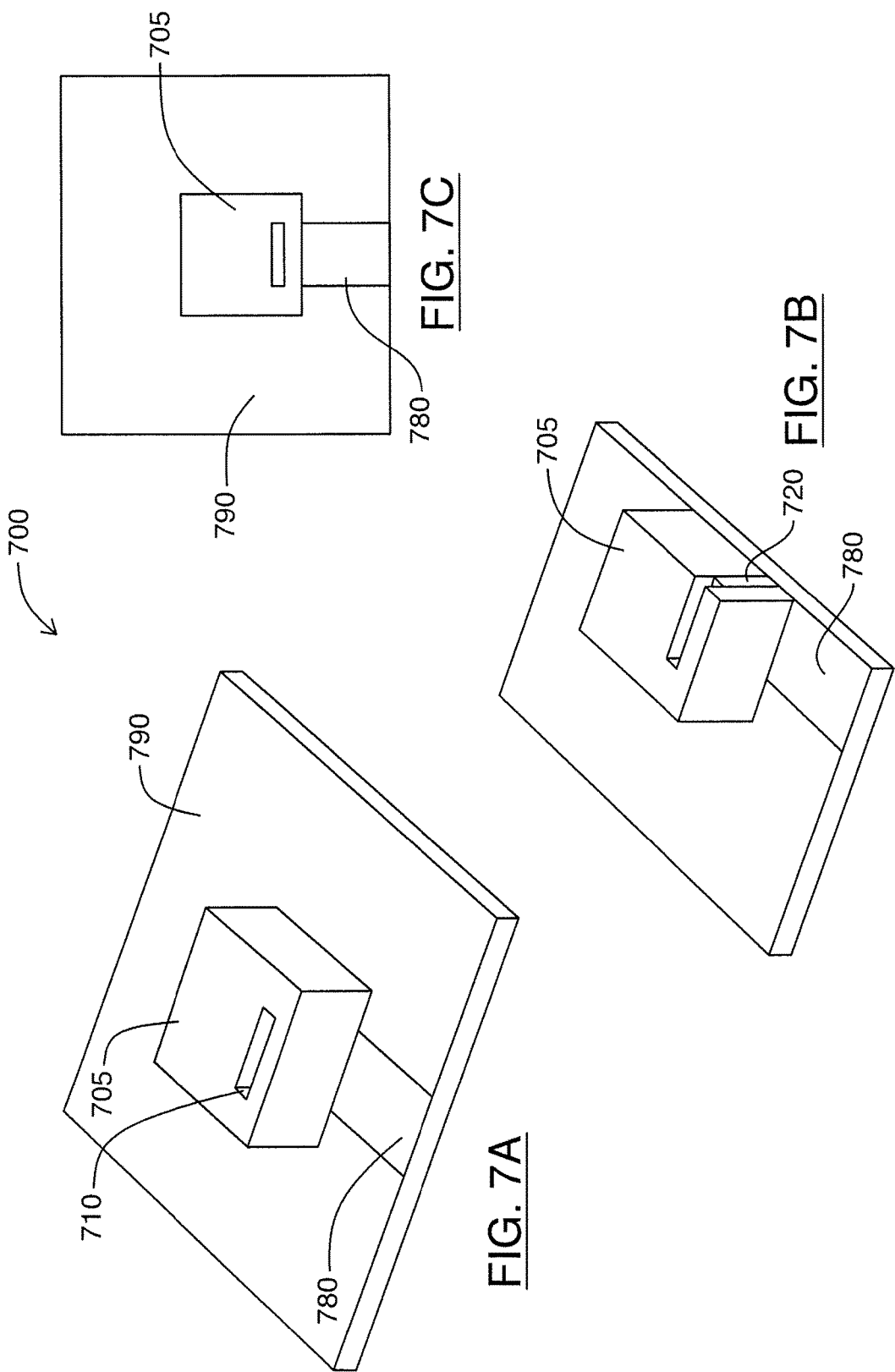

E-PLANE

POLYMER-BASED RESONATOR ANTENNAS

CROSS-REFERENCE TO RELATED APPLICATION

This application claims the benefit of U.S. Provisional Application No. 61/513,354, filed Jul. 29, 2011. The entirety of U.S. Provisional Application No. 61/513,354 is hereby incorporated by reference.

FIELD

The embodiments described herein relate to radio frequency (RF) antennas and methods for fabricating the same. In particular, the described embodiments relate to dielectric resonator antennas.

INTRODUCTION

Contemporary integrated circuit antennas are often based on thin metallic microstrip "patch" structures, which can occupy large lateral areas. A microstrip antenna consists of a metallic strip or patch placed above a grounded substrate and generally fed through a coaxial probe or an aperture.

Recently, dielectric resonator antennas (DRAs) have attracted increased attention for miniaturized wireless and sensor applications at microwave and millimeter-wave frequencies. DRAs are three-dimensional structures with lateral dimensions that can be several times smaller than traditional planar patch antennas, and which may offer superior performance in terms of radiation efficiency and bandwidth.

DRAs are becoming increasingly important in the design of a wide variety of wireless applications from military to medical usages, from low frequency to very high frequency bands, and from on-chip to large array applications. As compared to other low gain or small metallic structure antennas, DRAs offer higher radiation efficiency (due to the lack of surface wave and conductor losses), larger impedance bandwidth, and compact size. DRAs also offer design flexibility and versatility. Different radiation patterns can be achieved using various geometries or resonance modes, wideband or compact antennas can be provided by different dielectric constants, and excitation of DRAs can be achieved using a wide variety of feeding structures.

Despite the superior electromagnetic properties of DRAs, microstrip antennas are still extensively used for low-gain microwave and millimeter-wave applications. The widespread use of microstrip antennas may stem primarily from the relatively low fabrication cost of the modern printed-circuit technology used to manufacture these antennas. By comparison, ceramic-based DRAs can involve a more complex and costly fabrication process due in part to their three-dimensional structure and in part due to the difficulty of working with the ceramic materials.

These fabrication difficulties limit the wider use of DRAs, especially for high volume commercial applications.

In addition, while microstrip patch antennas can easily be produced in various complicated shapes by lithographic processes, DRAs have been mostly limited to simple structures (such as rectangular and circular/cylindrical shapes), Indeed, fabrication of known DRAs can be particularly challenging as they have traditionally been made of high relative permittivity ceramics, which are naturally hard and extremely difficult to machine. Batch fabrication by machining can be difficult, as the hardness of ceramic materials can require diamond cutting tools, which can wear out relatively quickly due to the abrasive nature of the ceramic materials. In addition, ceramics are generally sintered at high temperatures in the range of 900-2000° C., further complicating the fabrication process and possibly restricting the range of available materials for other elements of the DRA. Array structures can be even more difficult to fabricate due to the requirement of individual element placement and bonding to the substrate. Accordingly, they cannot easily be made using known automated manufacturing processes.

Further problems appear at millimeter-wave frequencies, where the dimensions of the DRA are reduced to the millimeter or sub-millimeter range, and manufacturing tolerances are reduced accordingly. These fabrication difficulties have heretofore limited the wider use of DRAs, especially for high volume commercial applications.

SUMMARY

In a first broad aspect, there is provided a dielectric resonator antenna comprising: a substrate with at least a first planar surface; a feedline formed on the first planar surface of the substrate; a polymer-based resonator body comprising at least a first body portion disposed on the first planar surface of the substrate and at least partly upon the feedline, wherein the first body portion at least partly defines a cavity extending in a plane substantially perpendicular to the first planar surface, wherein the cavity exposes a first feedline portion of the feedline; a conductive feed structure disposed within the cavity, the feed structure electrically coupled to the first feedline portion and extending away from the feedline through the cavity.

In some embodiments, the feed structure extends away from the feedline through the cavity by an amount between 10-100% of the height of the cavity.

In some embodiments, the first body portion is comprised of dielectric material that is retained following fabrication.

In some embodiments, the polymer-based resonator body comprises a second body portion provided in abutment to the first body portion.

In some embodiments, the second body portion is in abutment with an outer wall of the first body portion, and the feed structure is fittingly engaged between the first body portion and the second body portion.

In some embodiments, the second body portion is provided within the cavity, and the feed structure is fittingly engaged between an outer wall of the second body portion and an inner wall of the first body portion.

In some embodiments, the second body portion is comprised of a different material than the first body portion.

In some embodiments, the first body portion has a relative permittivity less than 10.

In some embodiments, the polymer-based resonator body is comprised of a pure polymer photoresist material.

In some embodiments, the polymer-based resonator body is comprised of a composite polymer-based photoresist material.

In some embodiments, the dielectric resonator antenna may further comprise a tapered feedline portion, the tapered feedline portion having a first side with a first width and a second side with a second width, wherein the second width is wider than the first width, wherein the conductive feed structure is electrically coupled to the feedline via the tapered feedline portion at the second side, and wherein the feedline is electrically coupled to the conductive feed structure via the tapered feedline portion at the first side.

In an alternative embodiment, there is provided a dielectric resonator antenna comprising: a substrate with at least a first planar surface; a feedline formed on the first planar surface of the substrate; a polymer-based resonator body comprising: a first body portion disposed on the first planar surface of the substrate and at least partly upon the feedline, wherein the first body portion defines a first cavity extending in a plane substantially perpendicular to the first planar surface and a second cavity between a wall of the first cavity and an outer wall of the first body portion, wherein the second cavity exposes a first feedline portion of the feedline; and a second body portion provided within the first body portion; and a conductive feed structure disposed within the second cavity, the feed structure electrically coupled to the first feedline portion and extending away from the feedline through the second cavity.

In a further broad aspect, there is provided a method of fabricating a dielectric resonator antenna, the method comprising: forming a substrate with at least a first planar surface; depositing and patterning a feedline on the first planar surface of the substrate; forming a polymer-based resonator body, comprising at least a first body portion, on the first planar surface of the substrate and at least partly upon the feedline; exposing the polymer-based resonator body to a lithographic source via a pattern mask, wherein the pattern mask defines a cavity to be formed in the polymer-based resonator body, the cavity extending in a plane substantially perpendicular to the first planar surface and at least partially exposing a first feedline portion of the feedline; developing at least one exposed portion of the polymer-based resonator body and removing the at least one exposed portion to reveal the cavity; depositing a conductive feed structure within the cavity, the feed structure electrically coupled to the first feedline portion and extending away from the feedline through the cavity.

In some embodiments, the forming is performed multiple times to progressively increase a thickness of the polymer-based resonator body.

In some embodiments, the forming comprises bonding at least one polymer-based material sheet.

In some embodiments, the forming comprises casting the polymer-based resonator body and baking at temperatures below 200° C.

In some embodiments, the lithographic source is an X-ray source.

In some embodiments, the lithographic source is an ultraviolet light source.

In some embodiments, the developing is performed at temperatures below 250° C.

In some embodiments, the feed structure is deposited using electroplating.

In some embodiments, the feed structure extends away from the feedline through the cavity, and the feed structure has a height between 10-100% of the height of the cavity.

In some embodiments, the method further comprises tuning the dielectric resonator antenna by controlling a feed structure height during the depositing.

In some embodiments, the first body portion is comprised of a dielectric material that is retained following fabrication.

In some embodiments, the forming the polymer-based resonator body further comprises forming at least a second body portion in abutment to the first body portion.

In some embodiments, the second body portion is in abutment with an outer wall of the first body portion, and the feed structure is fittingly engaged between the first body portion and the second body portion.

In some embodiments, the method further comprises forming the second body portion within the cavity, and the feed structure is fittingly engaged between an outer wall of the second body portion and an inner wall of the first body portion.

In some embodiments, the method further comprises removing the first body portion after the second body portion is formed.

In some embodiments, the second body portion is comprised of a different material than the first body portion.

In some embodiments, the polymer-based resonator body is comprised of a pure polymer photoresist material.

In some embodiments, the polymer-based resonator body is comprised of a composite polymer-based photoresist material.

In an alternative embodiment, there is provided a method of fabricating a dielectric resonator antenna, the method comprising: forming a substrate with at least a first planar surface; depositing and patterning a feedline formed on the first planar surface of the substrate; forming a polymer-based resonator body comprising: forming a first body portion disposed on the first planar surface of the substrate and at least partly upon the feedline; exposing the polymer-based resonator body to a lithographic source via a pattern mask, wherein the pattern mask defines a first cavity to be formed in the first body portion extending in a plane substantially perpendicular to the first planar surface, and wherein the pattern mask further defines a second cavity to be formed between a wall of the first cavity and an outer wall of the first body portion, wherein the second cavity exposes a first feedline portion of the feedline; and developing at least one exposed portion of the polymer-based resonator body and removing the at least one exposed portion to reveal the first cavity; further forming a second body portion provided within the first cavity; and depositing a conductive feed structure disposed within the second cavity, the feed structure electrically coupled to the first feedline portion and extending away from the feedline through the second cavity.

In a further broad aspect, there is provided a dielectric resonator antenna comprising: a substrate with at least a first planar surface; a polymer-based resonator body; and an excitation structure for exciting the polymer-based resonator body, wherein the polymer-based resonator body comprises a plurality of metal inclusions extending through the polymer-based resonator body in a direction generally perpendicular to the substrate, and wherein the plurality of metal inclusions are provided in a regular pattern to enhance an effective relative permittivity of the polymer-based resonator body.

In some embodiments, the plurality of metal inclusions have a generally H-shaped profile.

In a further broad aspect, there is provided a dielectric resonator antenna comprising: a substrate with at least a first planar surface; a resonator body coupled to the substrate; a feedline on the first planar surface of the substrate, the feedline having a first width; a conductive feeding structure positioned at least partially between the substrate and the resonator body, the conductive feeding structure having a second width wider than the first width of the feedline; a tapered feedline portion, the tapered feedline portion having a first side with the first width and a second side with the second width, the first side electrically coupled to the feedline and the second side electrically coupled to the conductive feeding structure. The tapered feedline portion may have a trapezoidal shape.

In a further broad aspect, there is provided a dielectric resonator antenna comprising: a substrate with at least a first planar surface; a resonator body coupled to the substrate; a microstrip feedline extending at least partially between the resonator body and the substrate, wherein the feedline abuts the resonator body at a first distance from the substrate surface, and wherein the feedline has a width and a thickness selected to provide a predetermined impedance.

The thickness of the feedline may substantially exceed a planar metal waveguide thickness. In some cases, the thickness is between 100 µm and 1000 µm.

The antenna may further comprise a dielectric support positioned between the feedline and the substrate. The dielectric support may have a low relative permittivity, for example less than 10.

In some cases, the width of the feedline corresponds to the width of the dielectric support. In some cases, the first distance is equal to the thickness of the feedline and a thickness of the dielectric support.

The predetermined impedance may be 50Ω.

In a further broad aspect, there is provided a dielectric resonator antenna comprising: a substrate with at least a first planar surface; a feedline formed on the first planar surface of the substrate; a resonator body comprising at least a first body portion disposed on the first planar surface of the substrate and at least partly upon the feedline, wherein the first body portion at least partly defines a cavity extending in a plane substantially perpendicular to the first planar surface, wherein the cavity exposes a first feedline portion of the feedline; a feeding structure disposed within the cavity, the feeding structure electrically coupled to the first feedline portion and extending away from the feedline through the cavity; a dielectric feed section having an inner wall, an outer wall, a top wall and a bottom wall, the bottom wall opposite the top wall, the dielectric feed section disposed at least partly upon the feedline along its bottom wall and abutting the resonator body along the inner wall; and an external strip disposed along the outer wall of the dielectric feed section, the external strip extending substantially perpendicular to the first planar surface toward the bottom wall from the top wall of the dielectric feed section.

In some cases, the feed structure extends away from the feedline through the cavity by an amount between 10-100% of a height of the cavity.

In some cases, the external strip extends away from the top wall by an amount between 10-100% of a height of the dielectric feed section.

The dielectric feed section may be comprised of a different material than the resonator body. The resonator body may have a relative permittivity less than 10.

DRAWINGS

For a better understanding of the embodiments described herein and to show more clearly how they may be carried into effect, reference will now be made, by way of example only to the accompanying drawings which show at least one exemplary embodiment, and in which:

FIGS. 7A to 7C illustrates an example PRA with an embedded vertical metal strip;

Figure 1A:
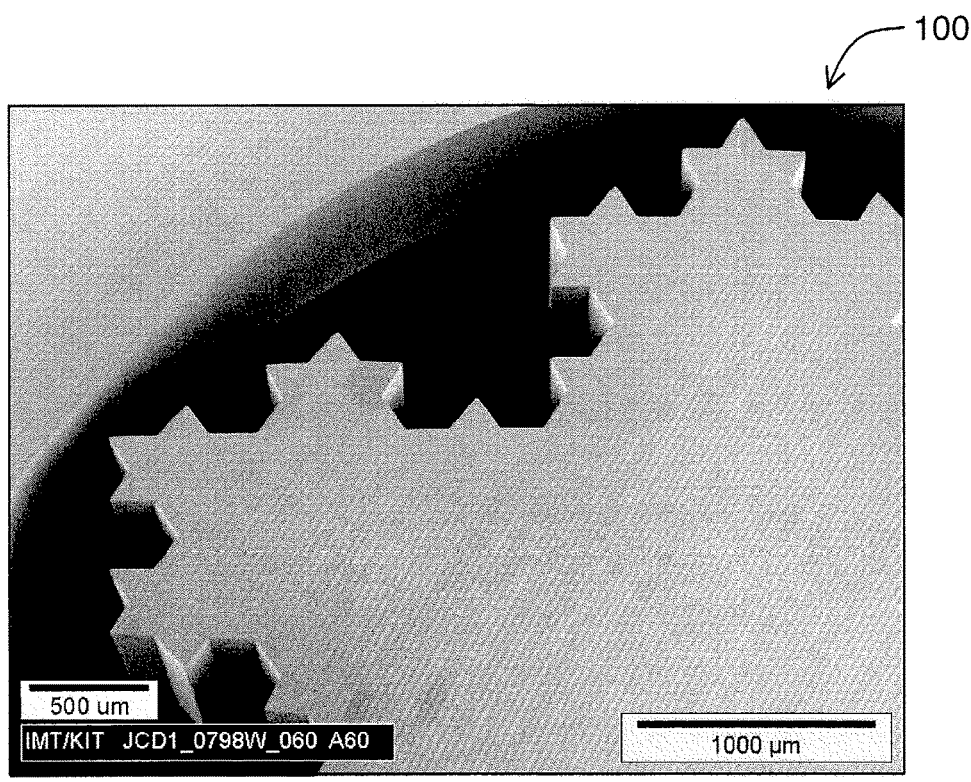
FIG. 1A illustrates a third order Koch Island fractal structure polymer-based antenna element fabricated with deep X-ray lithography.

The skilled person in the art will understand that the drawings, described below, are for illustration purposes only. It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF VARIOUS EMBODIMENTS

The use of polymer-based materials to fabricate DRAs may facilitate greater use of this class of antennas in commercial applications. The natural softness of polymers can dramatically simplify fabrication and their low relative permittivity can further enhance the impedance bandwidth of DRAs.

Described herein are compact radio frequency (RF) antennas and devices using non-traditional polymer-based materials, and methods for fabricating the same. The described compact RF antennas enable improved performance and increased functionality for various emerging wireless communication and sensor devices (e.g., miniature radios/transmitters, personal/wearable/embedded wireless devices, etc.), automotive radar systems, small satellites, RFID, sensors and sensor array networks, and bio-compatible wireless devices and biosensors). In particular, these polymer-based antenna devices may be referred to as polymer or polymer-based resonator antennas (PRAs).

Currently, one of the biggest obstacles to the continued miniaturization of RF wireless devices is antenna structure, which accounts for a large portion of total device sizes. Recently, ceramic-based dielectric resonator antennas (DRAs) have attracted increased attention for miniaturized wireless and sensor applications at microwave and millimeter-wave frequencies. DRAs are three-dimensional structures with lateral dimensions that can be several times smaller than traditional antennas, and which may offer superior performance. Despite the superior properties of ceramic-based DRAs, they have not been widely adopted for commercial wireless applications due to the complex and costly fabrication processes related to their three-dimensional structure and difficulties in fabricating and shaping the hard ceramic materials.

In contrast, the polymer-based DRAs described herein facilitate easier fabrication, while retaining many of the benefits of ceramic-based DRAs. In particular, the natural softness of polymers can dramatically simplify fabrication of dielectric elements, for example by enabling the use of lithographic batch fabrication or other 3D printing or micromachining processes. However, polymer-based DRAs must be effectively excited to resonate and radiate at microwave and millimeter-wave frequencies.

The use of polymer-based materials can dramatically simplify fabrication, due to the natural softness of these materials. In some cases, pure photoresist polymers may be used for direct exposure. In other cases, composite photoresist polymers (e.g., polymers mixed with, for example, ceramic powders or other materials) for direct exposure. Still other materials may be used, for example as described herein with reference to FIGS. 9A and 9B. Moreover, the use of polymer-based materials can provide wide impedance bandwidth, given very low relative permittivity of the polymer materials used. In particular, various diverse polymer types with selected parameters can be used to fulfill the requirements of particular applications or to achieve desired performance characteristics. For example, photoresist polymers (e.g., PMMA) may facilitate the fabrication of DRAs using lithographic processes and elastic polymers (e.g. polydimethylsiloxane (PDMS)) can be used to make pliable low profile PRAs.

Polymer materials may also be mixed with a wide variety of fillers to produce composite materials. If properly mixed, engineered composite materials can offer extraordinary performance. Among the composite materials that may be used include self-powering composites, ferroelectric composites, and ferromagnetic composites.

Self-power composites are materials that are able to convert solar energy to electricity and thereby provide electricity for use by the microwave circuit. Examples of materials in this class include carbon nanotubes and CdS nanorods or nanowires.

Ferroelectric composites are materials that can change antenna properties in response to an applied (e.g., DC) voltage, and thereby introduce flexibility in the design and operation of a microwave circuit. An example of such a material is BST (barium strontium titanate), which is a type of ceramic material.

Ferromagnetic composites are similar to ferroelectric materials, except that they generally change antenna properties in response to applied magnetic fields. Examples of such materials include polymer-metal (iron and nickel) nanocomposites.

High relative permittivity ceramics may also be used to provide particular performance characteristics.

Such fillers can permit the design of "smart" PRAs that can be dynamically adapted (e.g., frequency or polarization agile, or having reconfigurable radiation patterns). Such PRAs would be particular useful in adaptive wireless systems, for example.

As noted above, photoresist and/or photosensitive polymers can be used in combination with a lithographic fabrication process to realize antenna structures with precise features. In particular, known photolithographic techniques have evolved to enable fabrication of passive devices with small features.

However, extension of these lithographic techniques to fabricate high performance passive microwave components—which typically account for more than 75% of circuit elements in wireless transceivers—has been heretofore hindered because the penetration depth of UV light is typically not sufficient for patterning tall structures in common, thick photoresist materials. While, in general, thick structures can improve the performance of various metallic components (e.g., by making tall, low loss compact structures), the fabrication of thick structures is particularly desirable for dielectric components suitable for use at millimeter-wave frequencies, due to the absence of surface currents and metallic loss, and further due to the difficulty of fabricating tiny three-dimensional structures.

In some embodiments, X-ray lithography has been found to be a suitable fabrication technique to enable the patterning of tall structures in thick materials with suitable precision and batch fabrication ability.

X-ray lithography is a technique that can utilize synchrotron radiation to fabricate three-dimensional structures. Structures can be fabricated with a height up to a few millimeters (e.g., typically a maximum of 3 to 4 mm with current techniques) and with minimum lateral structural features (i.e., layout patterns) in the micrometer or sub-micrometer range. As compared to other fabrication techniques such as UV lithography, X-ray lithography can produce much taller structures (up to several millimeters) with better sidewall verticality and finer features.

Figure 1B:
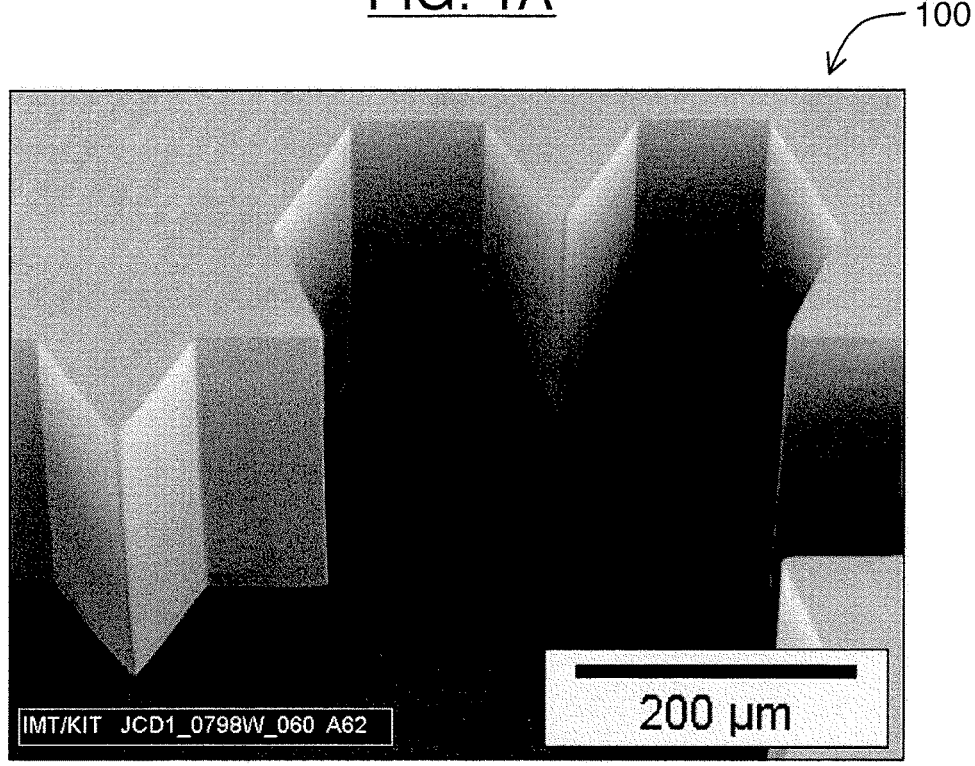
FIG. 1B illustrates the antenna element of FIG. 1A at a higher magnification showing sidewall detail.

Referring now to FIGS. 1A and 1B, there are shown exemplary scanning electron microscope (SEM) images of a polymer-based antenna element 100, demonstrating the ability of X-ray lithography in fabrication of high quality miniature structures. FIG. 1A illustrates a third order Koch Island fractal structure polymer-based antenna element 100 fabricated with deep X-ray lithography. As shown, antenna element 100 has a thickness of 1.8 mm, excellent sidewall verticality better than 89.7°, and a roughness on the order of 26±12 nm. FIG. 1B illustrates the same antenna element 100 at a higher magnification showing sidewall detail.

X-ray lithography may also be used to fabricate tall metallic structures (e.g., capacitors, filters, transmission lines, cavity resonators, and couplers, etc.) and therefore can allow for the fabrication of integrated PRA circuits (e.g., array structures, feeding networks, and other microwave components) on a common substrate.

X-ray lithography can use more energetic and higher frequency radiation than more traditional optical lithography, to produce very tall structures with minimum dimension sizes smaller than one micron. X-ray lithography fabrication comprises a step of coating a photoresist material on a substrate, exposing the synchrotron radiation through a mask, and developing the material using a suitable solvent or developer.

X-ray lithography can also be an initial phase of the so-called LIGA process, where LIGA is the German acronym for Lithographie, Galvanoformung, and Abformung (lithography, electrodeposition, and moulding). A LIGA process may further comprise electroforming of metals and moulding of plastics, which is not strictly required to produce dielectric structures.

X-ray lithography fabrication can be modified and optimized for different materials and structural requirements. Materials used in X-ray lithography fabrication can be selected to satisfy both lithographic properties required for the X-ray lithographic fabrication itself, and the resultant electrical properties of the fabricated antenna.

In particular, the electrical characteristics to be selected for a suitable material include relative permittivity and dielectric loss. In dielectric antenna applications, materials can be selected to have a low dielectric loss (e.g., a loss tangent up to about 0.05, or possibly higher depending on application). For example, values less than about 0.03 for the loss tangent can result in greater than 90% radiation efficiency for an antenna.

In some embodiments, material relative permittivity can be selected to be between 8 and 100. In still other embodiments, relative permittivity may be less than about 10. In some particular embodiments, relative permittivity may be about 4, or lower.

Suitable polymer-based materials for X-ray lithography microfabrication can be selected so that the deposition process is simplified, and to exhibit sensitivity to X-rays in order to facilitate patterning. Accordingly, in some embodiments, pure photoresist materials are used. In some other embodiments, photoresist composites may also be used.

Pure photoresist polymer materials may best facilitate X-ray lithography fabrication, but may be less optimal in terms of antenna performance. Examples of photoresist materials suitable for X-ray lithography include polymethylmethacrylate (PMMA) and Epon SU-8.

PMMA is a positive one-component resist commonly used in electron beam and X-ray lithography. It may exhibit relatively poor sensitivity, thus requiring high exposure doses to be patterned. However, the selectivity (i.e., contrast) achievable with specific developers can be very high, resulting in excellent structure quality. Very thick PMMA layers are sometimes coated on a substrate by gluing. However, patterning thick layers may require very deep X-rays and special adjustments for beamline mirrors and filters.

PMMA exhibits relatively little absorption in the ultraviolet spectrum, which can make it less desirable as a candidate for optical lithography. However, PMMA exhibits excellent optical transparency in the visible light range, which makes it useful in micro-optics applications.

Figure 2A:
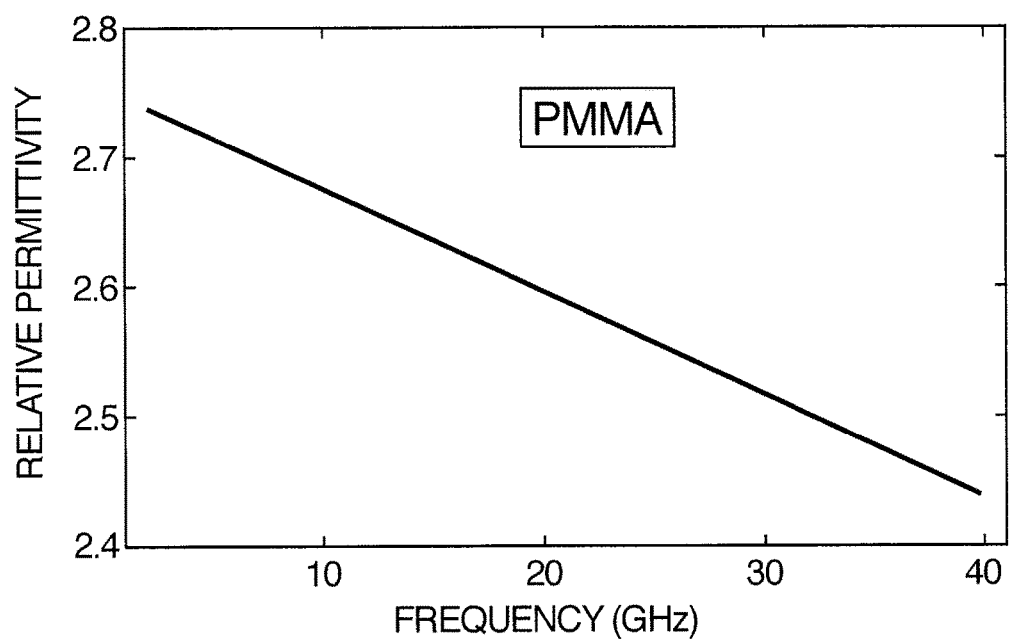
FIGS. 2A and 2B illustrate exemplary plots of the relative permittivity and dielectric loss tangent for pure PMMA, as a function of frequency.
Figure 2B:
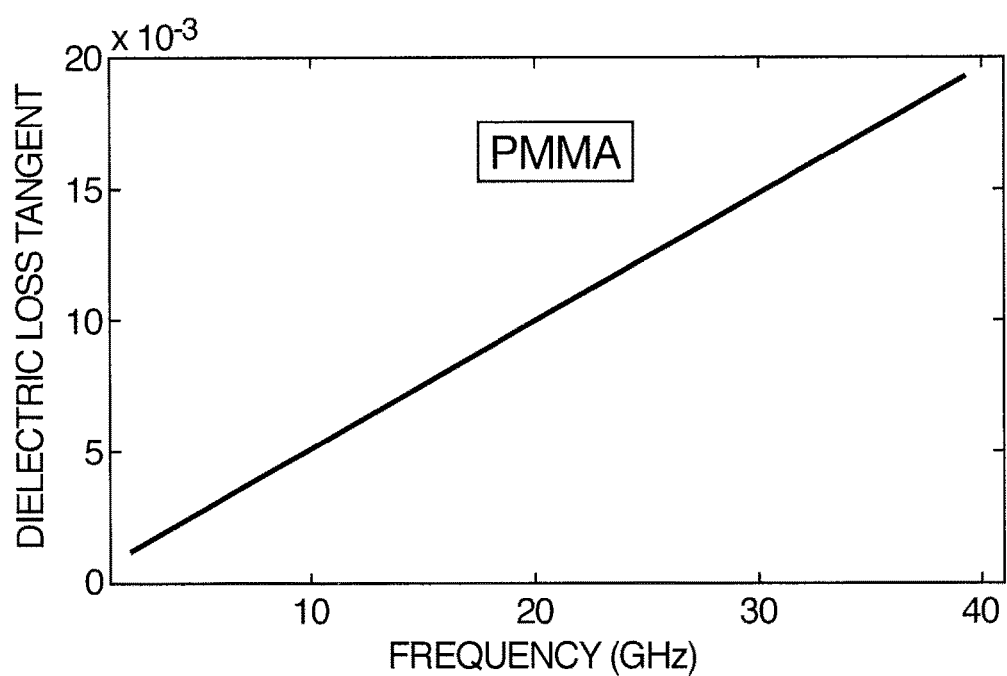

Referring now to FIGS. 2A and 2B, there shown plots of the relative permittivity and dielectric loss tangent for pure PMMA, as a function of frequency. These electrical properties of PMMA were measured using the two-layer microstrip ring resonator technique. At 10 GHz, the relative permittivity and dielectric loss tangent were measured to be 2.65 and 0.005, respectively. The relative permittivity decreases with increased frequency, reaching 2.45 at 40 GHz. In contrast, the dielectric loss tangent increases with increased frequency, reaching 0.02 at 40 GHz.

The low relative permittivity of pure PMMA may make it less suitable for some dielectric antenna applications.

Epon SU-8 is a negative three-component resist suitable for ultraviolet and X-ray lithography. SU-8 exhibits maximum sensitivity to wavelengths between 350-400 nm. However, the use of chemical amplification allows for very low exposure doses. Accordingly, SU-8 may also be used with other wavelengths, including X-ray wavelengths between 0.01-10 nm.

The high viscosity of SU-8 allows for very thick layers to be cast or spin coated in multiple steps. However, side effects such as T-topping may result in defects such as unwanted dose contributions at the resist top, stress induced by shrinking during crosslinking, and incompatibility with electroplating.

Various values for the dielectric properties of SU-8 have been reported in the known art. For example, the dielectric constant of SU-8 has been reported as between 2.8 and 4.

The variation in these reported electrical properties may be due to several factors, including use of different commercial types of SU-8 (e.g. SU-8(5), SU-8(10), SU-8(100), etc.), pre-bake and post-bake conditions (e.g. time and temperature), and exposure dose. Accordingly, the use of SU-8 may require careful characterization of the electrical properties for a particular selected type of SU-8 and corresponding adjustment of fabrication steps.

Figure 3A:
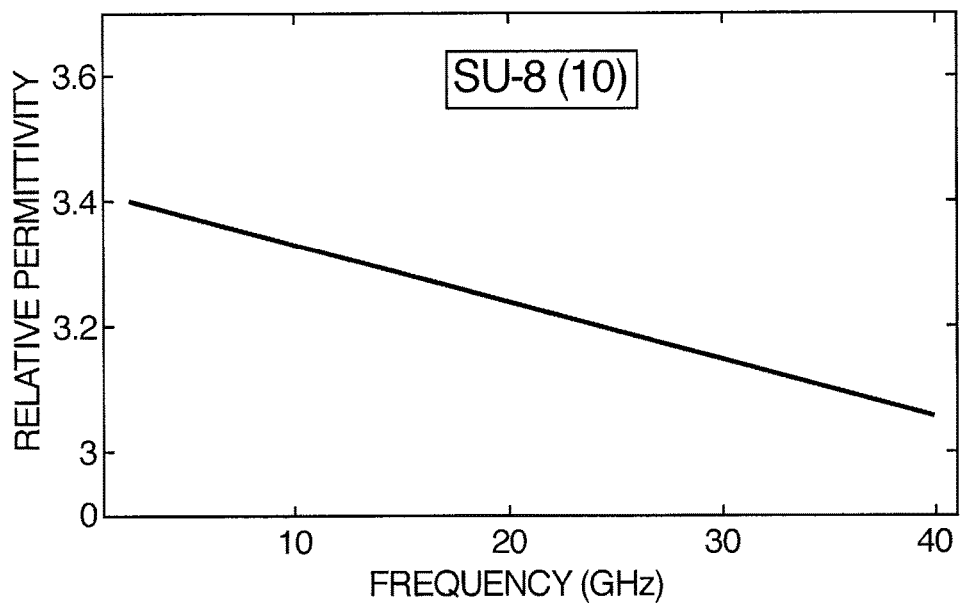
FIGS. 3A and 3B illustrate exemplary plots of the relative permittivity and dielectric loss tangent for SU-8, as a function of frequency.
Figure 3B:
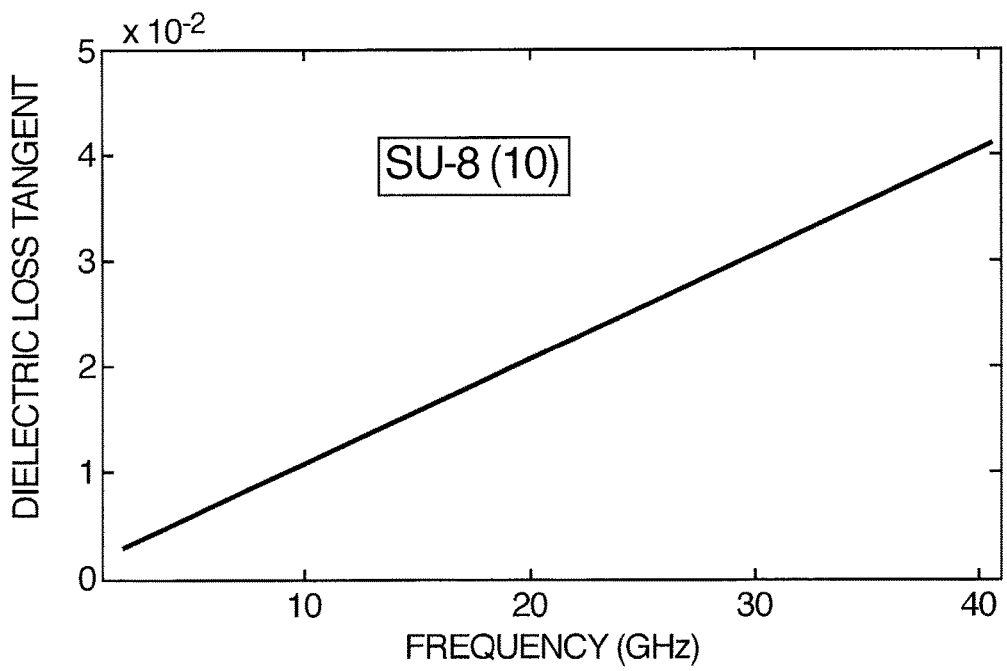

Referring now to FIGS. 3A and 3B, there shown plots of the relative permittivity and dielectric loss tangent for SU-8, as a function of frequency. These electrical properties of SU-8 were independently measured using the two-layer microstrip ring resonator technique. At 10 GHz, the relative permittivity and dielectric loss tangent were measured to be 3.3 and 0.012, respectively. The relative permittivity decreases with increased frequency, reaching 3.1 at 40 GHz. In contrast, the dielectric loss tangent increases with increased frequency, reaching 0.04 at 40 GHz.

As illustrated herein, pure photoresist materials may be less than optimal for microwave and antenna applications. Accordingly, it may be desirable to improve their electrical properties. In some embodiments, materials that enhance desired properties in millimeter-wave and microwave wavelengths, such as ceramic powders and micropowders, may be added to low viscosity photoresist materials. Other fillers could include carbon nanotubes and CdS nanowires, active ferroelectric materials, and high relative permittivity ceramics, which can be selected to form materials with desired properties, such as enhanced tunability or self-powering ability. The resulting photoresist composite materials can provide a broader group of viable materials suitable for dielectric antenna applications. In some cases, the use of such composites may alter photoresist properties, requiring adjustment of lithographic processing, or additional steps in the fabrication process.

Examples of such photoresist composite materials include a PMMA composite incorporating alumina micropowder, and a SU-8 composite also incorporating alumina micropowder.

Figure 4A:
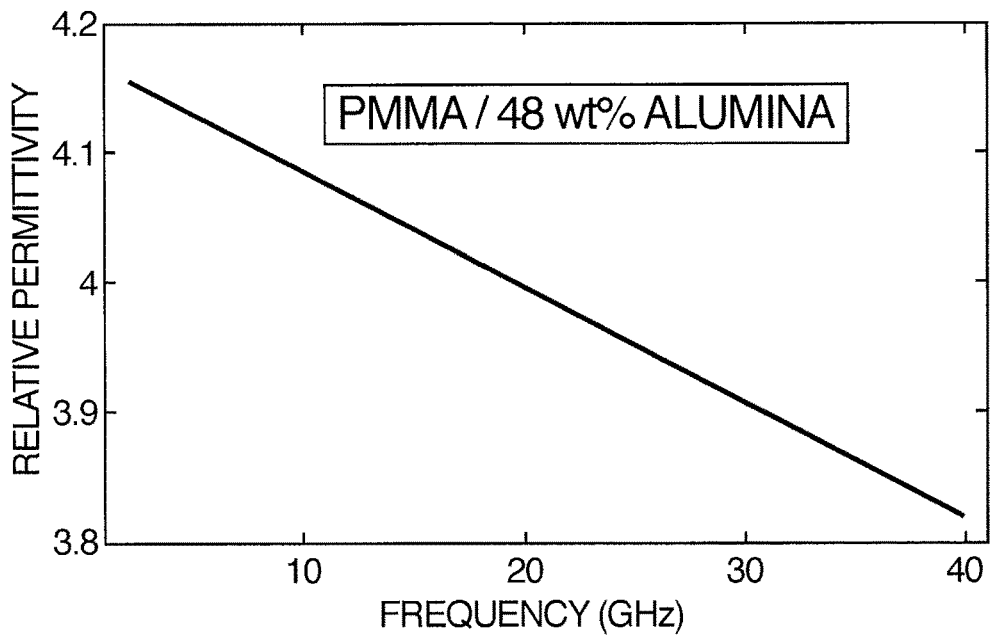
FIGS. 4A and 4B illustrate exemplary plots of the relative permittivity and dielectric loss tangent as a function of frequency for a composite based on PMMA with alumina micropowder comprising 48% of the composite by weight.
Figure 4B:
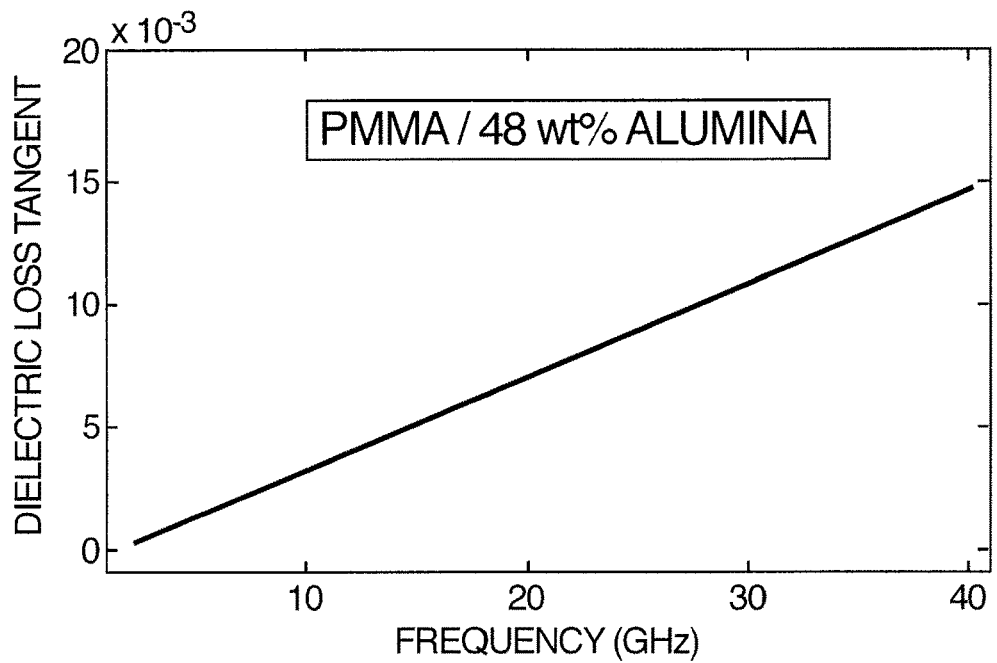

Referring now to FIGS. 4A and 4B, there shown plots of the relative permittivity and dielectric loss tangent as a function of frequency for a composite based on PMMA with alumina micropowder comprising 48% of the composite by weight. These electrical properties of the PMMA composite were measured using the two-layer microstrip ring resonator technique.

Compared to the relative permittivity and loss tangent of pure PMMA, improvements are observable, while the composite remains suitable for use in lithographic fabrication. For example, the relative permittivity at 30 GHz is about 3.9 for the PMMA composite, compared to approximately 2.5 for pure PMMA. Similarly, the loss tangent at 30 GHz is around 0.01 for the composite, compared to approximately 0.015 for pure PMMA.

Figure 5A:
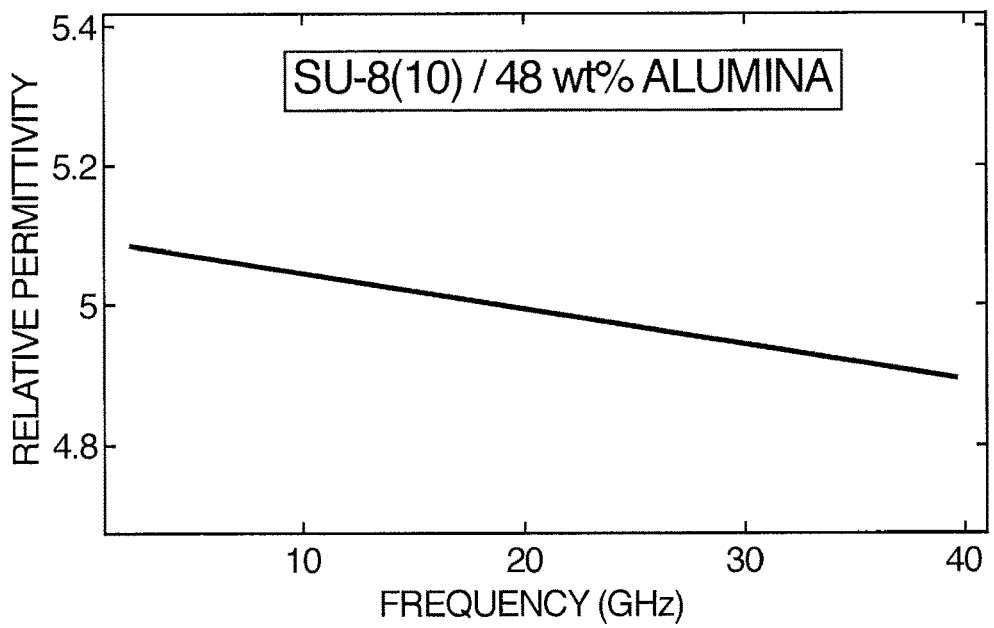
FIGS. 5A and 5B illustrate exemplary plots of the relative permittivity and dielectric loss tangent as a function of frequency for a composite based on SU-8 with alumina micropowder comprising 48% of the composite by weight.
Figure 5B:
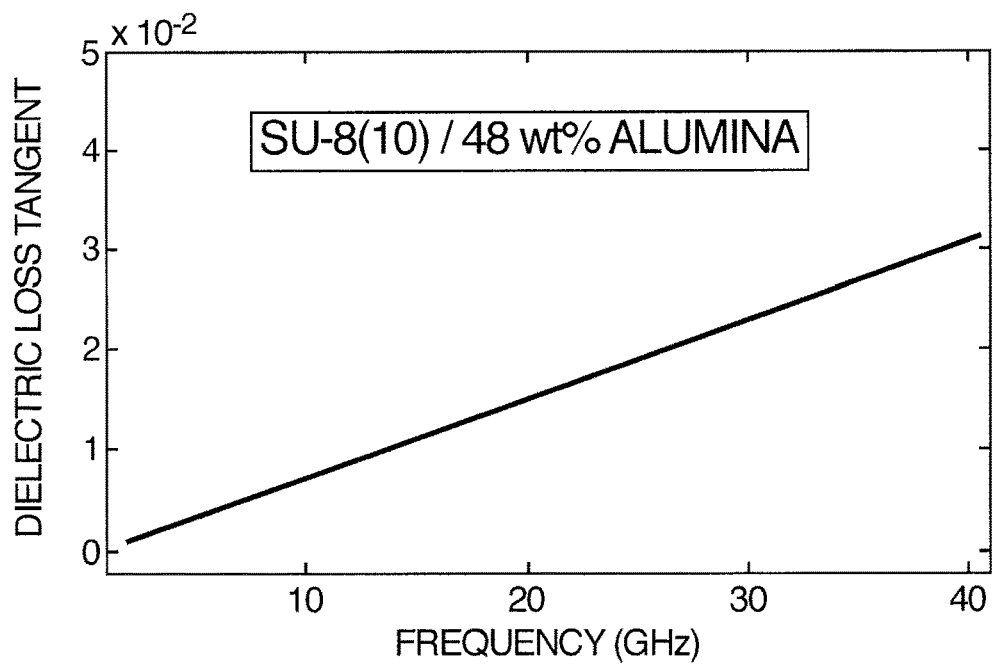

Referring now to FIGS. 5A and 5B, there shown plots of the relative permittivity and dielectric loss tangent as a function of frequency for a composite based on SU-8 with alumina micropowder comprising 48% of the composite by weight. These electrical properties of the SU-8 composite were measured using the two-layer microstrip ring resonator technique.

Again, improvements in the electrical properties of the SU-8 composite can be observed. For example, the relative permittivity at 30 GHz is about 5 for the SU-8 composite, compared to approximately 3.2 for pure SU-8. Similarly, the loss tangent at 30 GHz is around 0.02 for the composite, compared to approximately 0.03 for pure SU-8.

Various composites can be used, which may incorporate other base photoresist materials or other electrical property enhancing fillers. The photoresist materials and electrical property enhancing fillers can be combined in various ratios, depending on the desired electrical properties and fabrication process.

Accordingly, it will be appreciated that the describe embodiments are not limited to photoresist-based polymer materials (e.g., pure photoresist materials such as SU-8 and PMMA, and photoresist composite materials such as SU-8 and PMMA mixed with ceramic or other fillers). However, photoresist-based materials are suitable for lithographic fabrication of antenna structures with precise features in thick layers, particularly if they facilitate the use of deep penetrating lithographies, such as thick resist UV lithography or deep X-ray lithography (XRL).

Excitation of very low relative permittivity PRAs can present a problem, but can nevertheless be achieved in some cases using known methods. For example, a slot feed mechanism or microstrip feedline mechanism can be used. In such arrangements, a resonator body is fed from below, for example along the surface of the substrate.

However, more effective coupling can be achieved using tall metal vertical structures, where the vertical structure extends generally perpendicularly away from the base or substrate. Such tall metal vertical structures can be patterned and fabricated using deep X-ray lithographic fabrication techniques. In such an arrangement, the slot feed or microstrip feed excitation mechanism can be replaced with the vertical structure excitation mechanism.

Figure 6A:
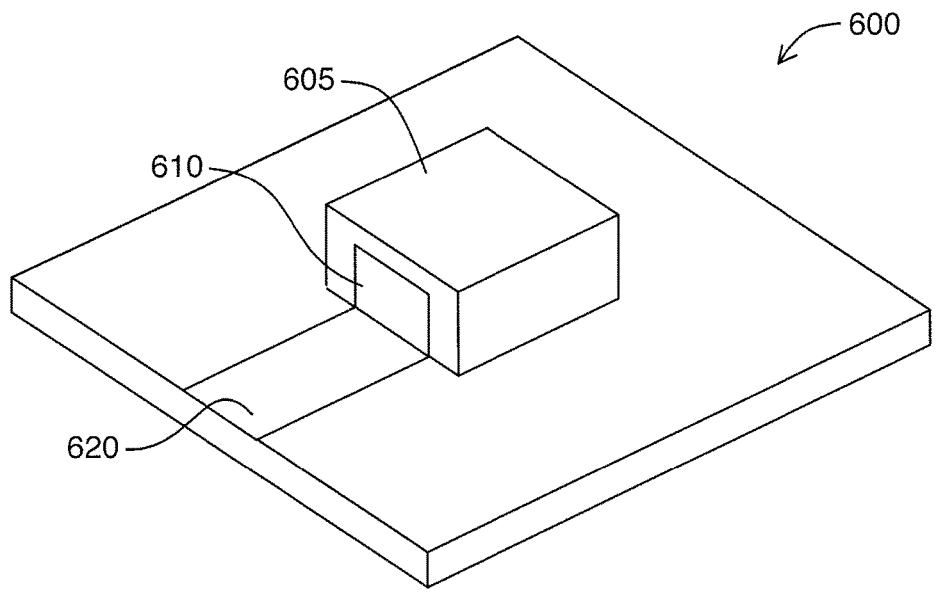
FIG. 6A illustrates an example PRA.

One example of an antenna having a tall metal vertical structure is a vertical open-ended strip structure such as that shown in FIG. 6A. Referring now to FIG. 6A, there is shown a PRA 600 comprising a polymer resonator 605, which is fed by a metal vertical strip 610. Vertical strip 610 has dimensions of approximately 2 mm×1.4 mm, and is electrically coupled to a microstrip feedline 620.

Figure 6B:
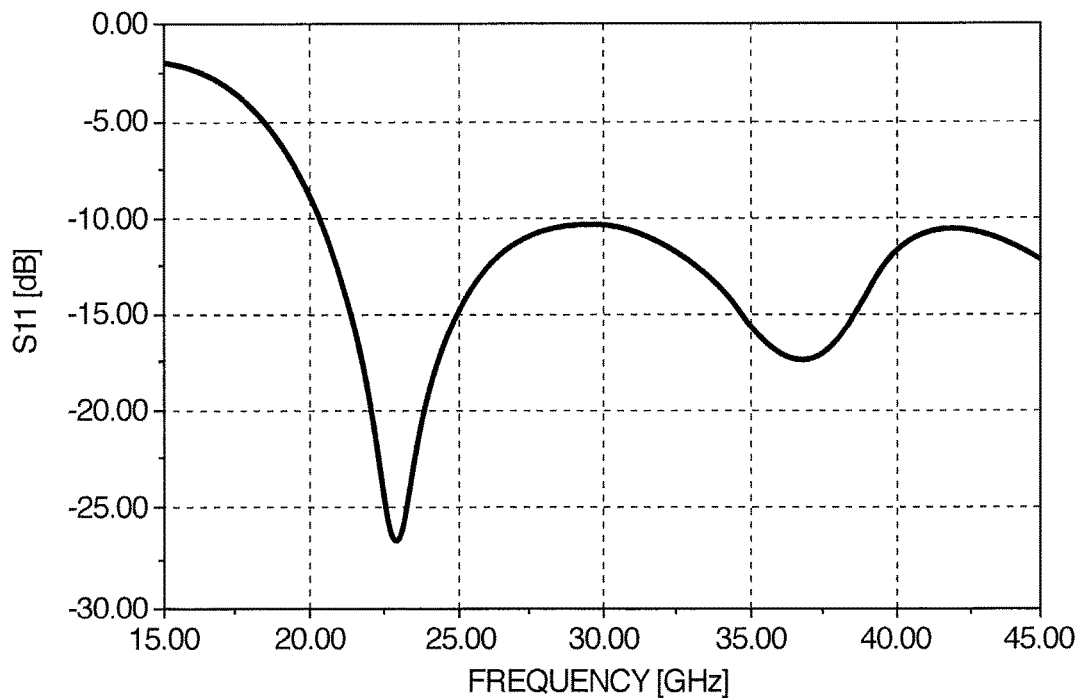
FIG. 6B illustrates the reflection coefficient of the PRA of FIG. 6A as a function of frequency.

Referring now to FIG. 6B, there is illustrated the reflection coefficient of PRA 600 as a function of frequency. It will be appreciated that ultra wideband operation may be achieved using PRA 600.

Figure 6C:
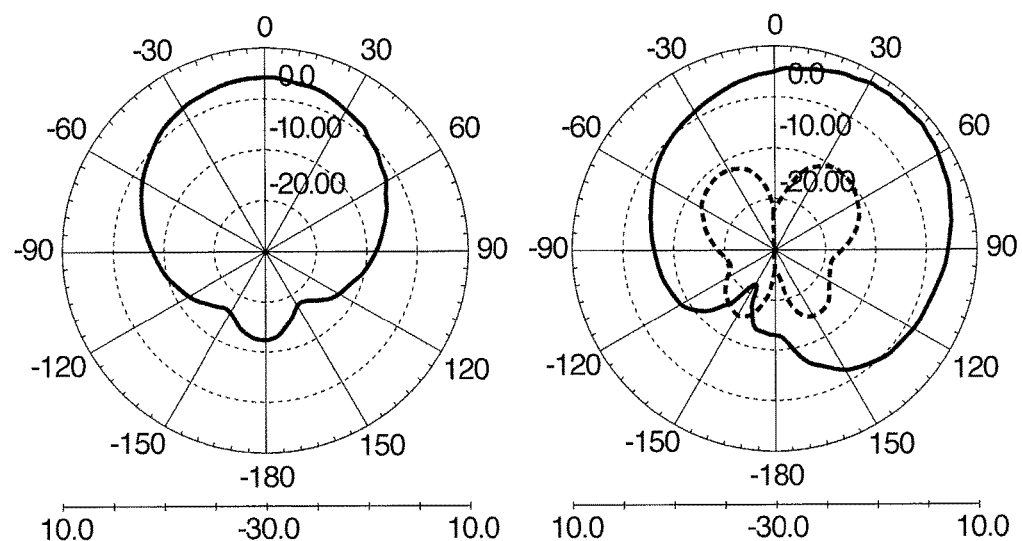
FIG. 6C illustrates E-plane patterns corresponding to the PRA of FIG. 6A.

However, referring now to FIG. 6C, there are shown E-plane patterns corresponding to PRA 600. The E-plane patterns are tilted due to the presence of a metallic structure (e.g., vertical strip 610) on the sidewall of resonator 605. Accordingly, there is an observable asymmetry in the structure of the E-plane pattern with respect to the y-z plane. This asymmetric effect can be more readily observed at higher frequencies.

By comparison to a slot-fed antenna, the resonance of the dominant mode can be decreased from approximately 32.5 GHz for a corresponding slot-fed antenna to 23 GHz for antenna 600. Accordingly, the antenna size can be miniaturized owing to the use of the metal strip.

Higher order modes of PRAs with similar radiation patterns (e.g., $TE_{131}$ at 37 GHz and $TE_{151}$ at a higher frequency) can be excited at frequencies near to the resonant frequency of the dominant mode. As a result, ultra wideband antenna operation can be achieved due to the presence of multiple modes at different frequencies.

Figure 6D:
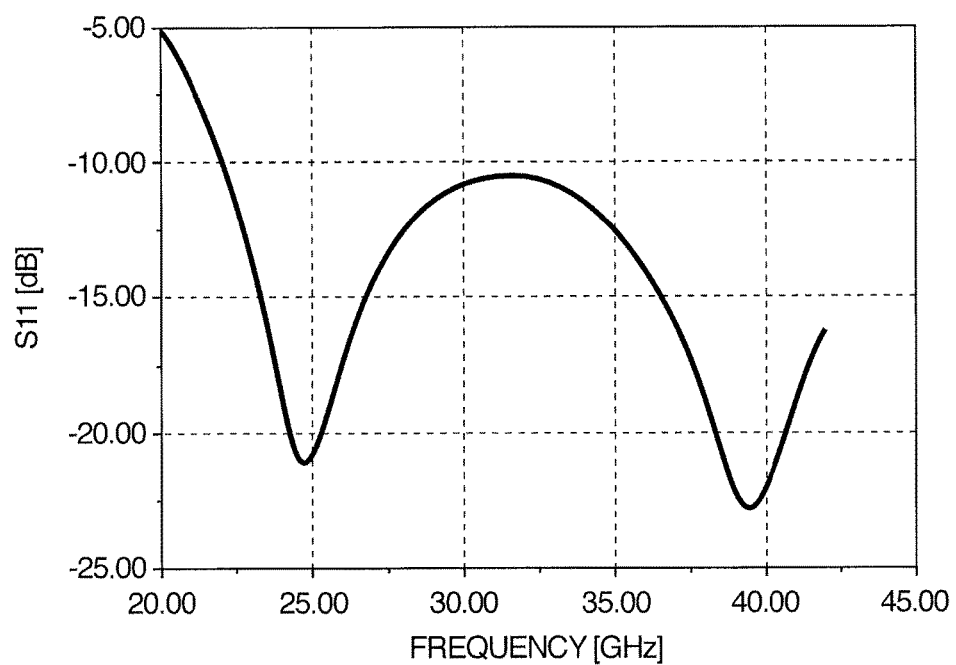
FIGS. 6D and 6E illustrate plots of the reflection coefficients for strip-fed PRAs.
Figure 6E:
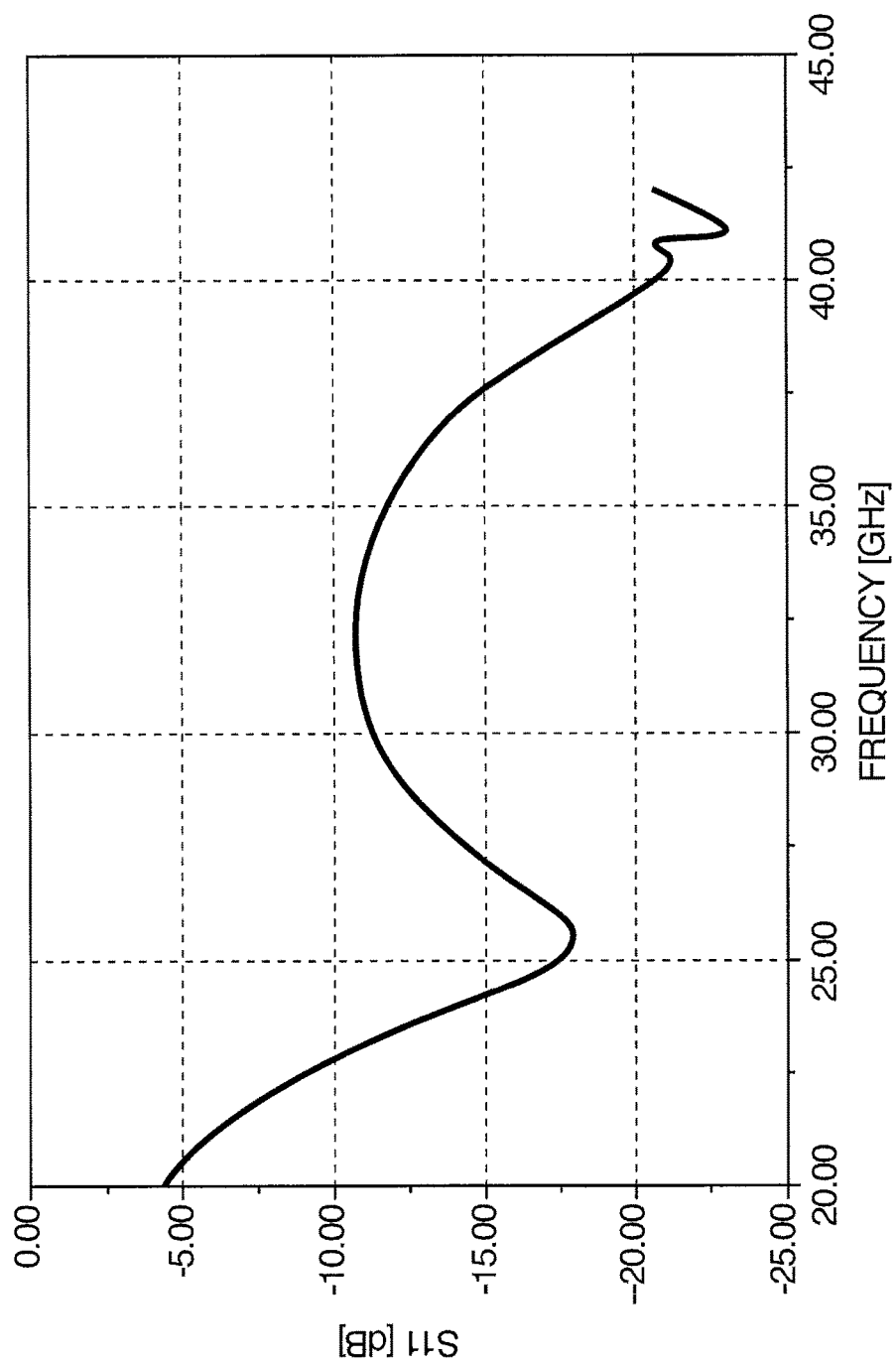

A strip-fed structure such as antenna 600 can also be used to feed a pure SU-8 structure with relative permittivity less than 4. Referring now to FIGS. 6D and 6E, there are shown plots of the reflection coefficients for strip-fed PRAs. FIG. 6D illustrates the reflection coefficient for a PRA with a relative permittivity of 3.5. FIG. 6E illustrates the reflection coefficient for a PRA with a relative permittivity of 3.2.

Accordingly, it can be observed that, even for the antenna with relative permittivity of 3.2, the resonant frequency of the dominant mode is 25.5 GHz and the −10 dB ultra-wide bandwidth of the antenna is maintained.

Although a vertical strip feed mechanism can be desirable to provide the ultra-wide bandwidth performance described above, it can be difficult to effectively excite such low relative permittivity polymer-based DRAs in practice. Even a relatively small gap between the metal strip and the photoresist polymer can have a severe negative impact on performance of the PRA. Moreover, an external vertical strip can be difficult to fabricate. For example, permanently attaching a vertical metal strip to a photoresist polymer material can be challenging due to the poor adhesive properties of the materials.

Accordingly, to alleviate this problem there is described herein a tall vertical metal structure embedded within the polymer resonator of a PRA. Such an embedded tall vertical metal structure can be fabricated to obviate the need for attaching the strip to an outer surface of the polymer resonator. Advantageously, the reflection coefficient for a PRA fabricated in this manner exhibits favorable performance as compared to a PRA with a strip attached to an outer sidewall.

Through the incorporation of tall vertical embedded metal feed structures, PRAs can be designed with approximately 50% reduced size as compared to conventional DRAs. In addition, PRAs with embedded tall metal feed structures may enable modes offering additional control over bandwidth and frequency response.

Referring now to FIGS. 7A to 7C, there are shown three different views of an example PRA 700 with an embedded vertical metal strip. FIG. 7A shows an isometric view of PRA 700, comprising a resonator body 705 with an embedded aperture 710. Resonator body 705 sits atop a substrate 790 and a feedline 780.

FIG. 7B shows an isometric cutaway view of PRA 700, revealing the tall vertical metal structure 720 embedded within aperture 710. Finally, FIG. 7C shows a plan view of PRA 700.

The tall metal vertical structure 720 may be, for example, between 100-200 microns thick and a few millimeters wide and high can be fabricated in an aperture defined within the polymer resonator. In addition, the tall metal vertical structure may be positioned between 100-200 microns from the sidewall. Precise positioning of the tall metal vertical structure may be determined via simulation and testing, and in particular by analyzing electromagnetic field patterns inside the polymer structure.

The height of the embedded tall metal feed structure can be determined as a fraction of the PRA resonator body height, and based on the relative permittivity of the body material. Typically, the metal feed structure has a height between 10-100% of the PRA resonator body height and is typically shorter for higher relative permittivity PRAs. Feed elements with various lateral topologies (e.g., rectangular, square, circular, or complicated arbitrary lateral shapes) can be used and various placement positions within the PRA can be used to achieve desired antenna and coupling performance.

The height of the embedded tall metal feed structure can also be selected to control the resonance frequencies of higher order resonant modes in the PRA. These modes can be carefully controlled through sizing and shaping of the embedded vertical metal feed structures, to achieve ultra-wideband antenna performance. In particular, the resonance frequencies of these modes can be tuned by varying the height of the embedded vertical metal feed structures (e.g., between 10-100% of the PRA resonator body height).

Figure 7D:
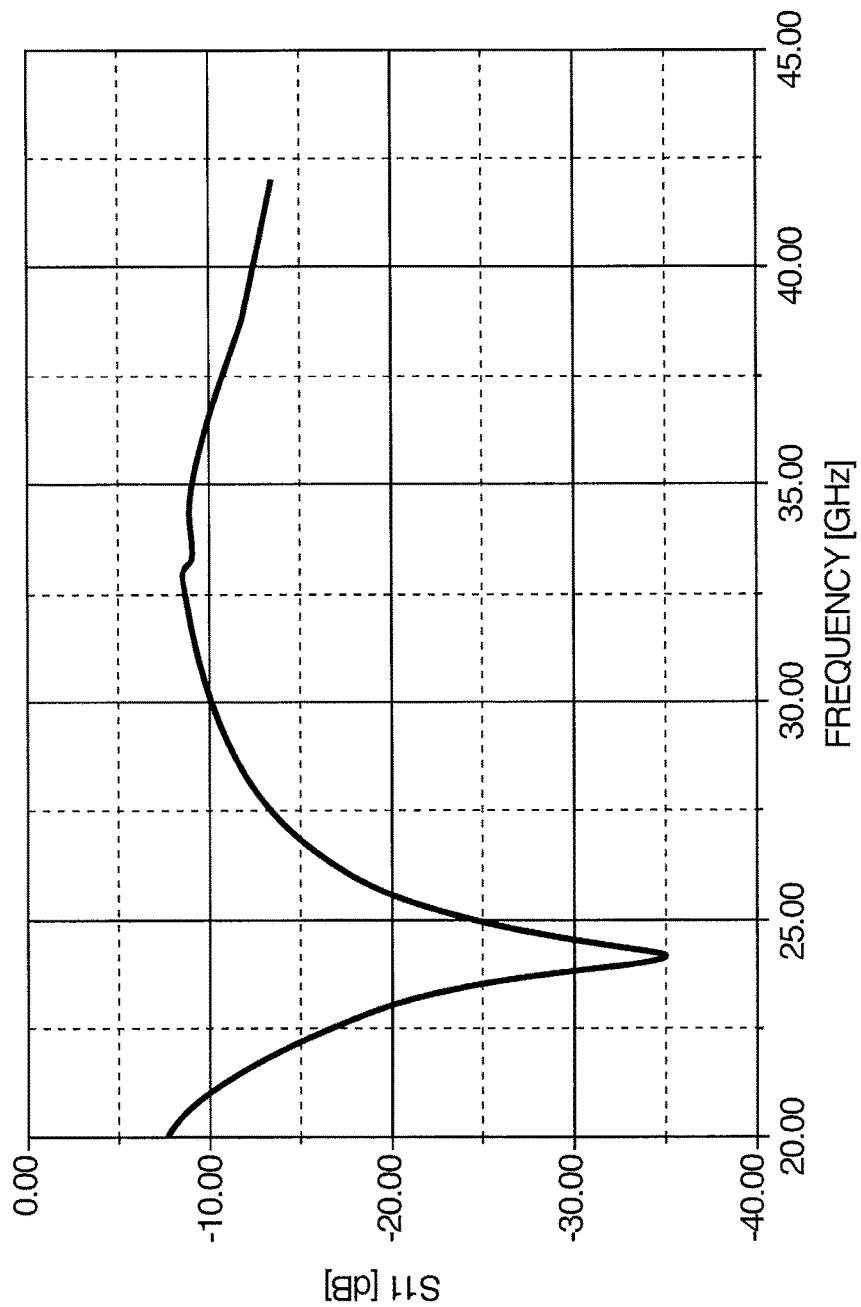
FIG. 7D illustrates a plot of the reflection coefficient for the PRA of FIGS. 7A to 7C.

Referring now to FIG. 7D, there is shown a plot of reflection coefficient for PRA 700, where the polymer resonator body 705 has a relative permittivity of 3.2. The reflection coefficient can be compared against the externally strip fed PRA of FIG. 6E.

Embedded feed PRAs such as PRA 700, including the feeding structures, can be fabricated using lithography.

In common applications of electroplating with photoresist templates, the template or frame is removed following the formation of the metal body. However, in at least some of the embodiments described herein, the polymer or polymer-based template (e.g., photoresist) can be retained following electroplating to act as functional dielectric material encompassing the metal feeding structure.

Accordingly, in some embodiments, the polymer materials may be used as an electroplating template, and additionally form the actual structure of the PRA (e.g., resonator body). However, in variant embodiments, at least some of the electroplating template can be removed.

For example, to fabricate PRA 700, a feedline can be prepared on a microwave substrate using UV lithography. A polymer-based photoresist can be cast or formed (multiple times, if necessary) and baked at temperatures below 250° C. (e.g., 95° C.). In some alternative embodiments, photoresist may be formed by, for example, bonding or gluing a a plurality of pre-cast polymer-based material sheets. Next a narrow gap or aperture near the edge of the antenna can be patterned using an X-ray or ultra deep UV exposure and developed, typically at room temperature. Finally, the resultant gap can subsequently be filled with metal (via electroplating or otherwise), up to a desired height, to produce the embedded vertical strip.

Notably, these fabrication processes can be carried out at relatively low temperatures and without sintering, which would limit the range of polymer materials available for use, as well as feature sizes.

When using metal electroplating, the microstrip line 780 can be used as a plating base to initiate the electroplating process. Electroplating of microstructures has been demonstrated in the LIGA process for complicated structures with heights of several millimeters.

For a 2 mm tall structure, the aspect ratio of vertical to minimum lateral dimensions is in the range of 10-20 and thus well within the capability of known fabrication techniques.

Increased surface roughness can correspond to increased metallic loss. However, using an X-ray lithography process, the metal strip sidewalls can be fabricated to be very smooth, with a roughness on the order of tens of nanometers. This may allow for an increase in the efficiency of antenna at millimeter-wave frequencies, which may be particularly attractive for high frequency array applications, where a major portion of losses can be attributed to the feed network.

The ability to fabricate complex shapes in PRAs allows for the resonator body and other elements to be shaped according to need. For example, the lateral shapes of the PRA elements can be square, rectangular, circular, or have arbitrary lateral geometries, including fractal shapes. Accordingly, the resonator body may have three dimensional structures corresponding to a cube (for a square lateral geometry), a cylinder (for a circular lateral geometry), etc.

As noted above, PRA elements can be fabricated in thick polymer or polymer-composite layers, up to several millimeters in thickness, using deep penetrating lithographic techniques, such as thick resist UV lithography or deep X-ray lithography (XRL). In some alternate embodiments, other 3D printing or micromachining processes may be used.

Various fabrication methods may also be employed, including direct fabrication, or by injecting dielectric materials into lithographically fabricated frames or templates formed of photoresist materials. The use of such frames enables the use of complicated shapes with a wide range of dielectric materials that might otherwise be very difficult to produce using other fabrication techniques.

Figure 8A:
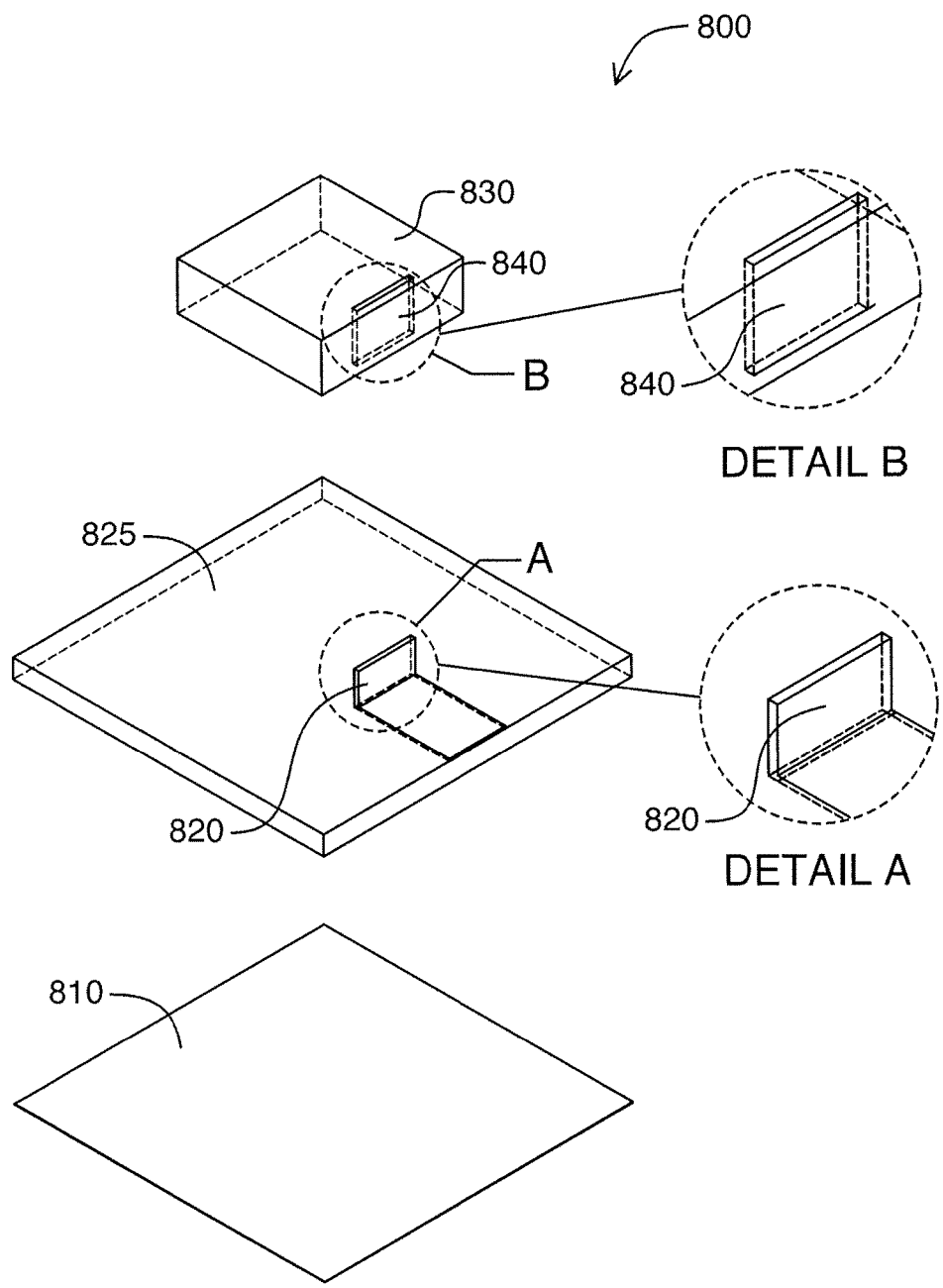
FIG. 8A illustrates an exploded isometric view of another example PRA with embedded tall metal vertical feeding structure.

Referring now to FIG. 8A, there is shown an exploded isometric view of an example PRA with embedded tall metal vertical feeding structure. PRA 800 comprises a ground layer 810, substrate 825, feedline 815, tall metal vertical feeding structure 820 and a resonator body 830.

Substrate 825 may be a microwave or millimeter-wave substrate material, and ground layer 810 may be attached to this substrate material Depending on the fabrication process used, substrate 825 may be, for example, a layer of alumina, glass, or silicon that may be doped in accordance with the process requirements.

Resonator body 830 can be formed of a polymer or polymer-based material as described herein, and has an aperture or cavity 840 defined therein. In some embodiments, resonator body 830 may have a square or rectangular topology. In other embodiments, different shapes can be used, such as circular, fractal, or other complex shapes.

Aperture 840 can be formed to be closely engaged with feeding structure 820, using for example, X-ray or deep UV lithography as described herein. In some embodiments, feeding structure 820 can be fabricated using aperture 840 as a mold (e.g., using electroplating or the like) in order to ensure close engagement of the metal to the aperture walls.

Feeding structure 820 and aperture 840 can have a generally flattened rectangular shape and be positioned generally proximally to an outer wall of resonator body 830, so that the elongated edge is substantially parallel to the outer wall. In one embodiment, feeding structure 820 and aperture 840 can be positioned with the elongated edge between 100-300 microns distant from an outer wall of resonator body 830.

In some other embodiments, feeding structure 820 and aperture 840 may have different lateral shape topologies such as, for example, circular, fractal, or other complex shapes, Feeding structure 820 is formed of a conductive material (e.g., metal) and extends substantially perpendicularly from the surface of substrate 825 into aperture 840. Preferably, feeding structure 820 has a height corresponding to between 10-100% of the thickness of resonator body 830. That is, feeding structure 820 can be 10-100% the height of aperture 840.

Feeding structure 820 is electrically coupled to feedline 815, and may have a width generally corresponding to the width of feedline 815, in the case of a rectangular shape. The width of feedline 815 can be based on the thickness and relative permittivity of the substrate and can by typically designed for a typical system impedance (ie: 50 ohms).

In a first particular embodiment, resonator body 830 has a square lateral topology (top view dimensions of 6 mm×6 mm) and a height of 2 mm. In this embodiment, feeding structure 820 has a rectangular lateral topology with an elongated edge 2.4 mm wide, a shortened edge of 200 microns and a feeding structure height of 1.4 mm (i.e., 70% of the resonator body thickness). Feeding structure 820 is positioned 300 microns from the edge of resonator body 830.

In this embodiment, resonator body 830 is formed of a polymer-based material with a relative permittivity of 5. A plot of the reflection coefficient for this particular embodiment is illustrated in FIG. 8B.

Figure 8B:
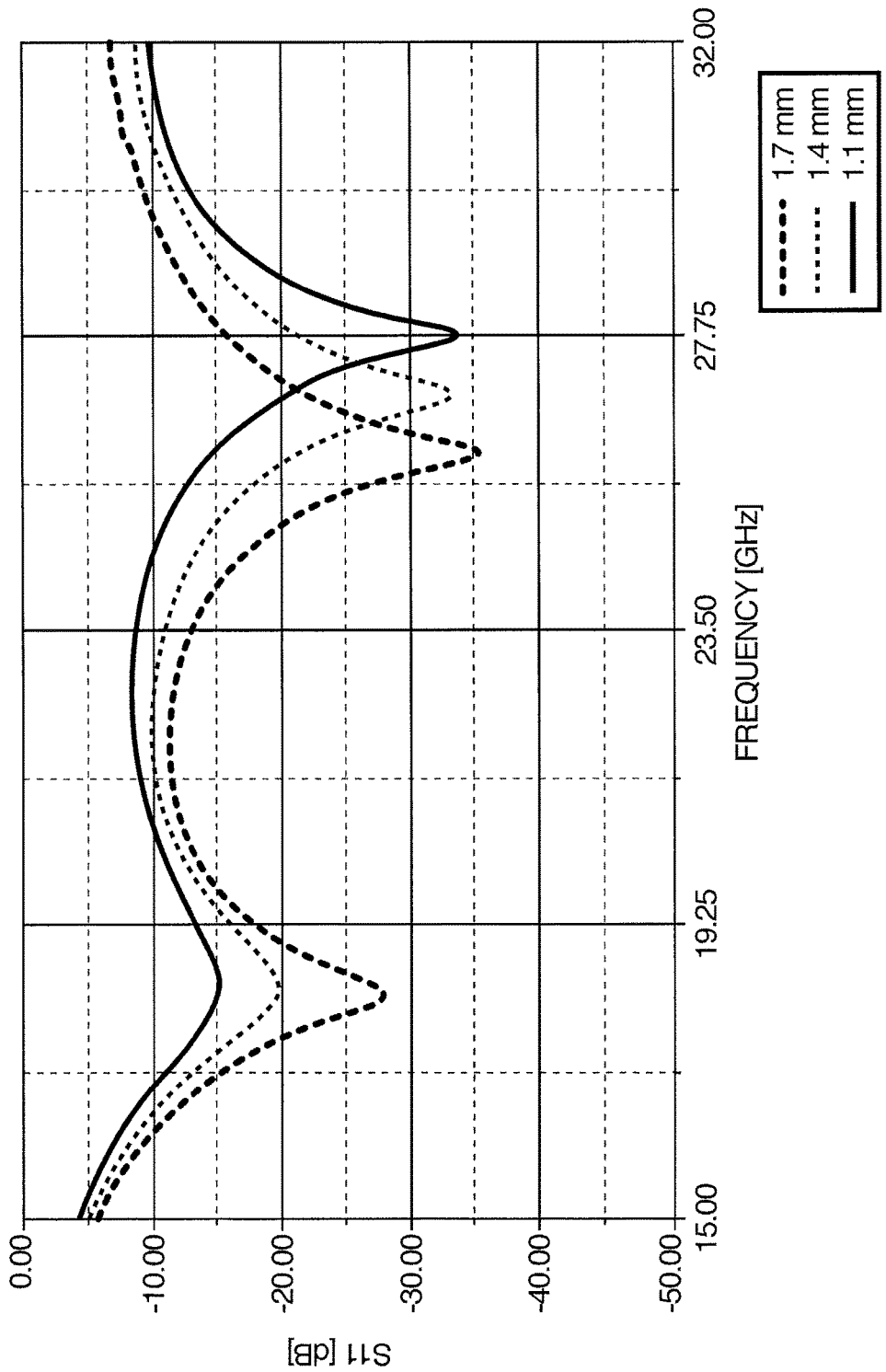
FIG. 8B illustrates a plot of the reflection coefficient for the PRA of FIG. 8A.

Referring now to FIG. 8B, there is illustrated a plot of the reflection coefficient for the above-noted first particular embodiment when the feeding structure height is fabricated to be 1.1 mm, 1.4 mm and 1.7 mm, respectively. It can be observed that PRA 800 can be effectively excited and is capable of wideband performance in the range of 16.5 GHz to 29.5 GHz.

The effect of altering feeding structure height can also be observed. In particular, the frequency distance between two resonance modes can change with different feeding structure heights, resulting in a different impedance bandwidth and dual- or wide-band operation.

Figure 9A:
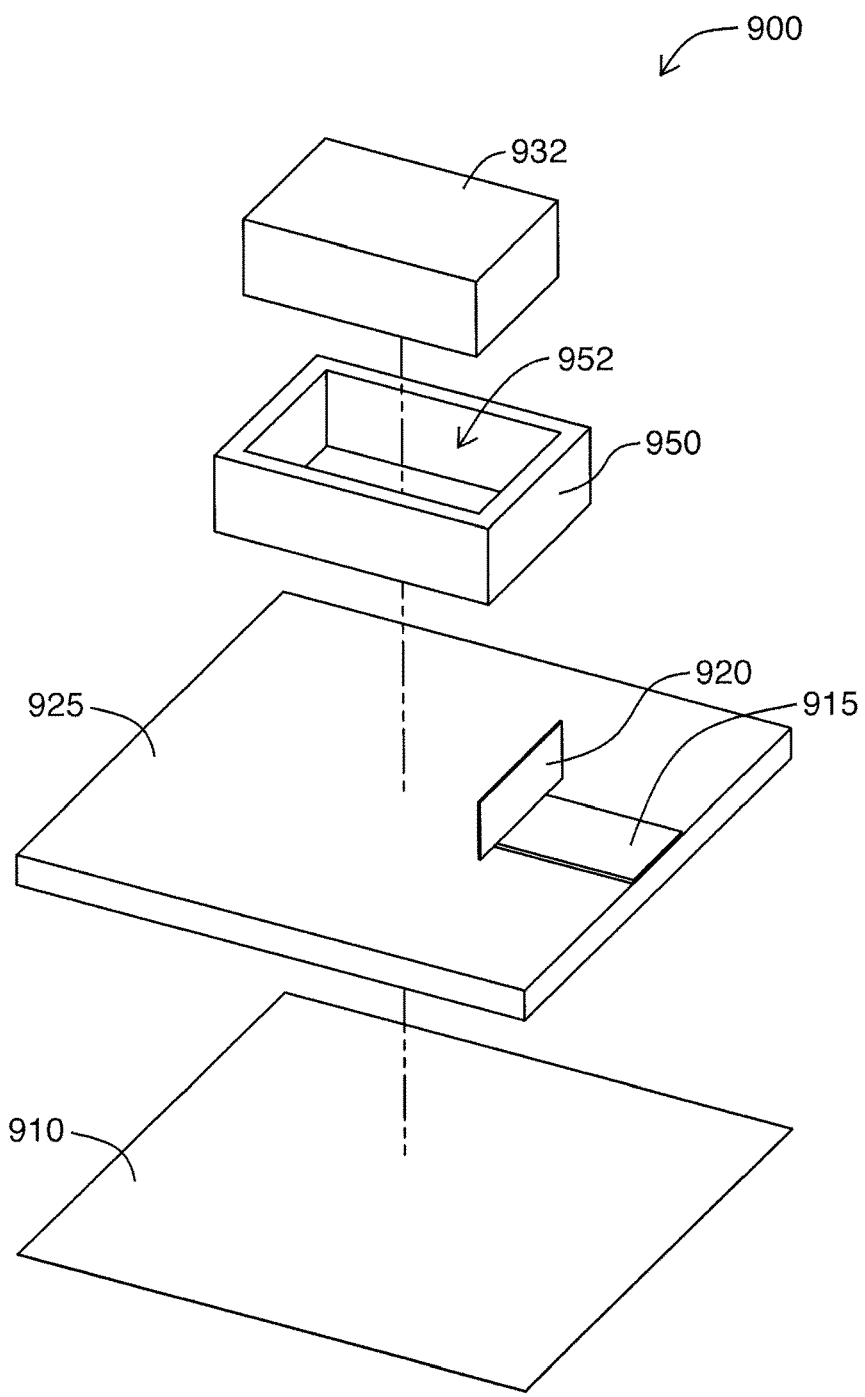
FIG. 9A illustrates an exploded isometric view of another example PRA with embedded tall metal vertical feeding structure.

Referring now to FIG. 9A, there is shown an exploded isometric view of another example PRA with embedded tall metal vertical feeding structure. Some elements of PRA 900 may be generally analogous to those of PRA 800. For example, ground layer 910, substrate 925 and feedline 915 may be generally analogous to ground layer 810, substrate 825 and feedline 815, respectively, and the reader is directed to the foregoing description in respect of FIG. 8A for further details.

Frame 950 may be a first body portion, and can be formed of a photoresist material and may define an aperture or cavity 952 therein. Aperture 952 can be filled with a resonator body 932, or second body portion, which may be comprised of a polymer or polymer-based dielectric material. Preferably, resonator body 932 has a higher relative permittivity than frame 950. In some alternative embodiments, resonator body 932 may be comprised of other dielectric materials. In contrast to PRA 800, aperture 952 may be substantially larger than aperture 840.

In some embodiments, frame 950 may be removed in a later stage of fabrication.

Resonator body 932 may have a square or rectangular topology. In other embodiments, different shapes can be used, such as circular, fractal, or other complex shapes. Due to the use of the frame 950 and the filling technique used to form resonator body 932, composite non-photoresist polymers may also be used to form resonator body 932, in addition, or in alternative, to pure photoresist polymers and composite photoresist polymers.

In some embodiments, a narrow gap corresponding to the shape of feeding structure 920 can be formed between resonator body 932 and one interior wall of frame 950. Accordingly, feeding structure 920 can be tightly and fittingly engaged in this narrow gap, between resonator body 932 and a wall of frame 950. Accordingly, feeding structure 920 can be tightly and fittingly engaged in this narrow gap, inside the wall of frame 950.

Figure 9B:
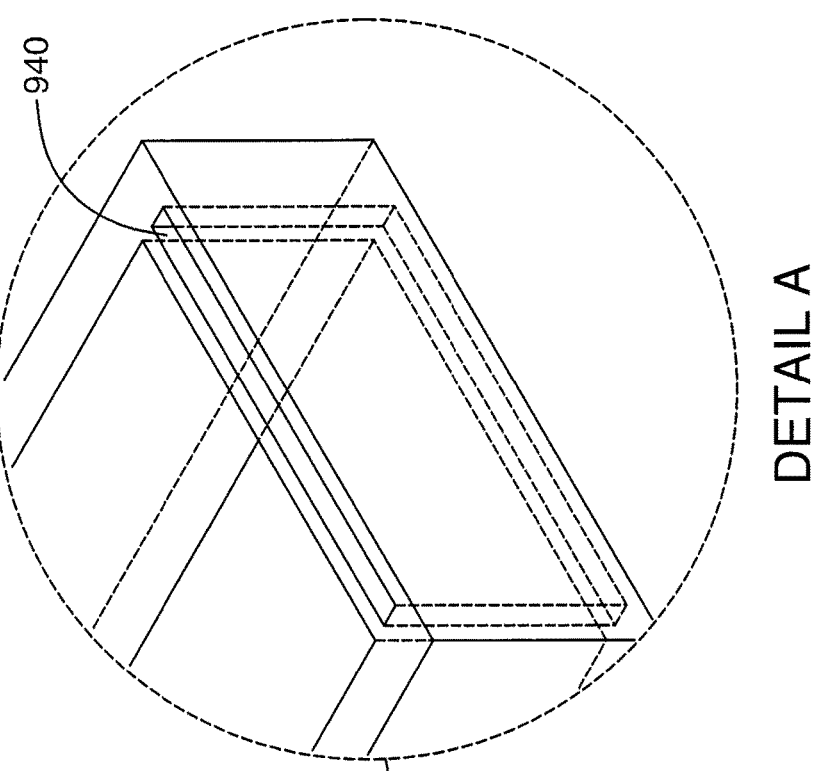
FIG. 9B illustrates an isometric view of an alternative frame for the PRA of FIG. 9A.
Figure 9B:
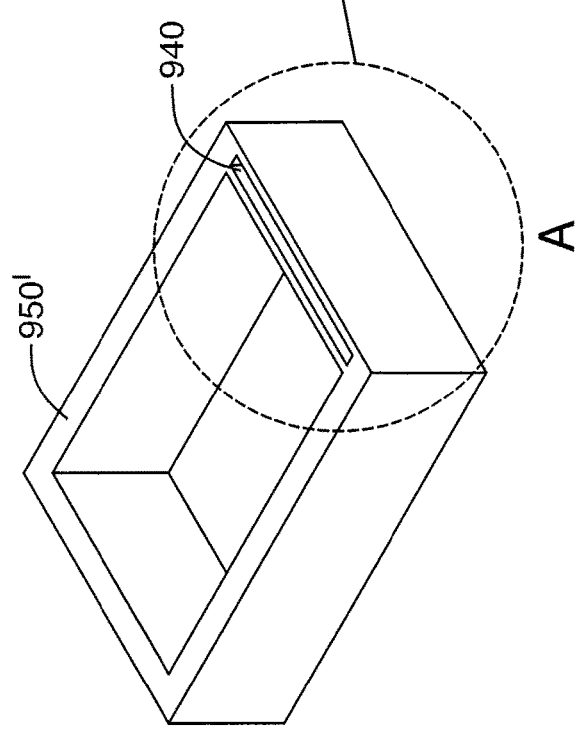

Referring now to FIG. 9B, there is shown an isometric view of an alternative frame 950'. In frame 950', an aperture 940, or second cavity, corresponding to the shape of feeding structure 920 can be formed inside one interior wall of frame 950'. Aperture 940 can be formed in similar fashion to aperture 840. Likewise, feeding structure 920 can be fabricated via electroplating.

Aperture 952 or 940 can be formed using, for example, X-ray or deep UV lithography as described herein. Aperture 940 is shown with a rectangular topology, however other lateral shapes (e.g., trapezoidal, elliptical, etc.) may also be used. In some cases, aperture 940 may be comprised of multiple apertures.

Feeding structure 920 can have a substantially flattened rectangular shape and be positioned near to the outer wall of resonator body 932, and either outside or inside the inner wall of frame 950, so that the elongated edge of feeding structure 920 is substantially parallel to the outer wall. In some alternative embodiments, feeding structure 920 can have other lateral shapes and positioning, as described herein.

Frame 950' need not necessarily have a "thin" or "narrow" wall structure as depicted in FIG. 9B, and in some embodiments the walls of frame 950' may be relatively thick, extending in one or more directions for a large distance. In some cases, frame 950' may comprise larger sheets of photoresist material (e.g., "hole templates"), in which the "hole templates" can be filled with polymer-composite materials (and, where the low permittivity photoresist template sheet may remain following fabrication).

Feeding structure 920 is formed of a conductive material (e.g., metal) and extends substantially perpendicularly from the surface of substrate 925. Preferably, feeding structure 920 has a height corresponding to between 10-100% of the thickness of resonator body 932 and frame 950. That is, feeding structure 920 can be 10-100% the height of frame 950.

Feeding structure 920 is electrically coupled to feedline 915, and may have a width generally corresponding to the width of feedline 915.

In a second particular embodiment, resonator body 932 has a rectangular lateral topology (top view dimensions of 4 mm×6 mm) and a height of 2 mm, and frame 950 has walls with a thickness of 500 microns. In this embodiment, resonator body 932 is formed of a polymer-based material with a relative permittivity of 4, and frame 950 is formed of a photoresist polymer material with a relative permittivity of 2.3. A plot of the reflection coefficient for this particular embodiment is illustrated in FIG. 9B.

In this embodiment, feeding structure 920 has a lateral strip topology with an elongated edge 4 mm wide, a shortened edge of 50 microns and a feeding structure height of 1.5 mm (i.e., 75% of the resonator body thickness).

Figure 9C:
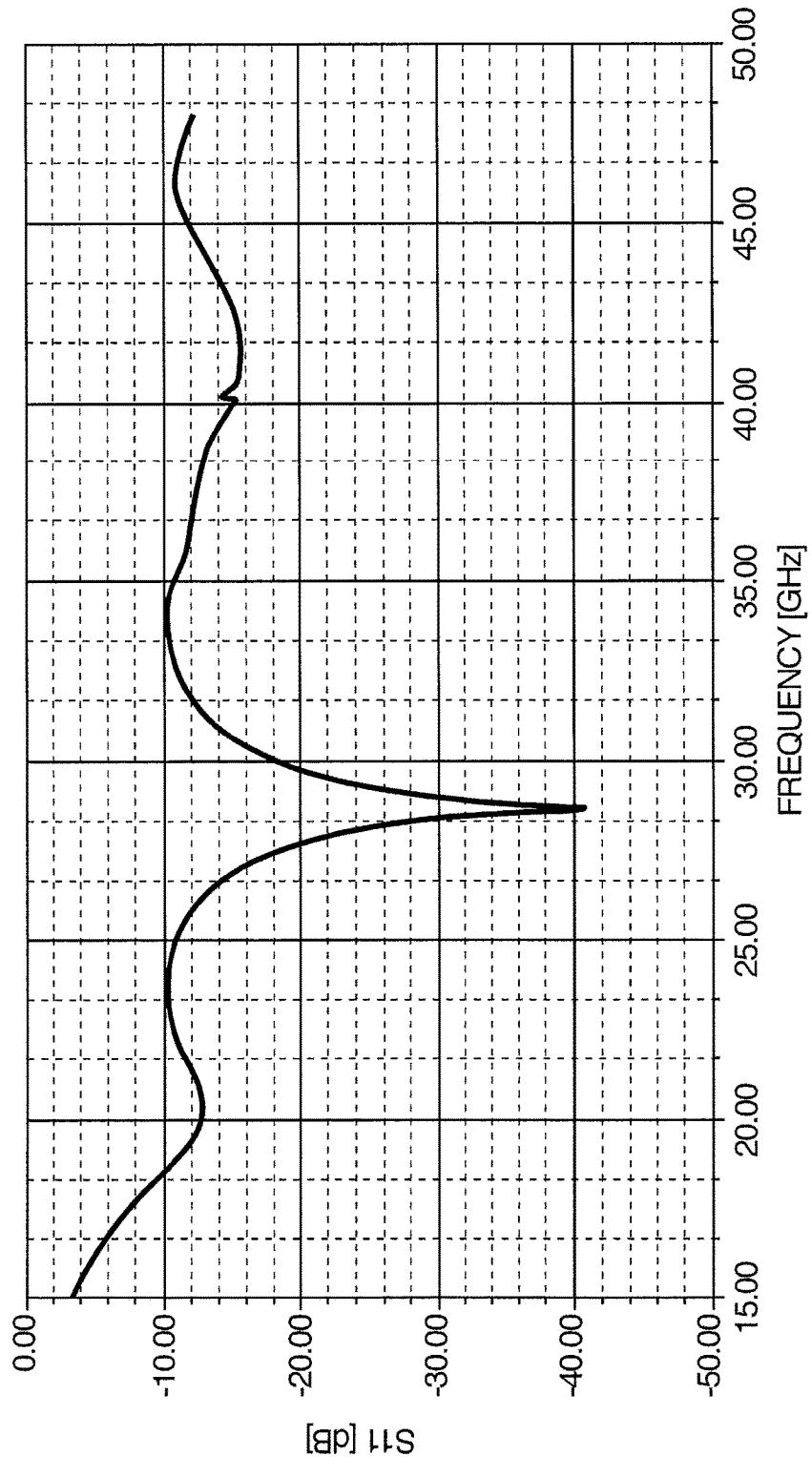
FIG. 9C illustrates a plot of the reflection coefficient for the PRA of FIG. 9A.

Referring now to FIG. 9C, there is illustrated a plot of the reflection coefficient for the above-noted second particular embodiment. It can be observed that PRA 900 can be effectively excited and is also capable of wideband performance.

Figure 10A:
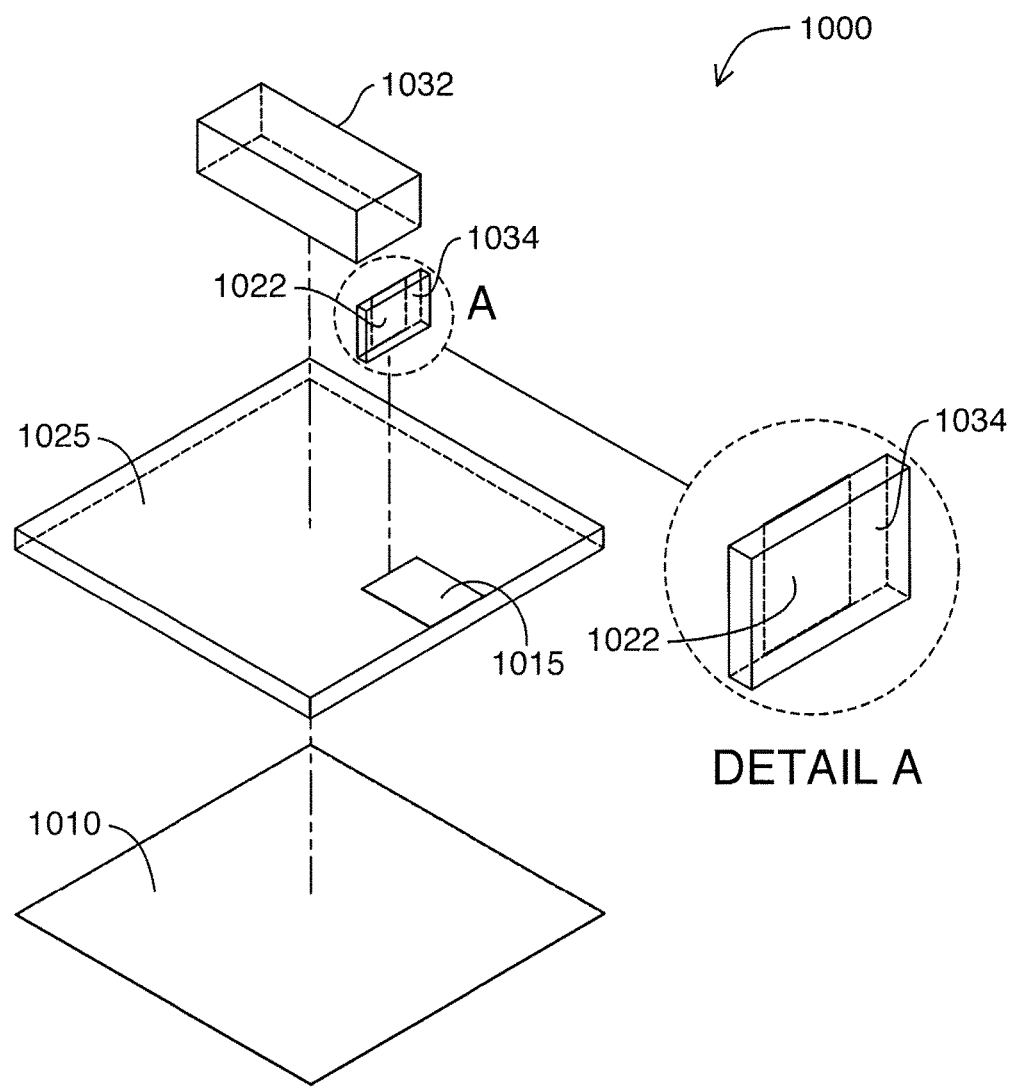
FIG. 10A illustrates an exploded isometric view of another example PRA with embedded tall metal vertical feeding structure.

Referring now to FIG. 10A, there is shown an exploded isometric view of another example PRA with tall metal vertical feeding structure. Some elements of PRA 1000 may be generally analogous to those of PRA 800. For example, ground layer 1010, substrate 1025 and feedline 1015 may be generally analogous to ground layer 810, substrate 825 and feedline 815, respectively, and the reader is directed to the foregoing description in respect of FIG. 8A for further details.

First resonator body 1032 can be formed of a polymer or polymer-based material as described herein. In some embodiments, resonator body 1032 may have a square or rectangular topology. In other embodiments, different shapes can be used, such as circular, fractal, or other complex shapes.

Similarly, second resonator body 1034 can also be formed of a polymer or polymer-based material as described herein. In some embodiments, the polymer material may be the same as that used for first resonator body 1032. In other embodiments, different polymer or polymer-based materials may be used.

In some embodiments, second resonator body 1032 can be a polymer or polymer-based substrate having a metal layer on one side, and on which side the feeding structure 1022 is fabricated by machining or lithography of the metal layer.

Feeding structure 1022 is formed of a conductive material (e.g., metal) and extends substantially perpendicularly from the surface of substrate 1025 and between first and second resonator bodies 1032 and 1034. Preferably, feeding structure 1022 has a height corresponding to between 10-100% of the thickness of one or both resonator bodies. That is, feeding structure 1022 can be 10-100% the height of first resonator body 1032 or second resonator body 1034.

Feeding structure 1022 is electrically coupled to feedline 1015, and may have a width generally corresponding to the width of feedline 1015.

In a third particular embodiment, first resonator body 1032 has a rectangular lateral topology (top view dimensions of 2.8 mm×7 mm) and a height of 2 mm, and second resonator body 1034 has a rectangular lateral topology (top view dimensions of 2.8 mm×0.4 mm) and a height of 2 mm. In this embodiment, both first resonator body 1032 and second resonator body 1034 are formed of a polymer-based material with a relative permittivity of 10. Feeding structure 1022 has a height of 2 mm (i.e., 100% of the resonator body thickness), and is 20 microns thick and 1.5 mm wide. Accordingly, in this configuration, first and second resonator bodies 1032 and 1034 can be considered to form a PRA with embedding feeding structure 1022. A plot of the reflection coefficient for this particular embodiment is illustrated in FIG. 10B, and radiation patterns of this particular embodiment are illustrated in FIGS. 10C and 10D.

Figure 10B:
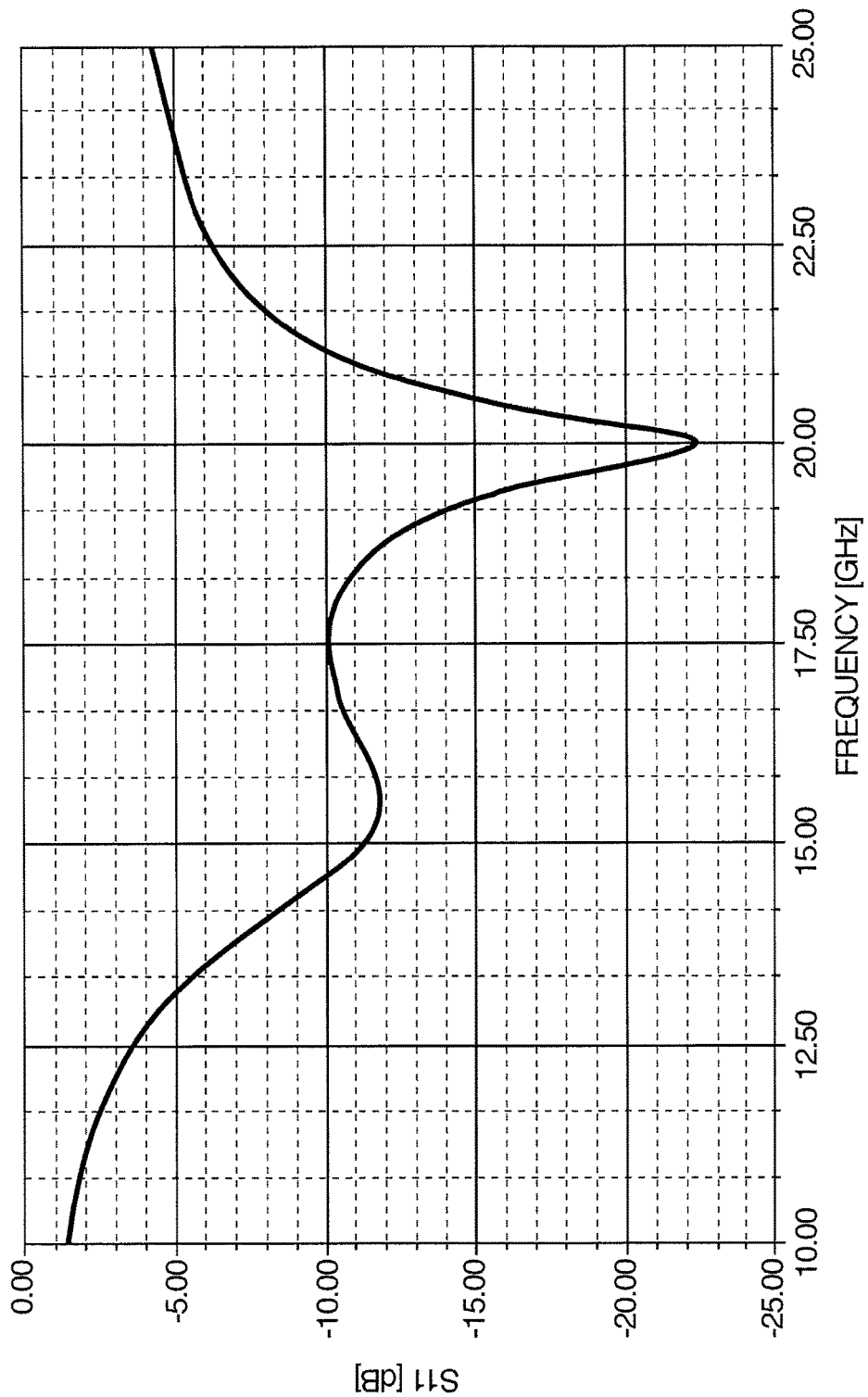
FIG. 10B illustrates a plot of the reflection coefficient for the PRA of FIG. 10A.

Referring now to FIG. 10B, there is illustrated a plot of the reflection coefficient for the above-noted third particular embodiment. It can be observed that PRA 1000 can be effectively excited and is also capable of wideband performance.

Figure 10C:
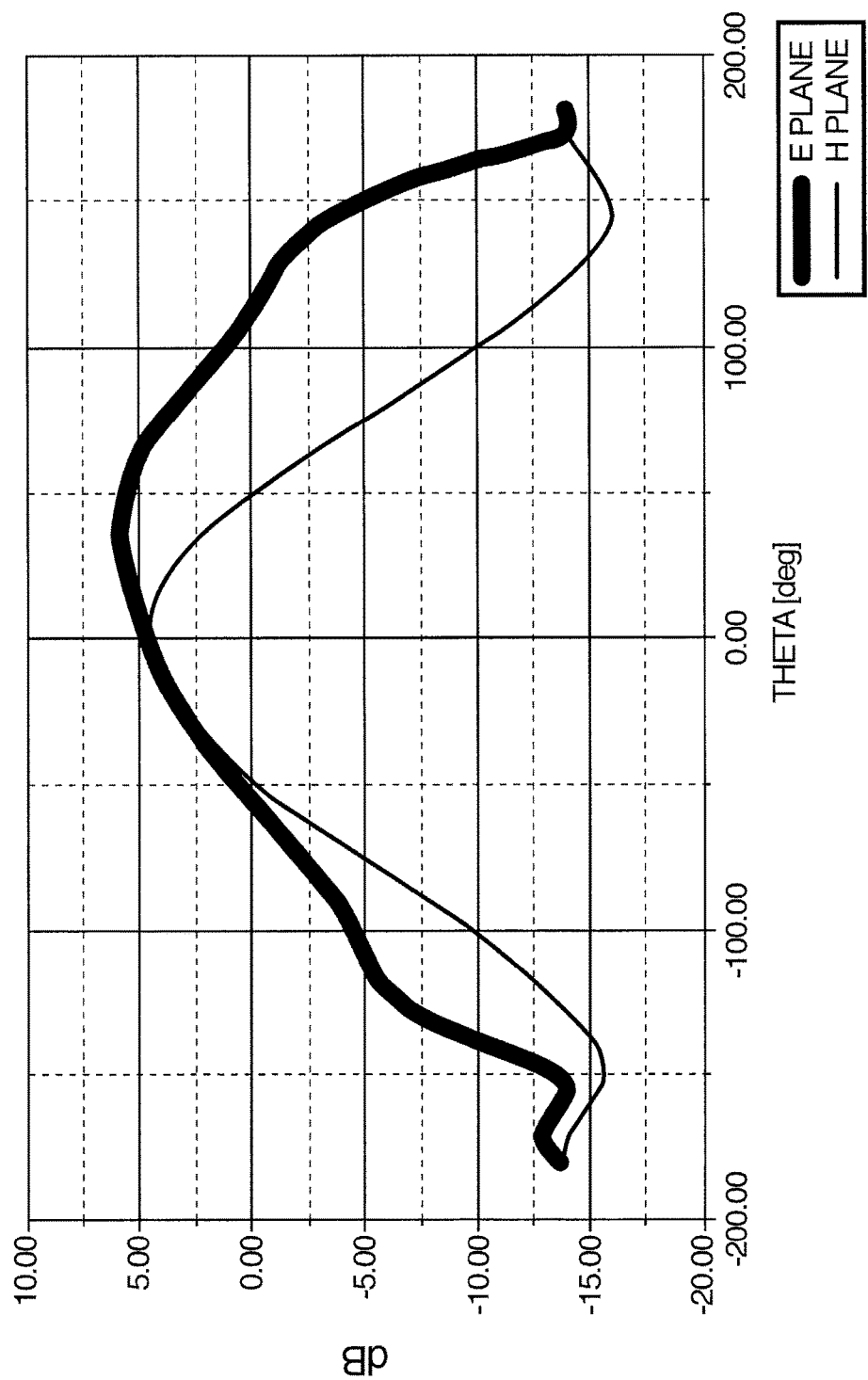
FIGS. 10C and 10D illustrate plots of the radiation pattern for the PRA of FIG. 10A.
Figure 10D:
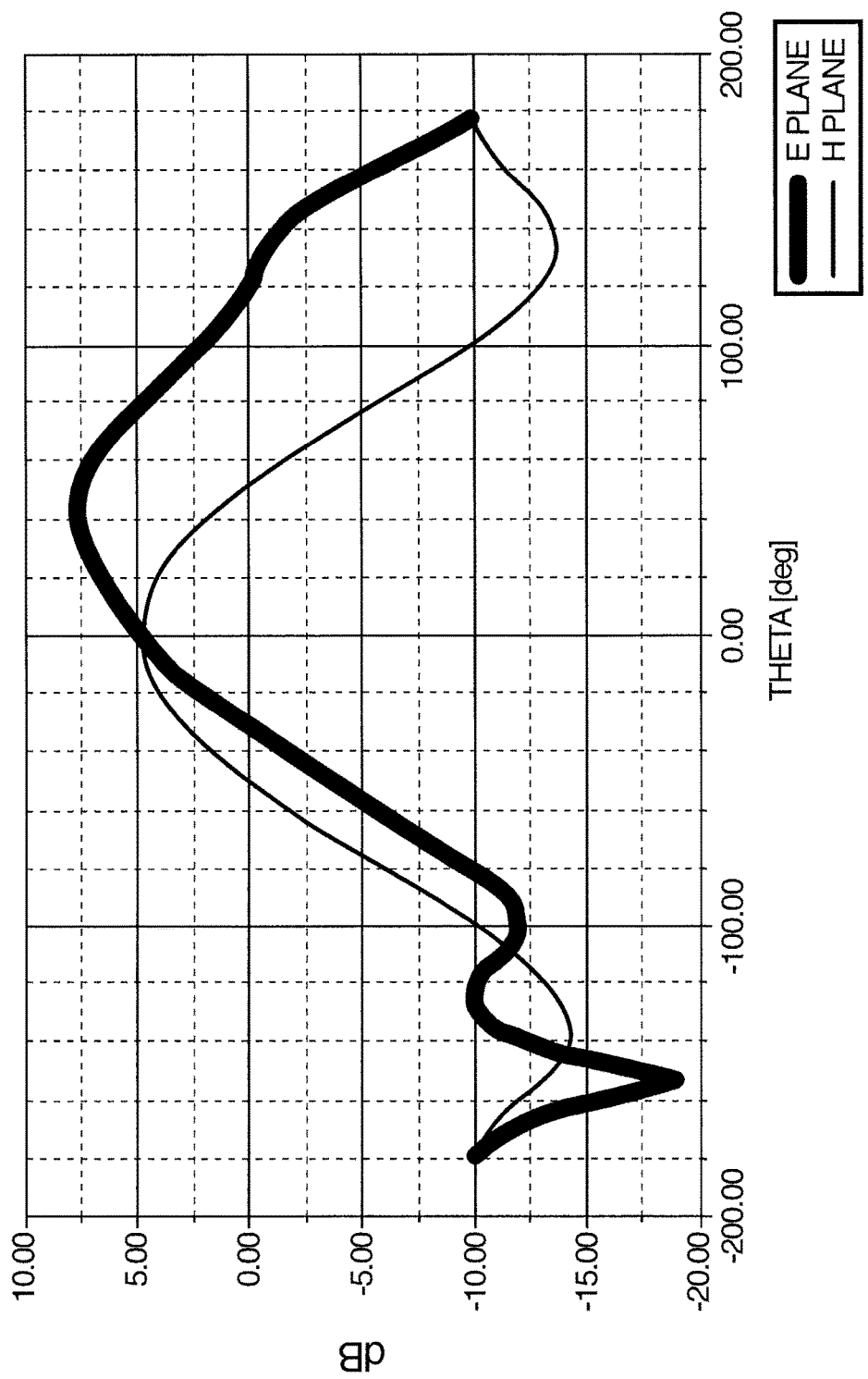

Referring now to FIGS. 10C and 10D, there are illustrated plots of the radiation pattern for the above-noted third particular embodiment. The radiation pattern of the antenna in a first resonance mode can be observed in FIG. 10C and a second resonance mode can be observed in FIG. 10D. E-plane plots are indicated with a thicker line for clarity. In particular, the maximum gain is 5.95 and 7.75 dBi for the first and second resonance modes, respectively. As shown, the second mode has approximately 2 dB larger gain than the first resonance mode.

Vertical metal structures embedded in a resonator body can also be used for other purposes besides feeding a PRA. For example, an array of H-shaped vertical metal elements can be embedded in a PRA resonator body to provide an increase in the effective relative permittivity of the body.

Figure 11A:
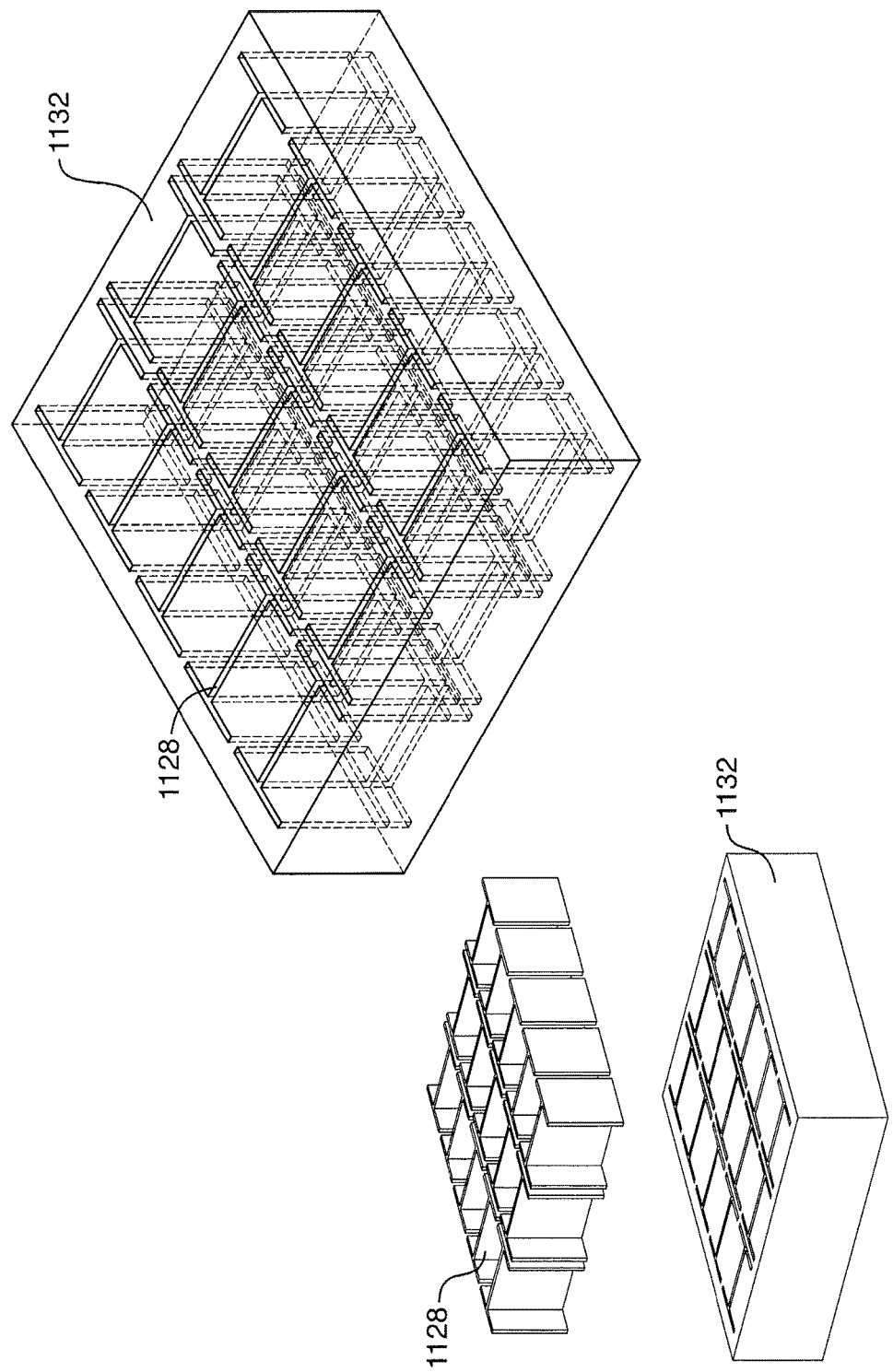
FIG. 11A illustrates an exploded isometric view of an example resonator body with an array of embedded vertical metal elements.

Referring now to FIG. 11A, there is shown an exploded isometric view of an example resonator body 1100 with an array of embedded vertical metal elements.

Resonator body 1132 may have a square or rectangular topology. In other embodiments, different shapes can be used, such as circular, fractal, or other complex shapes.

Vertical metal embedded elements 1128 may be fabricated and positioned in an array within resonator body 1132 using the techniques described herein. In some embodiments, embedded elements 1128 have an "H" (or I-beam) shape when viewed from above.

Elements 1128 can be formed of a conductive material (e.g., metal) and extend substantially perpendicularly from the surface of a substrate through resonator body 1132.

Figure 11B:
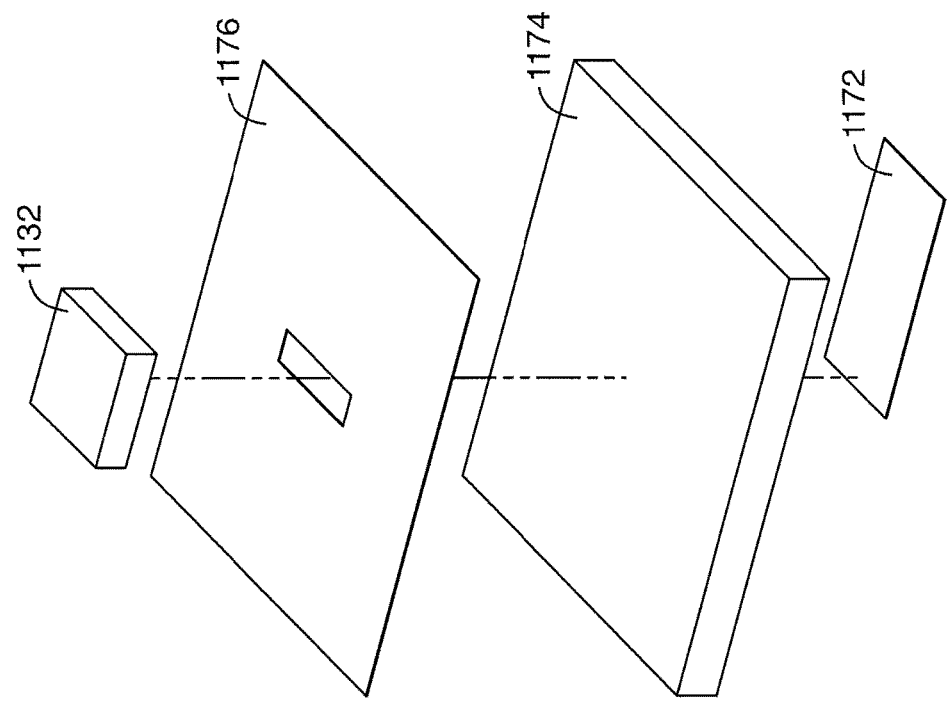
FIG. 11B illustrates a view of another example PRA with an embedded metal-enhanced resonator.
Figure 11B:
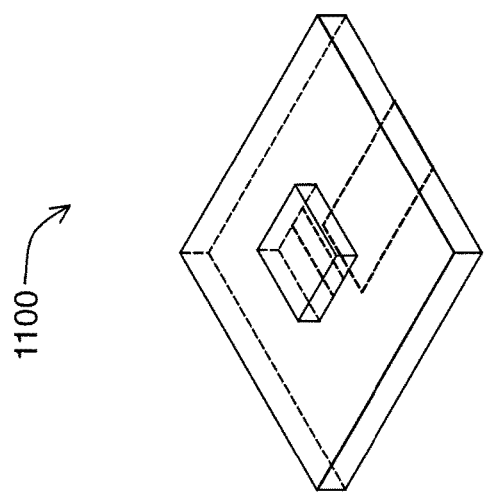

Referring now to FIG. 11B, there is illustrated a fourth particular embodiment of a PRA with an embedded metal-enhanced resonator. PRA 1100 has a resonator body 1132 with a 3×5 array of H-shaped embedded metal elements 1128 such as those depicted in FIG. 11A. Resonator body 1132 is formed of a SU-8 polymer material and has lateral dimensions of 2.2 mm×2.4 mm, with a height of 0.6 mm. H-shaped embedded metal elements 1128 have lateral dimensions of 0.6 mm×0.4 mm, and a height of 0.5 mm. The thickness of metal elements 1128 is 0.05 mm.

In contrast to PRAs 800, 900 and 1000, a common slot-feed configuration can be used, as illustrated. Resonator body 1132 is provided on a 8 mm×8 mm substrate 1174, with a microstrip feed 1172 on its opposite side. Substrate 1176 has a 0.6 mm×2.4 mm coupling slot facing resonator body 1132.

Figure 11C:
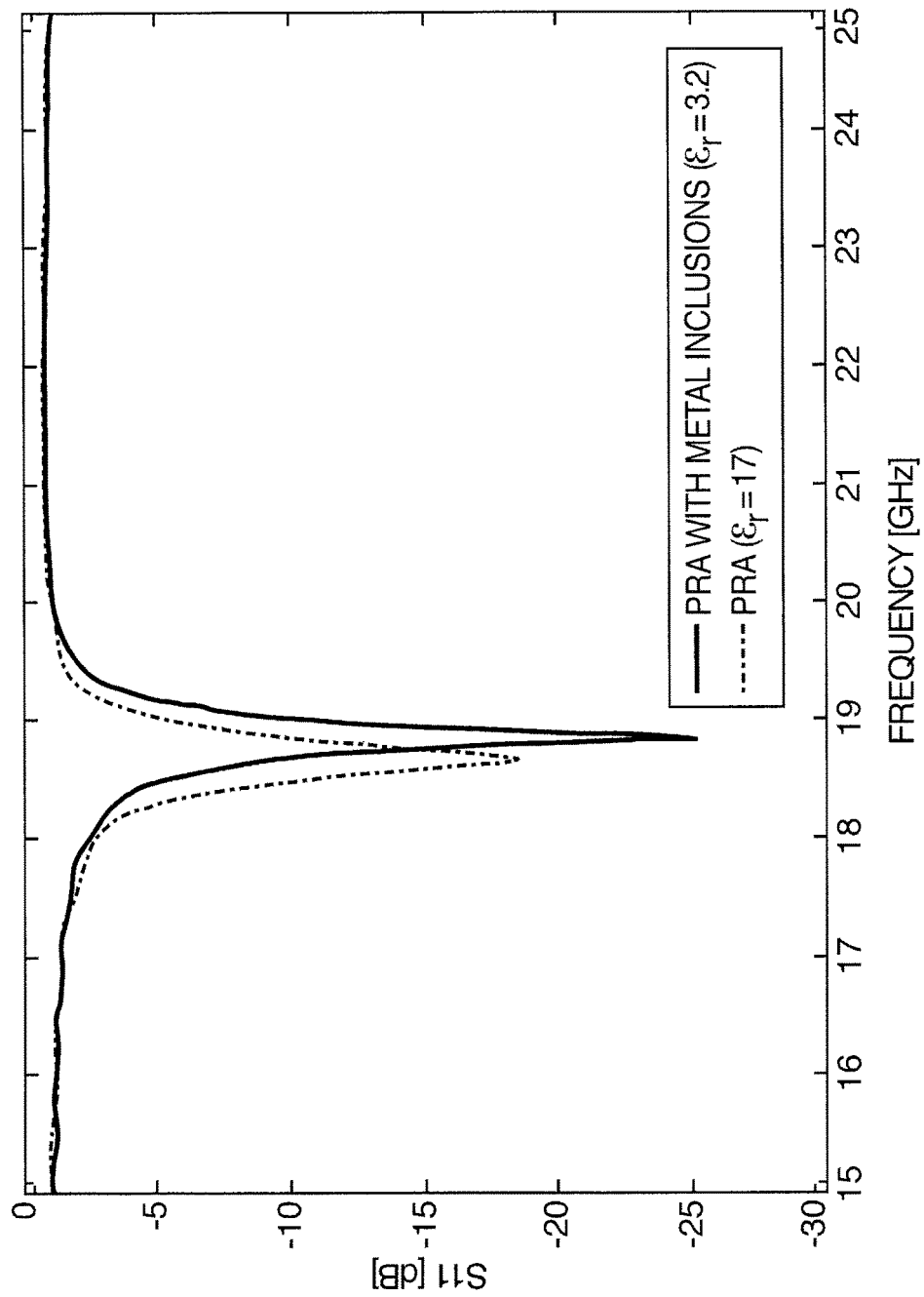
FIG. 11C illustrates a plot of the reflection coefficient of the PRA of FIG. 11B.

Referring now to FIG. 11C, there is illustrated a plot of the reflection coefficient of PRA 1100 as compared to an analogous PRA in which the resonator body 1132 has been replaced with a simple rectangular dielectric body with relative permittivity of 17, having the same dimensions, but without any metal inclusions.

It can be observed that PRA 1100 has very similar impedance characteristics to the conventional DRA. PRA 1100 also has similar radiation characteristics, such as gain and radiation efficiency. Accordingly, the embedded metal elements can act as a relative permittivity magnifier, and enable the synthesis of a high relative permittivity metamaterial without the need to incorporate ceramic powders. Accordingly, the size of the resonator body—and therefore the PRA—can be reduced while maintaining similar radiation characteristics.

Figure 11D:
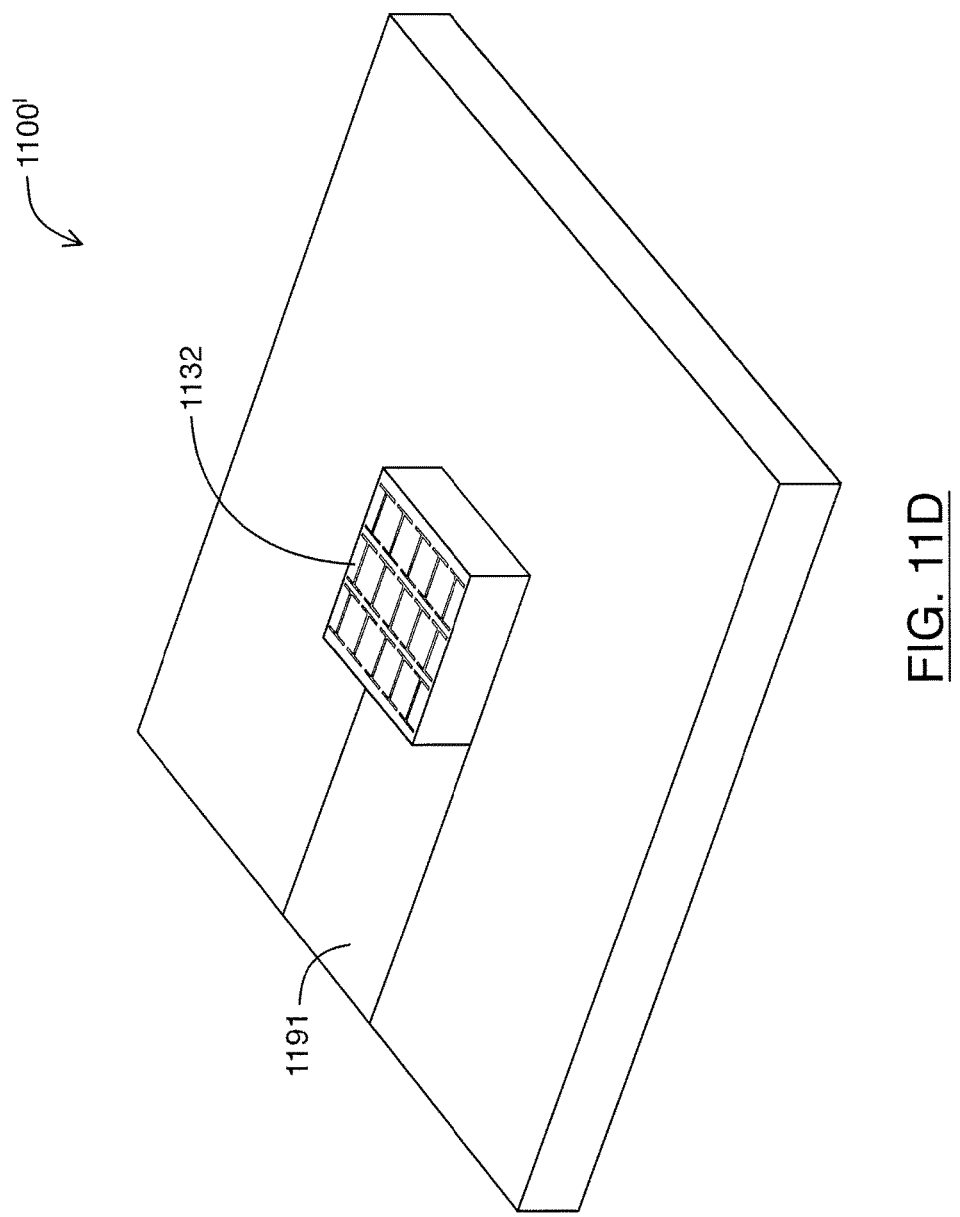
FIG. 11D illustrates an isometric view of another example PRA with a resonator body comprising an array of embedded vertical metal elements.

Referring now to FIG. 11D, there is shown an isometric view of a variant PRA 1100' with a resonator body comprising an array of embedded vertical metal elements. PRA 1100' is generally analogous to PRA 1100, except that it may be excited via a microstrip feedline 1191 rather than a slot.

As noted herein, by varying the number, size and spacing of the embedded metal inclusions in the array, the effective relative permittivity of the PRA resonator body can be controlled and altered. The controllable relative permittivity may range from that of a pure polymer or polymer-based material (e.g., about 2 or 3) up to 17 or more.

Similarly, by employing this controllability, a plurality of PRAs with different characteristics can be fabricated together in a single process, and even on a single wafer or chip. This may be particularly desirable for multiband applications or reflect arrays.

As noted herein, deep lithographic fabrication processes, such as X-ray lithography, can be used to fabricate embedded, vertical metal structures. Polymer and polymer-based materials can be used both as electroplating templates and also as the final PRA structures.

Figure 12:
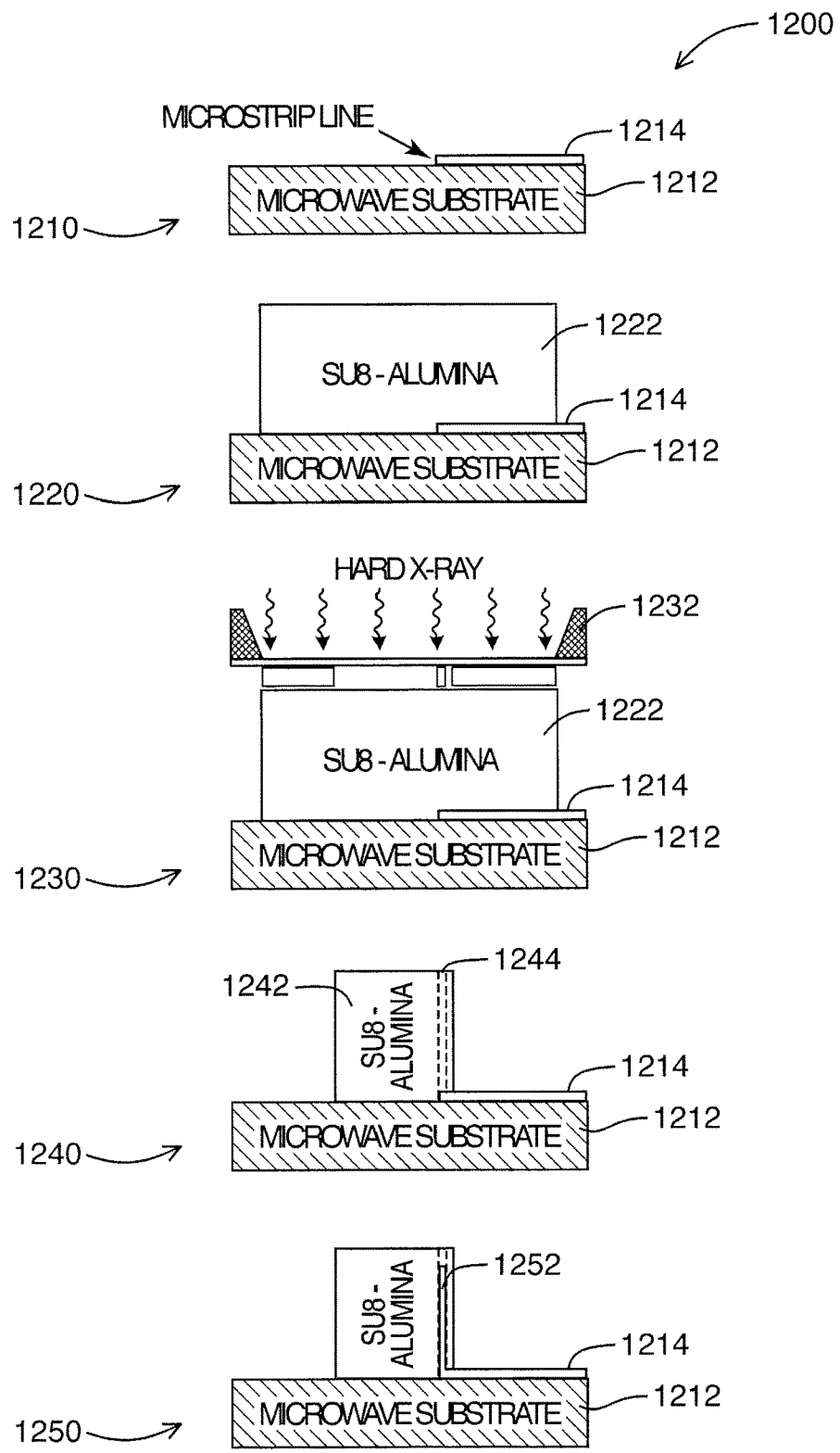
FIG. 12 illustrates an example lithographic fabrication process.

Referring now to FIG. 12, there is illustrated an example lithographic fabrication process 1200.

Process 1200 begins at 1210 with the formation of a microwave substrate layer 1212 and a microstrip line or feedline 1214. Next, a polymer layer 1222 (e.g., SU-8 alumina composite) is built up over the substrate and feedline at 1220. Polymer layer 1222 may be cast and baked at low temperatures (e.g., 95° C.) multiple times in order to build up a layer of desired thickness.

At 1230, polymer layer 1222 is exposed to a collimated X-ray source via a pattern mask 1232. In some other embodiments, other lithographic sources may be used, such as deep UV lithography.

The exposed portions of polymer layer 1222 are subsequently developed (e.g., at room temperature) and exposed portions removed at 1240, leaving only the final resonator body structure with an embedded aperture 1244.

Finally, at 1250, aperture 1244 is filled with metal up to a predetermined height to produce a vertical embedded metal feed structure 1252. This may be carried out using controlled metal electroplating, with the feedline functioning as a plating base to initiate the electroplating process.

Electroplating of microstructures has been experimentally verified for complicated structures with heights up to a few millimeters using a deep X-ray lithography process.

In addition to the ease and familiarity of fabrication, a number of performance benefits can be provided by PRAs with embedded vertical metal feed structures.

For example, the embedded vertical metal structure can effectively feed PRAs with relative permittivities less than 4, enabling the use of pure polymers and photoresists (such as PMMA and SU-8).

The embedded vertical metal feed structure provides a significant decrease in the resonant frequency of the PRA, enabling miniaturization of the resonant body by, in some examples, approximately 50%.

Embedded vertical metal structures may create higher order resonant modes in PRAs, while retaining similar radiation patterns (for instance, $TE_{131}$ and $TE_{151}$ at a higher frequency). The resonance frequencies of these modes can be carefully controlled via sizing and shaping of the embedded vertical metal feed structures, to achieve ultra-wideband antenna performance. In particular, the resonance frequencies of these modes can be tuned by varying the height of the embedded vertical metal feed structures, providing an effective way to control frequency response of a PRA.

Another useful property is that higher order resonance modes of the PRA can show higher antenna gain. This property can be exploited to increase the gain of PRA antennas without the use of array structures.

Finally, as noted above, tall embedded metal structures can be distributed inside a polymer-based resonator body to increase the effective antenna relative permittivity and significantly miniaturize antenna structure.

Feedline Shapes

A direct microstrip feedline is an attractive candidate for excitation of DRAs (and PRAs), as it can facilitate integration of the antenna with other microwave circuits and provides planar feed distribution networks for array configurations. The amount of electromagnetic energy coupled from the microstrip feedline to the DRA depends on many parameters including substrate properties and the position of the dielectric resonator with respect to the microstrip feedline. However, for low permittivity dielectric resonators (e.g., with $\varepsilon_r<12$), coupling is generally very low even when these parameters are adjusted.

Such low permittivity dielectric resonators are generally desirable for wideband applications. Conventionally, to improve coupling, a thin layer of high permittivity material with predetermined characteristics (e.g., permittivity and thickness) can be inserted between the low permittivity dielectric resonator and the microstrip feedline to increase coupling of electromagnetic energy.

Figure 13:
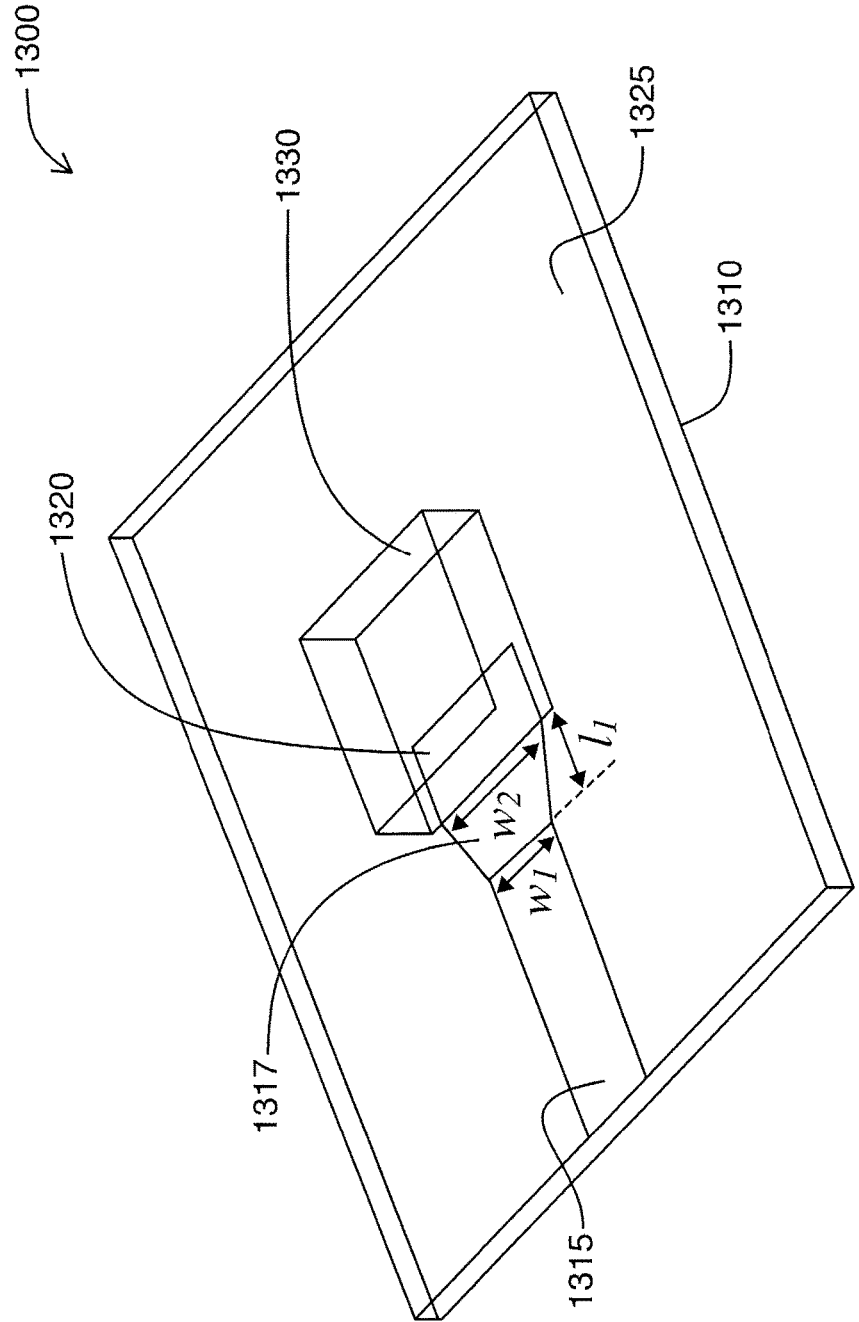
FIG. 13 illustrates an isometric view of an example dielectric resonator antenna with improved feedline.

Described herein is an improved feedline that can be used, for example, with wideband DRAs of low and very low permittivity. The improved feedline may be particularly suitable for use with cylindrical resonator bodies. Referring now to FIG. 13, there is illustrated an isometric view of an example dielectric resonator antenna with improved feedline.

DRA 1300 comprises a ground layer 1310, substrate 1325, feedline 1315, tapered feedline portion 1317, feeding structure 1320 and a resonator body 1330 (which may be cylindrical in shape, in some embodiments). DRA 1300 (including ground layer 1310, substrate 1325, feedline 1315, and resonator body 1330) may be generally analogous to other DRAs and PRAs described herein, such as, for example, PRA 800 or PRA 900, in which case DRA 1300 may further incorporate the additional elements of those embodiments (e.g., feeding structure 820 and aperture 840), although this is not shown in FIG. 13 so as not to obscure description of tapered feedline portion 1317.

Feedline 1315 may have a generally constant width w1 for its length. Similarly, feeding structure 1320, which may be a horizontal or vertical feeding structure, has a generally constant width w2.

Tapered feedline portion 1317 is generally of comparable thickness to feedline 1315 and has a generally trapezoidal shape, with a feedline-facing side (i.e., feedline side), having a length w1, coupled to feedline 1315. The opposite side (i.e., resonator side) of tapered feedline portion 1317, having a width w2, is coupled to feeding structure 1320. Tapered feedline portion 1317 has a length (i.e., distance between its parallel sides) l1.

Figure 14A:
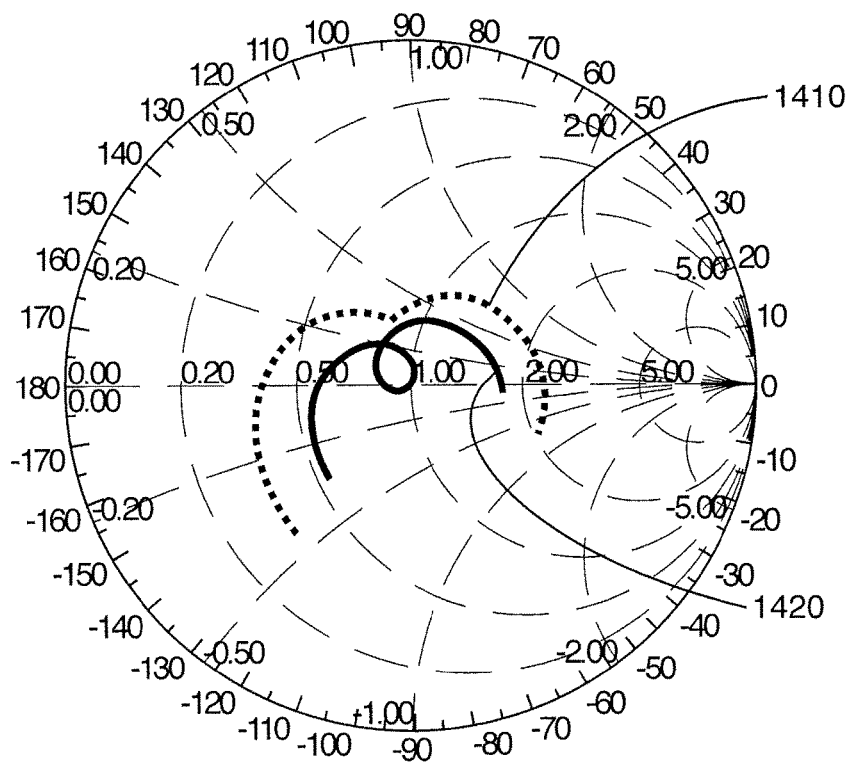
FIG. 14A illustrates a Smith Chart diagram in polar coordinates comparing reflection coefficients for the DRA of FIG. 13 and a conventional DRA.

Referring now to FIG. 14A, there is illustrated a Smith Chart diagram in polar coordinates comparing reflection coefficients for an example embodiment of DRA 1300 and a conventional DRA. In the example embodiment, DRA 1300 was designed to resonate at 25 GHz on a dielectric substrate with a thickness of 0.79 mm and permittivity of 2.2. The dielectric resonator was selected with permittivity of $\varepsilon_r=5$ and loss tangent of tan $\delta=0.02$, and with dimensions of 5 mm×5 mm×1.5 mm. The DRA was fed by a tapered feedline portion with width w1=2.4 mm and l1=1 mm to effectively excite the dominant mode (TE111) of the DRA in a wideband configuration. The effects of the tapered feedline portion 1317 in matching the impedance can be observed from the reflection coefficients in FIG. 14A.

The reflection coefficients for a conventional 50Ω microstrip line-fed DRA are shown by plotline 1410, and the reflection coefficients for the example embodiment of DRA 1300 are shown by plotline 1420. It can be observed that the resonance loop of the conventional DRA is positioned on the upper side of FIG. 14A. The introduction of tapered feedline portion 1317 shifts the locus of the reflection coefficient toward the centre of the Smith Chart.

Figure 14B:
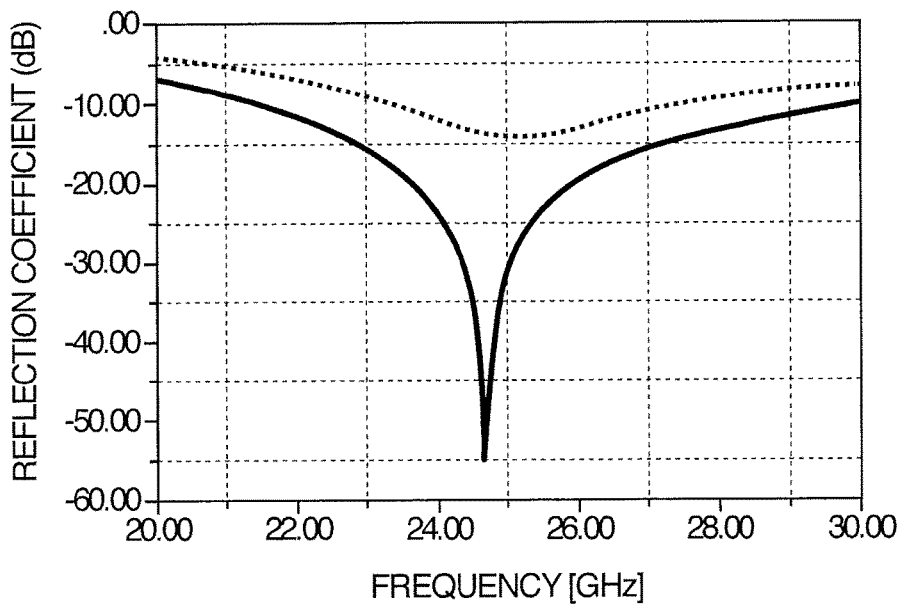
FIG. 14B illustrates a plot of reflection coefficients corresponding to the Smith Chart diagram of FIG. 14A.

Referring now to FIG. 14B, there is illustrated a plot of reflection coefficients corresponding to the Smith Chart diagram of FIG. 14A. It can be observed that excellent impedance matching is achieved and a −10 dB wide impedance bandwidth of 35% is obtained from about 21 GHz to 30 GHz. Accordingly, the amount of coupling is increased by increasing the width of the impedance matching transmission line (w2).

Figure 14C:
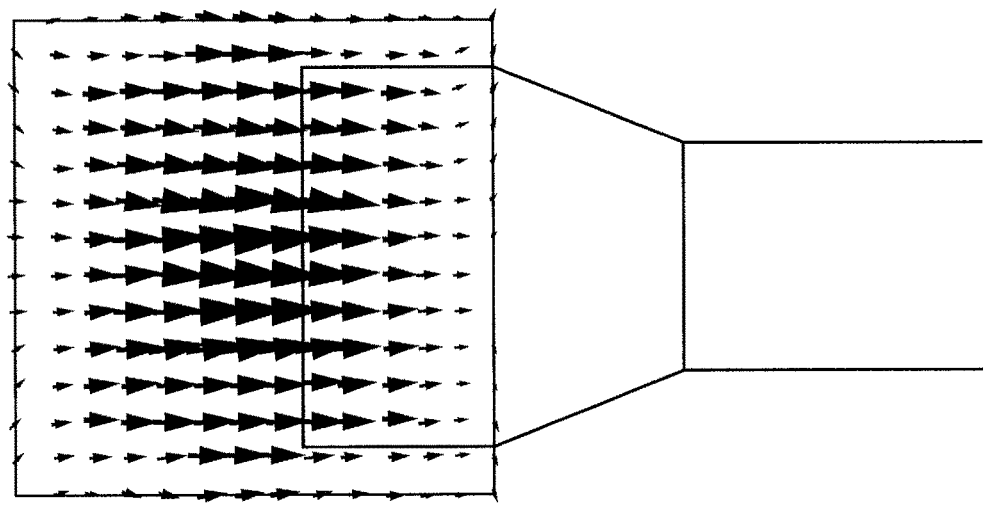
FIGS. 14C and 14D illustrate the electric near-field distributions inside the resonator body of the example embodiment of FIGS. 14A and 14B.
Figure 14D:
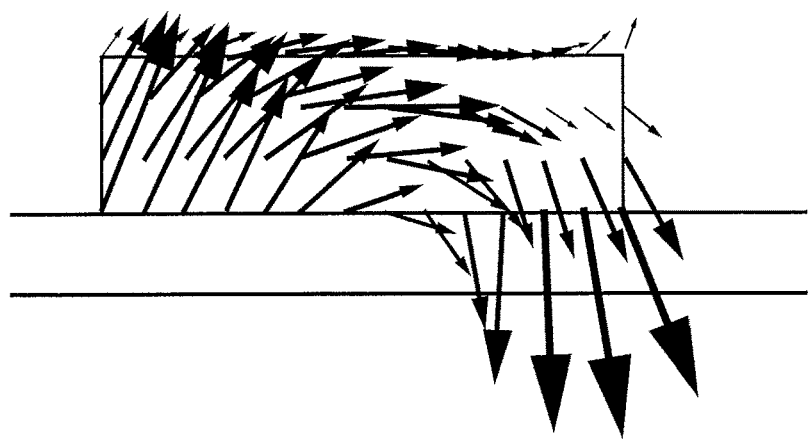

Referring now to FIGS. 14C and 14D, there is illustrated the electric near-field distributions inside resonator body 1330 in the example embodiment of FIGS. 14A and 14B. The dominant mode of the low-permittivity DRA is excited with appropriate polarization and orientation and strong electric fields are crated inside the DRA.

Figure 14E:
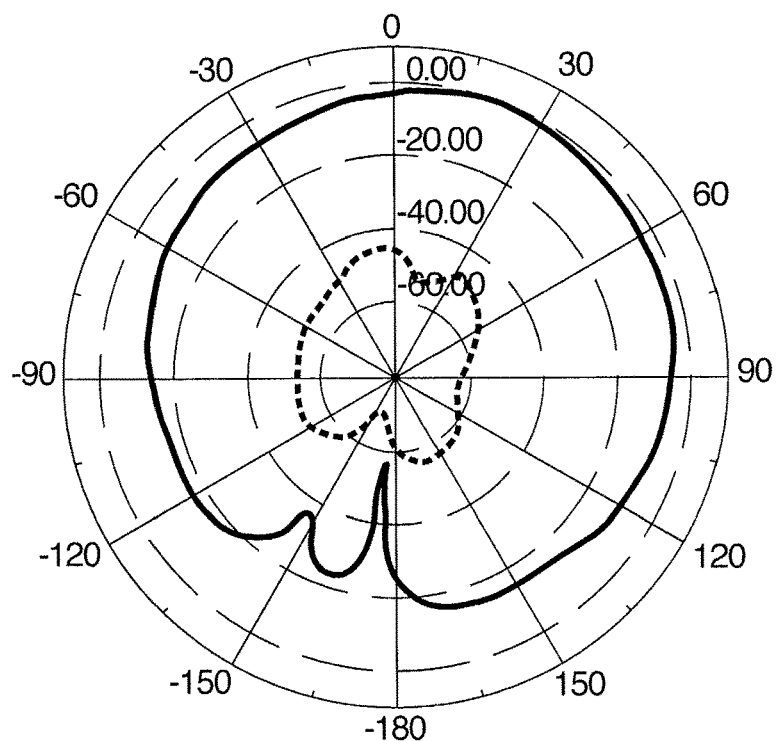
FIGS. 14E and 14F illustrate the E-plane and H-plane, respectively, normalized radiation patterns of the antenna at 25 GHz in the example embodiment of FIGS. 14A to 14D.
Figure 14F:
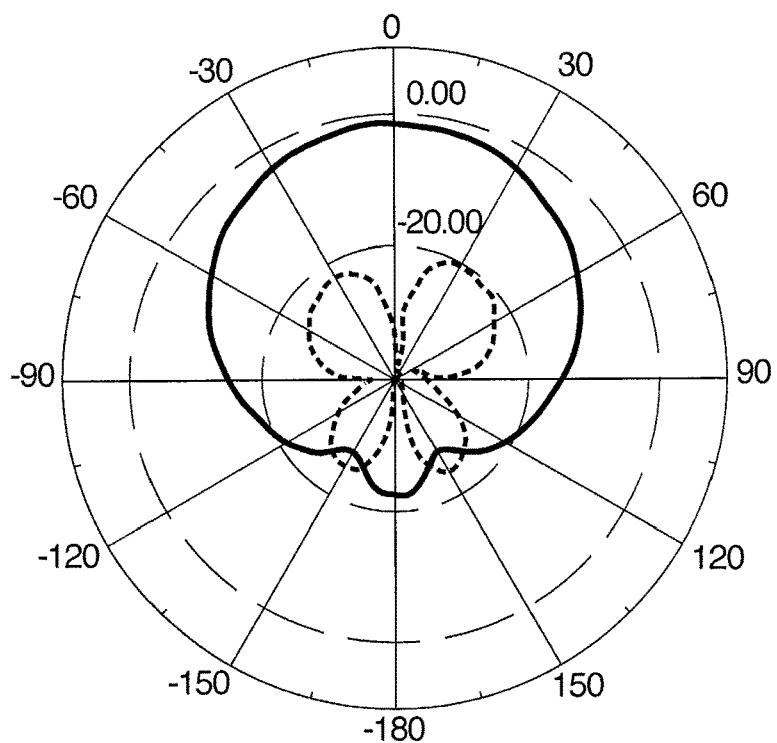

Referring now to FIGS. 14E and 14F, there are illustrated the E-plane and H-plane, respectively, normalized radiation patterns of the antenna at 25 GHz in the example embodiment of FIGS. 14A to 14D. Although the dielectric resonator has a low dielectric constant ($\varepsilon_r=5$), relatively low cross polarization levels (e.g., less than about −20 dB) are achieved and the radiation pattern is stable over the 35% impedance bandwidth. The peak realized gain of the DRA is around 7.5 dB at 25 GHz. The radiation efficiency of the DRA with tan $\delta=0.02$ is over 90% within the frequency band of the antenna. Accordingly, this feeding mechanism may be attractive for use with PRAs.

Figure 14G:
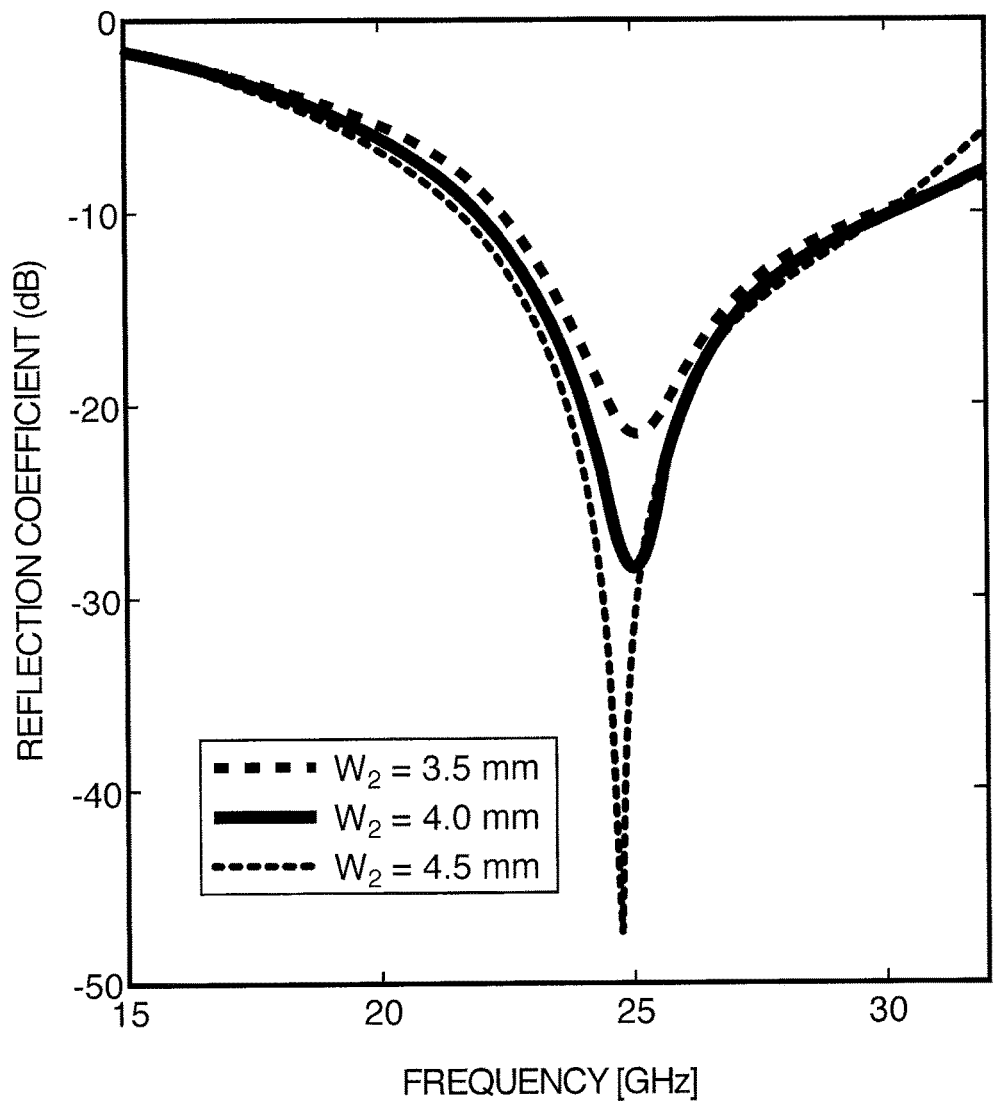
FIG. 14G illustrates the effect of varying resonator side width on a plot of reflection coefficients for the example embodiment of FIG. 14A.

Referring now to FIG. 14G, there is illustrated the effect of varying the resonator-side width of the feedline on a plot of reflection coefficients for the example embodiment of FIG. 14A. It can be observed that the amount of coupling is increased as the width w2 of the resonator side of the feedline is increased.

Figure 14H:
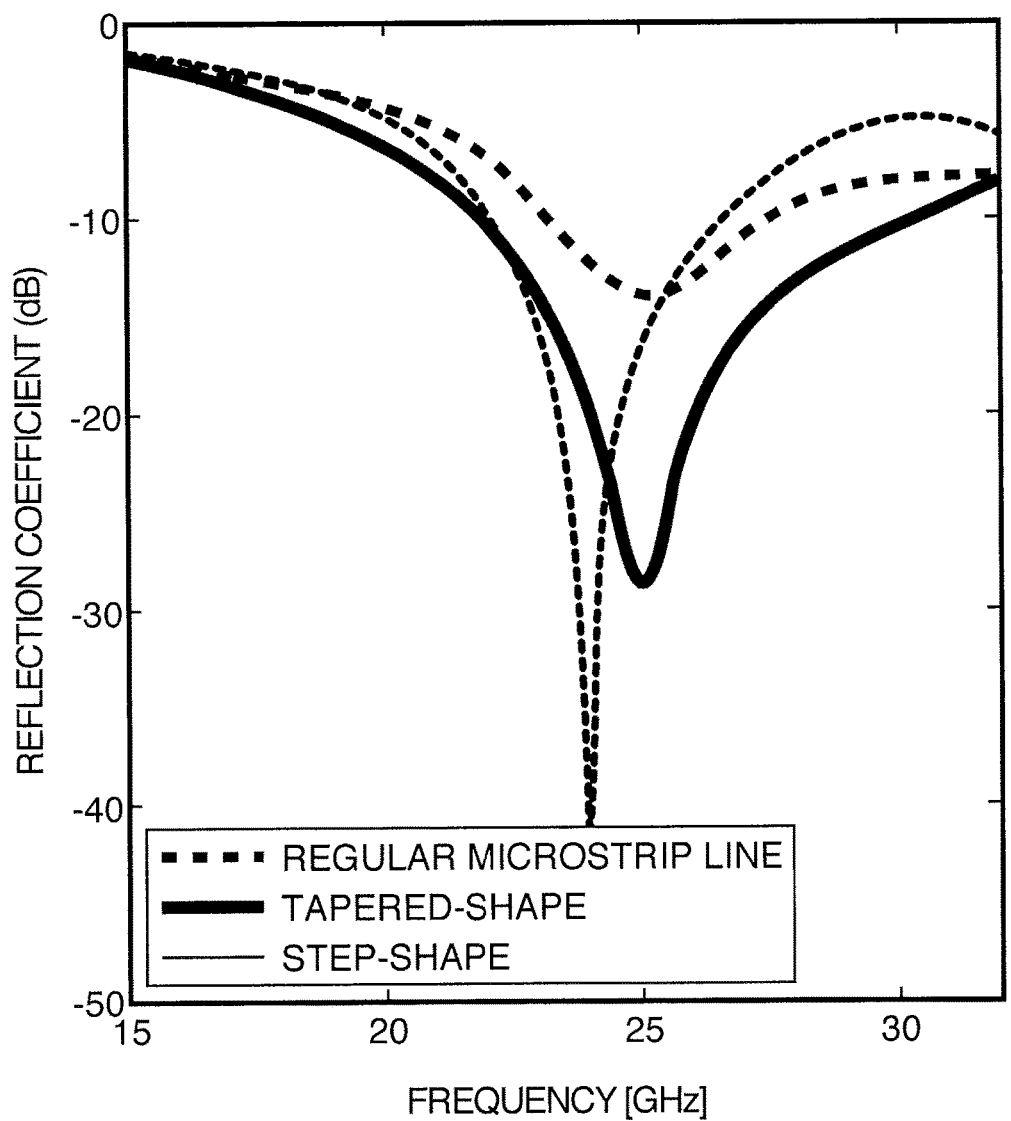
FIG. 14H illustrates a plot of reflection coefficients for various feedline shapes.

Referring now to FIG. 14H, there is illustrated a plot of reflection coefficients for various feedline shapes, including a conventional microstrip feedline, a step-shaped feedline and a feedline with tapered feedline portion. Strong coupling is achieved at the resonant frequency for both step-shape and tapered-shape configurations. However, in the case of step-shaped microstrip line the impedance bandwidth is significantly reduced to 20% and the resonant frequency is decreased by several percent. Conversely, the DRA with tapered feedline portion exhibits better performance.

Parallel Standing Strip Feeding Structure

In recent years, attempts have been made to improve DRA characteristics by considering higher-order modes in the design process. For instance, the higher order modes of rectangular and circular DRAs have been excited to achieve broadside radiation patterns with enhanced gain. To mitigate the difficulty of fabricating antennas for use at millimeter-wave frequencies, where the size of the antenna is often very small, larger DRAs have been designed to operate at higher-order modes. The resonance bands associated with the dominant mode and higher-order modes have also been merged in different ways and using different excitation methods to design DRAs with larger impedance bandwidths. For example, a tile shape rectangular DRA is capable of producing several modes with close resonant frequencies, resulting in wideband operation. However, this approach results in the excitation of non-radiating modes other than the desirable modes (e.g., TEx121 and TEx112), which can result in unstable radiation patterns with high cross polarization levels and increased gain variations over the impedance bandwidth.

In general, as the number of antenna resonances increases, it may become difficult to improve and maintain the performance of dielectric resonator antennas over the expanded impedance bandwidth. Non-radiating modes can also be excited, and even the radiating modes may not be excited with appropriate polarizations and orientation (e.g. tilted), resulting in degradation of far-field properties. Conventional size reduction methods may not be effective for multimode DRAs. Increasing the permittivity of the dielectric resonator in order to miniaturize the antenna generally results in reducing the impedance bandwidth for individual modes, thus decreasing the overall antenna bandwidth. Therefore an effective mechanism to remove unwanted modes, adjust the frequency distance between individual modes, reduce antenna size and cross polarization, and preserve radiation patterns within a wide bandwidth is desirable.

Described herein is an approach to improve the performance of DRAs over an expanded impedance bandwidth through the use of parallel vertical strips. The use of parallel vertical strips can provide several degrees of freedom in the design procedure, which can be used to enhance DRA performance.

The vertically-oriented strips can provide considerable flexibility for designers to adjust antenna properties. In the described approach, an "internal" vertical strip internal can be connected to the microstrip line and a second strip provided in parallel with the internal strip. The length of the parallel vertical strips and the permittivity and the thickness of the material between them can be selected to improve antenna characteristics. Four radiating modes, including the higher-order TE133 mode, can be excited using this approach and manipulated to achieve dual-band or wideband antennas. The radiation patterns of the excited modes are generally similar and consequently do not degrade the antenna's performance over the impedance bandwidth.

Adjustment of the antenna aspect ratio allows multiple resonances to be excited, which can increase the achievable bandwidth of DRAs with simple shapes without compromising the design (e.g., without requiring the use of complicated shapes, multiple DRAs, hybrid designs, etc.). Other antenna parameters, such as the cross polarization, size, and critical coupling to individual modes can be controlled, although improvements in any one of the antenna properties often results in degradation of the others. Accordingly, more degrees of freedom in the design process may help to satisfy all design constraints.

Figure 15A:
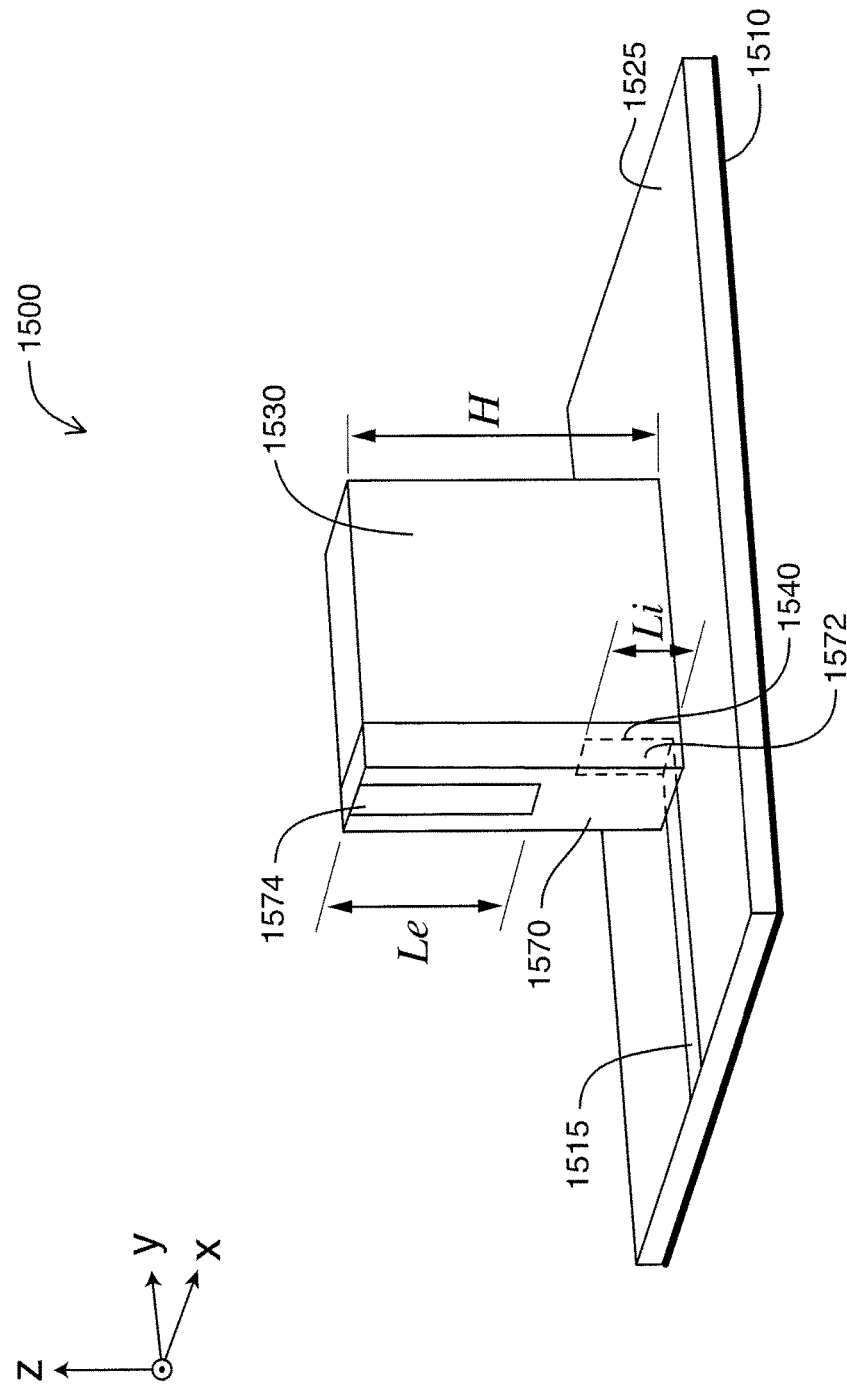
FIGS. 15A and 15B illustrate an isometric view and a plan view, respectively, of an example embodiment of a dual vertical feed structure.
Figure 15B:
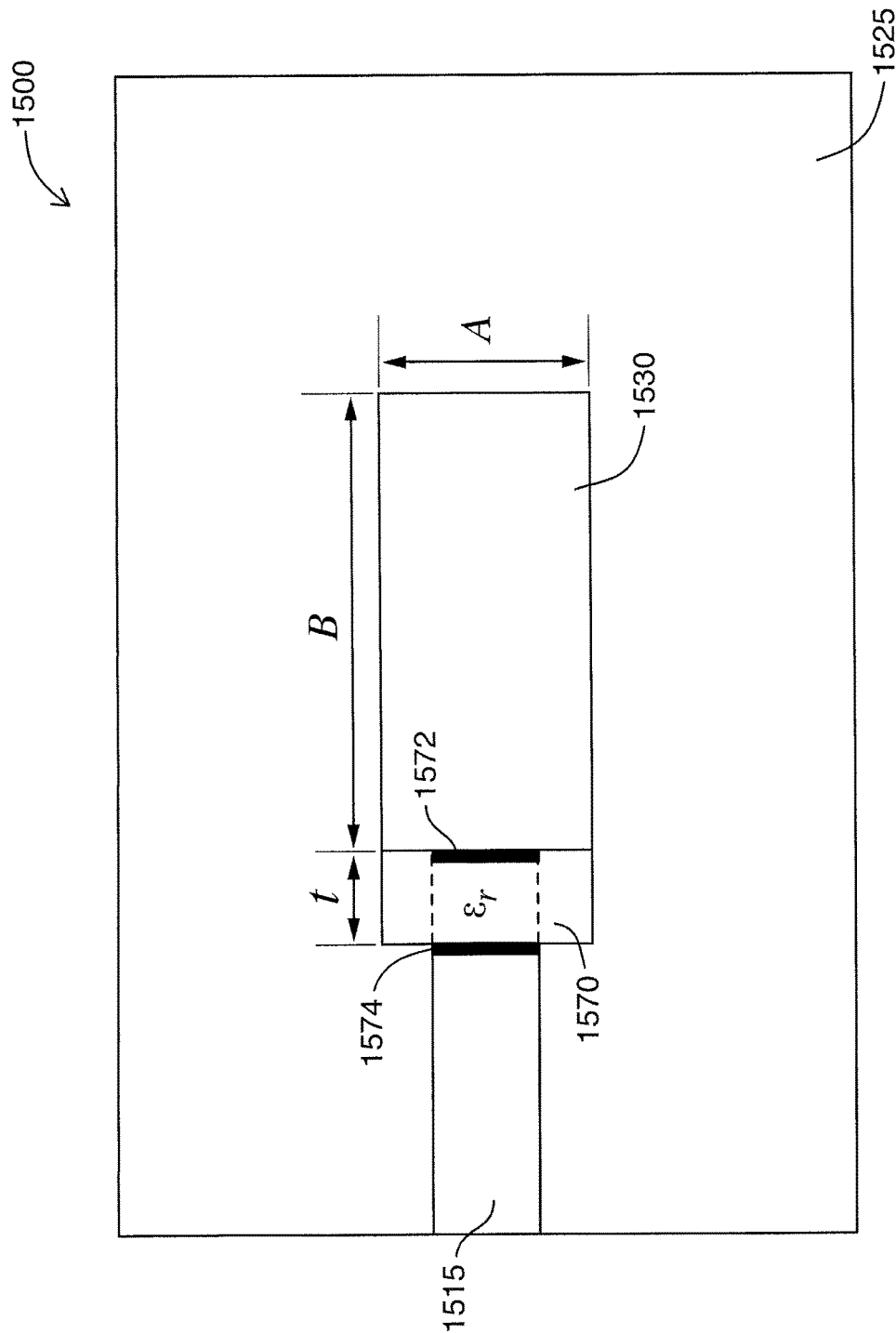

Referring now to FIGS. 15A and 15B, there is illustrated an isometric view and a plan view, respectively, of an example embodiment of a dual vertical feed structure. In the example embodiment, two oppositely and vertically oriented strips, namely an internal tall vertical feeding structure 1572 and an external strip 1574, are fabricated on opposite sides of a thin dielectric feed section 1570, which has a dielectric constant $\varepsilon_r$ and thickness t.

Feeding structure 1572 is formed of a conductive material (e.g., metal) and extends substantially perpendicularly from the surface of substrate 1525 or feedline 1515 into an aperture 1540. Preferably, feeding structure 1572 has a height corresponding to between 10-100% of the thickness of resonator body 1530. That is, feeding structure 1572 can be 10-100% the height of aperture 1540.

Feeding structure 1572 and aperture 1540 can have a generally flattened rectangular shape and be positioned generally proximally to an outer wall of resonator body 1530, so that the elongated edge is substantially parallel to the outer wall.

Feeding structure 1572 is coupled to feedline 1515 at its bottom (i.e., substrate-facing) end.

External strip 1574 has a generally flattened rectangular shape, and can be positioned generally proximally to an outer wall of dielectric feed section 1570. An inner wall of dielectric feed section 1570 is positioned generally proximally to an outer wall of resonator body 1530. In some variant embodiments, external strip 1574 may have shapes other than rectangular (e.g., trapezoidal, parabolic, etc.). In some further embodiments, external strip 1574 may comprise multiple strips.

External strip 1574 has a length $L_e$ and feeding structure 1572 has a length $L_i$. Antenna performance is relatively less sensitive to the widths of external strip 1574 and feeding structure 1572, than to their lengths.

The dielectric resonator body 1530 can be designed using dielectric waveguide model (DWM) equations so that multiple resonances can potentially be excited in close vicinities. Examples of this are disclosed in A. Rashidian and D. M. Klymyshyn, "On the two segmented and high aspect ratio dielectric resonator antenna for bandwidth enhancement and miniaturization," IEEE Transactions on Antennas and Propagation, vol. 57, no. 9, pp. 2775-2780, September 2009.

Accordingly, the feeding structure 1572, external strip 1574, and dielectric feed section 1570 properties (e.g., $L_e$, $L_i$, $\varepsilon_r$, and t) can be adjusted to provide several additional degrees of freedom in the design procedure, which can therefore allow control of the amount of coupling and frequency distance between individual modes, size of the antenna, radiation pattern, and cross polarization, as described herein.

In simulations, dielectric resonator body 1530 was selected to have a cross section of A×B=4.6×9.0 mm, height H=10.8 mm, a dielectric constant of 9.8 and loss tangent of 0.001. The antenna was supported by a 20×30 mm ground plane (0.53$\lambda_0$×0.8$\lambda_0$ at 8 GHz), with a substrate thickness of 0.8 mm, dielectric constant of 2.2, and loss tangent of 0.001. Since the antenna performance is generally not sensitive to variations in strip width, their width is selected to be 2.4 mm, which is the width of the 50Ω microstrip feedline 1515 on the substrate.

Figure 16A:
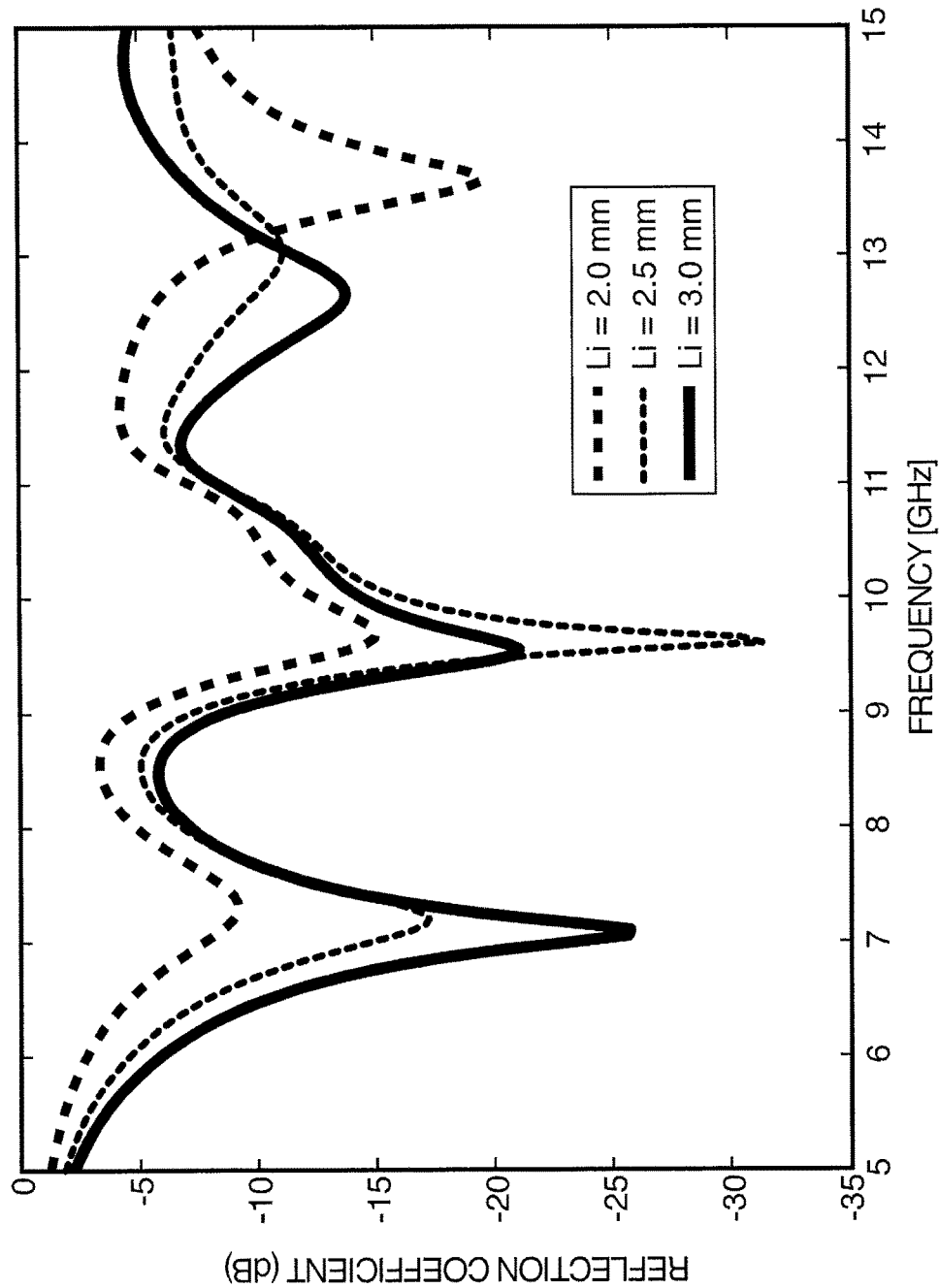
FIG. 16A illustrates a plot of variations in reflection coefficient for varying lengths $L_i$ for the example embodiment of FIGS. 15A and 15B.

Referring now to FIG. 16A, there is illustrated a plot of variations in reflection coefficient for varying lengths $L_i$. In FIG. 16A, length $L_e$ is held constant at 10.5 mm as $L_i$ varies from 2 to 3 mm. Thickness t is 1 mm, and dielectric feed section 1570 has a permittivity $\varepsilon_r=1$.

Three resonant modes are very well excited and the amount of coupling to each individual mode is adjusted by changing $L_i$. The first and second resonances stay mainly fixed at the same frequency, while the third resonance shifts down in frequency with increasing $L_i$. In particular, the third resonance mode is at 13.8 GHz for $L_i=2$ mm and decreases to 12.7 GHz for $L_i=3$ mm.

Figure 16B:
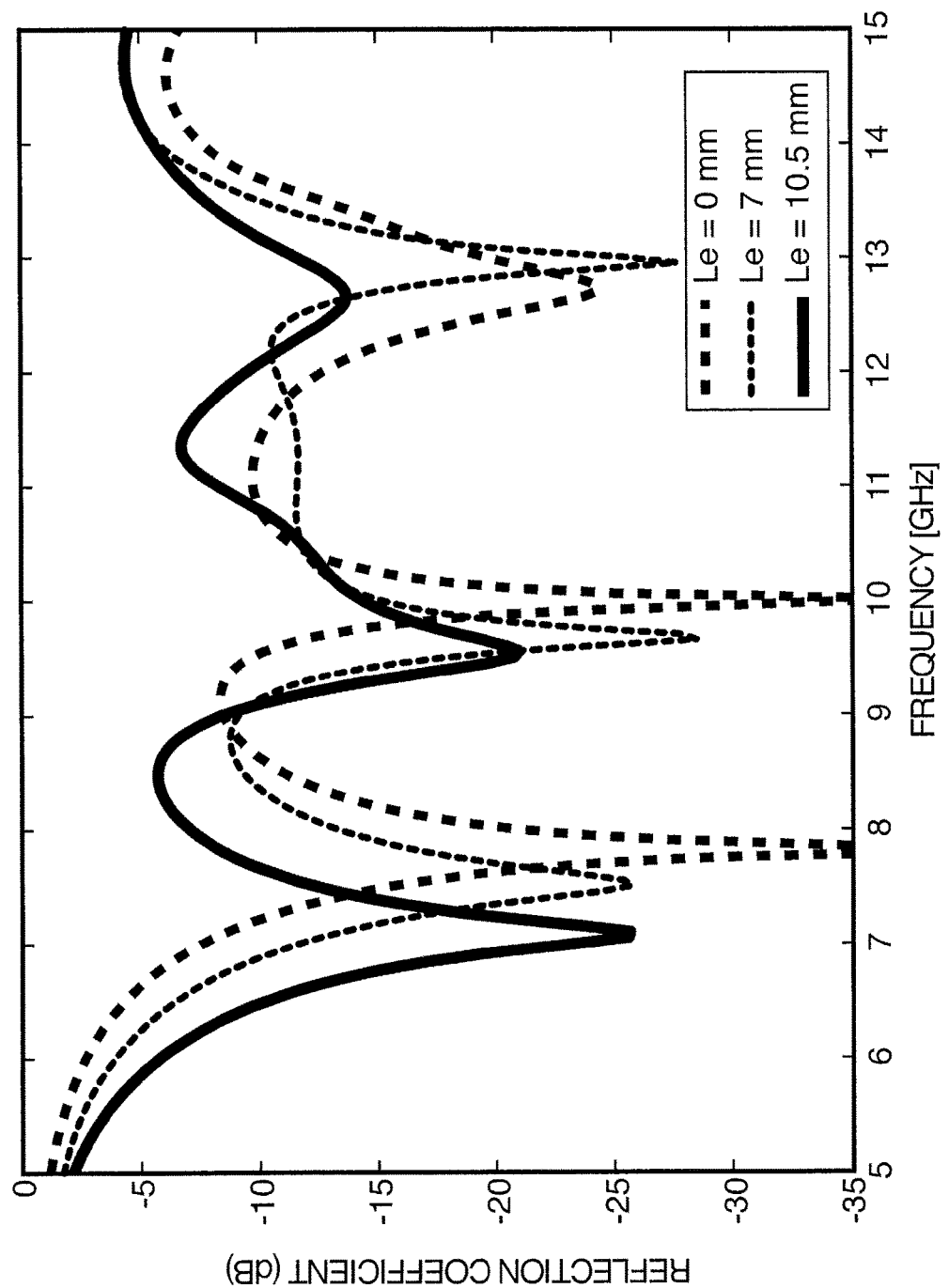
FIG. 16B illustrates a plot of variations in reflection coefficient for varying lengths $L_e$ for the example embodiment of FIGS. 15A and 15B.

Referring now to FIG. 16B, there is illustrated a plot of variations in reflection coefficient for varying lengths $L_e$. In FIG. 16B, length $L_i$ is held constant at 3 mm as $L_i$ varies from 0 (i.e., external strip 1574 is not present) to 10.5 mm. Thickness t is 1 mm, and dielectric feed section 1570 has a permittivity $\varepsilon_r=1$.

In contrast to FIG. 16A, the third resonance stays mainly fixed at the same frequency, while the first and second resonant frequencies are considerably decreased with increasing external strip length $L_e$. In particular, the first and second resonant frequencies are at 7.9 and 10 GHz for the case with no external strip (i.e., $L_e=0$ mm), the resonant frequencies shift to 7 and 9.5 GHz when $L_e=10.5$ mm.

Figure 17E:
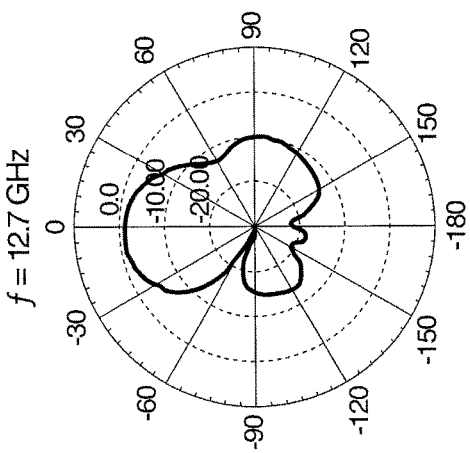
FIGS. 17A to 17F illustrate radiation patterns in the E-plane and H-plane cuts for one configuration of the DRA of FIG. 15A.
Figure 17F:
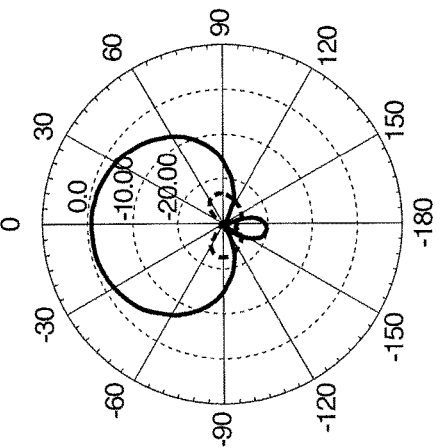
Figure 17C:
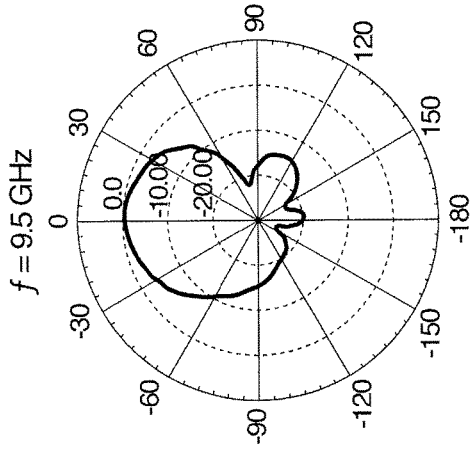
Figure 17D:
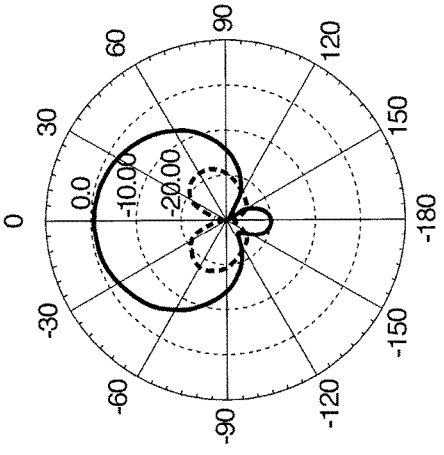
Figure 17A:
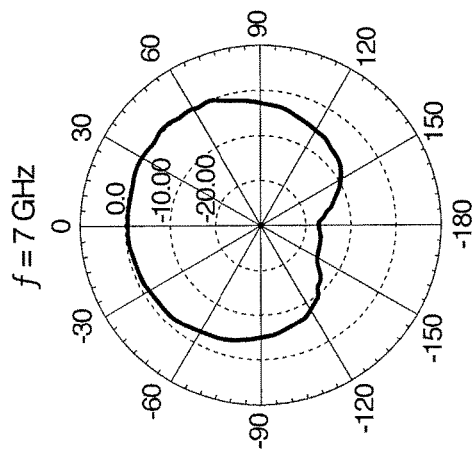
Figure 17B:
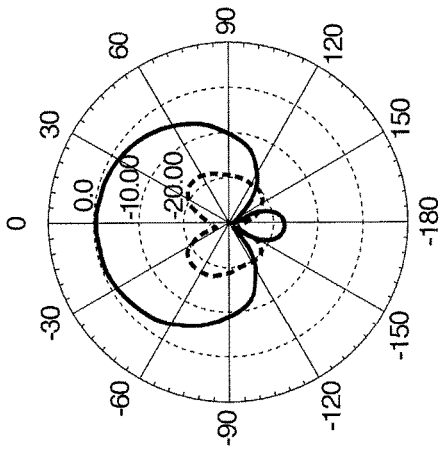

Referring now to FIGS. 17A to 17F, there are illustrated radiation patterns in the E-plane and H-plane cuts for the DRA of FIG. 15A with $L_e=10.5$ mm and $L_i=3$ mm at the minima of reflection coefficients. FIG. 17A illustrates the E-plane at a frequency of 7 GHz. FIG. 17B illustrates the H-plane at a frequency of 7 GHz. FIG. 17C illustrates the E-plane at a frequency of 9.5 GHz. FIG. 17D illustrates the H-plane at a frequency of 9.5 GHz. FIG. 17E illustrates the E-plane at a frequency of 12.7 GHz. FIG. 17F illustrates the H-plane at a frequency of 12.7 GHz.

In FIGS. 17A to 17F, all radiation patterns are relatively symmetrical with a maximum in the broadside direction, and with small cross polarization levels.

Figure 18:
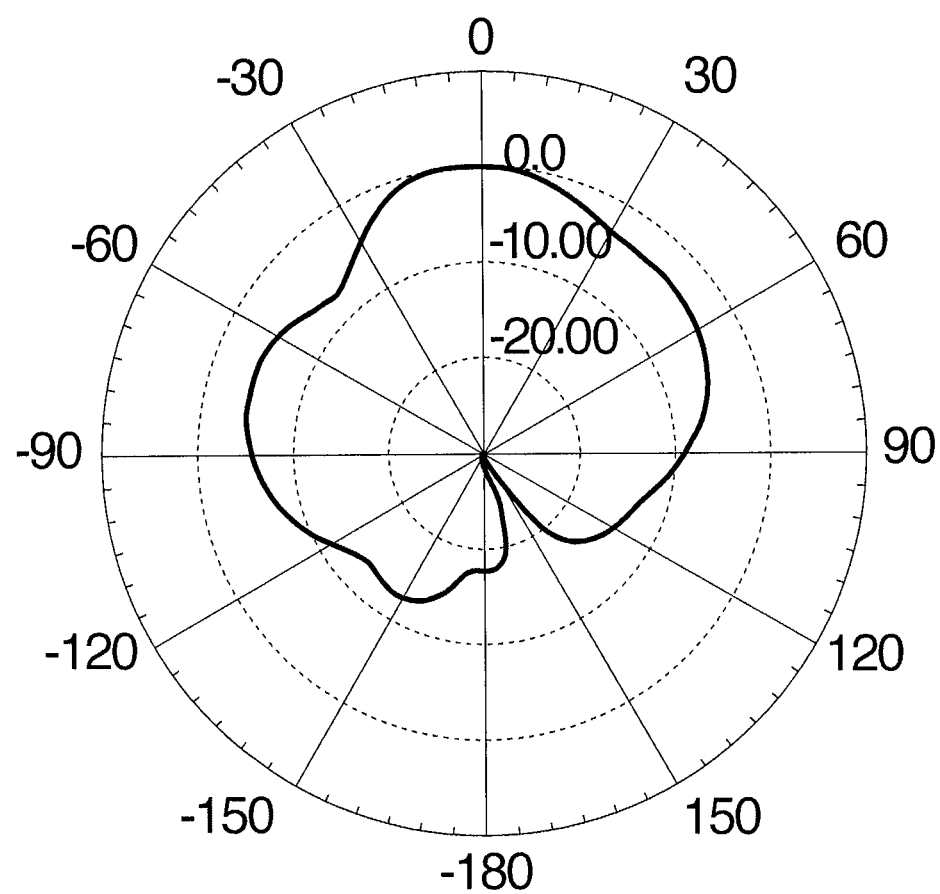
FIG. 18 illustrates a radiation pattern in the E-plane cut for the DRA with no external strip in one configuration.
Figure 19:
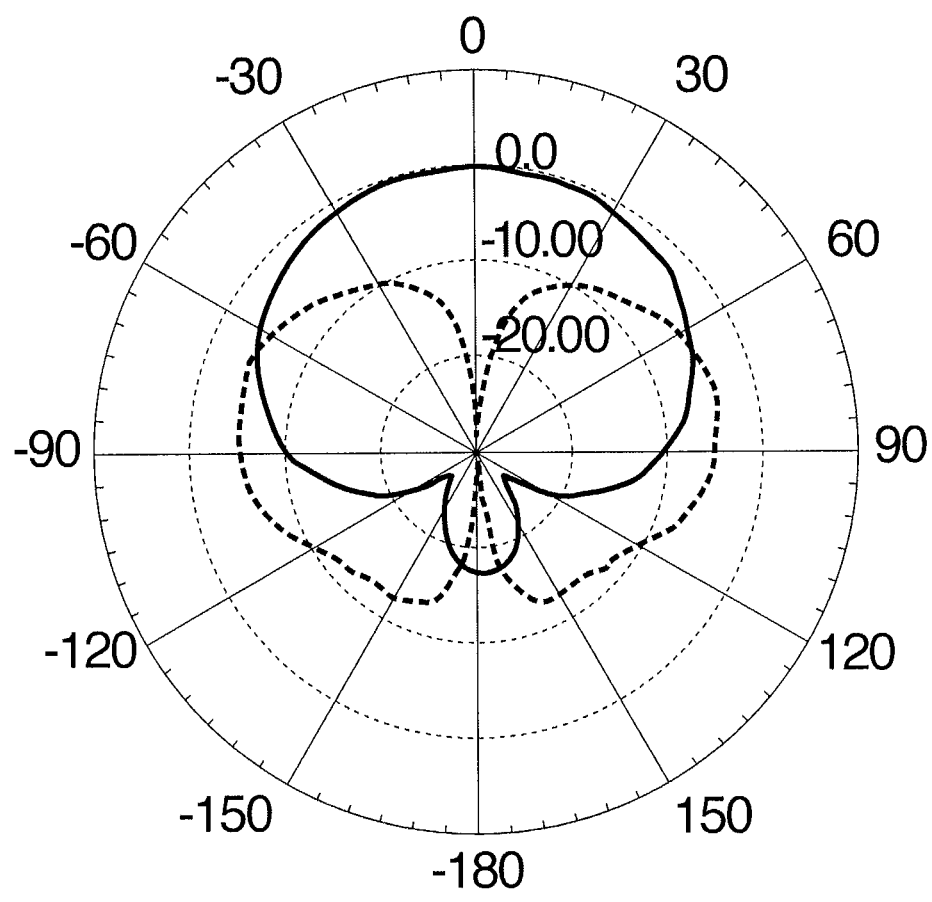
FIG. 19 illustrates a radiation pattern in the H-plane cut for the DRA with no external strip in one configuration.

Conversely, in FIGS. 18 and 19 there are illustrated radiation patterns in the E-plane and H-plane cut, respectively, for the DRA with no external strip (i.e., $L_e=0$ mm, Li=3 mm) at the last minimum of reflection coefficient. Although the H-plane radiation pattern is still symmetrical with respect to the broadside direction, the cross polarization levels are significantly increased, as compared to FIGS. 17A to 17F. Moreover, the E-plane pattern is deformed with a null at −45°, and is also tilted from the broadside direction. Due to the existence of undesirable higher-order modes, many wideband DRAs excited by vertical electric currents (e.g., probes) tend to have deformed broadside radiation patterns at the upper side of the frequency band.

As the permittivity of the dielectric feed section increases to a higher value, only the resonant frequency of the dominant mode shifts down (i.e., the resonant frequencies of the other modes do not change). Accordingly, when a higher permittivity material is used between the two strips, the thickness t can be increased in order to unify the impedance bandwidth of the dominant mode with higher-order modes.

By optimizing the permittivity and thickness for the dielectric feed section, desirable properties of the DRA (e.g., maximum bandwidth, minimum size, etc.) can be achieved or enhanced.

In general, to maximize the beneficial effect of external strip 1574 in improving radiation patterns, the thickness of the dielectric feed section 1570 should be limited to smaller values, for example $\lambda/10$ or less.

To ensure that the dielectric feed section itself does not resonate, its permittivity should be kept low (e.g., below $\varepsilon_r=10$). Self-resonance of the dielectric slab may degrade the radiation pattern and efficiency of the antenna. A higher permittivity (e.g., $\varepsilon_r=10$) may result in increased current intensity on the external strip, indicating the coupling of energy in the wrong direction (i.e., toward the dielectric feed section). Consequently, this can increase the resistive losses in the feed section and decrease the radiation efficiency of the antenna.

In some embodiments, vertical strips can be fabricated at macro scales (i.e., not in a semiconductor fabrication process) and may even be fitted to existing DRAs. For example a dielectric feeding section with vertical strips may be fabricated by etching on the front and back side of a low permittivity material (e.g., polymer sheet) with the desired thicknesses, and filling the etched volumes with metal. The material can be cut to size and coupled (e.g., glued or otherwise fastened) to the sidewall of a dielectric resonator. To reduce the notched frequency band and unify the impedance bandwidth, strips generally may be implemented on thicker substrates. However, the band-notched function may be beneficial in a wideband system to reduce the interferences from other applications.

Tall Microstrip Transmission Lines

In some cases, low-permittivity DRAs may be difficult to effectively excite using conventional microstrip feedlines. Described herein are tall microstrip transmission lines (TMLs), which can reduce losses and improve efficiency when used with DRAs, particularly in millimeter-wave applications. Generally, TMLs can be formed by increasing the thickness of a metal feedline (e.g., copper) or by inserting a narrow dielectric support between the feedline and the resonator body.

TMLs can be used to improve the performance of microwave and millimeter-wave circuits. The increased conduction surface available in three dimensional (3-D) planar transmission lines allows development of high-power monolithic circuits. Moreover, the vertical dimension of a TML allows for very high coupling levels that are nearly impossible to achieve with conventional transmission lines. By using the third (vertical) dimension, the lateral dimension can be made relatively smaller compared to a conventional planar structure.

TMLs can significantly reduce dielectric losses, since a major portion of the electromagnetic wave traverses through air and not the substrate. By adjusting the parameters of the TMLs (e.g., permittivity and dimension) the impedance bandwidth of a DRA can be improved.

In general, the use of higher permittivity substrates may suggest that taller TMLs should be used.

Figure 20A:
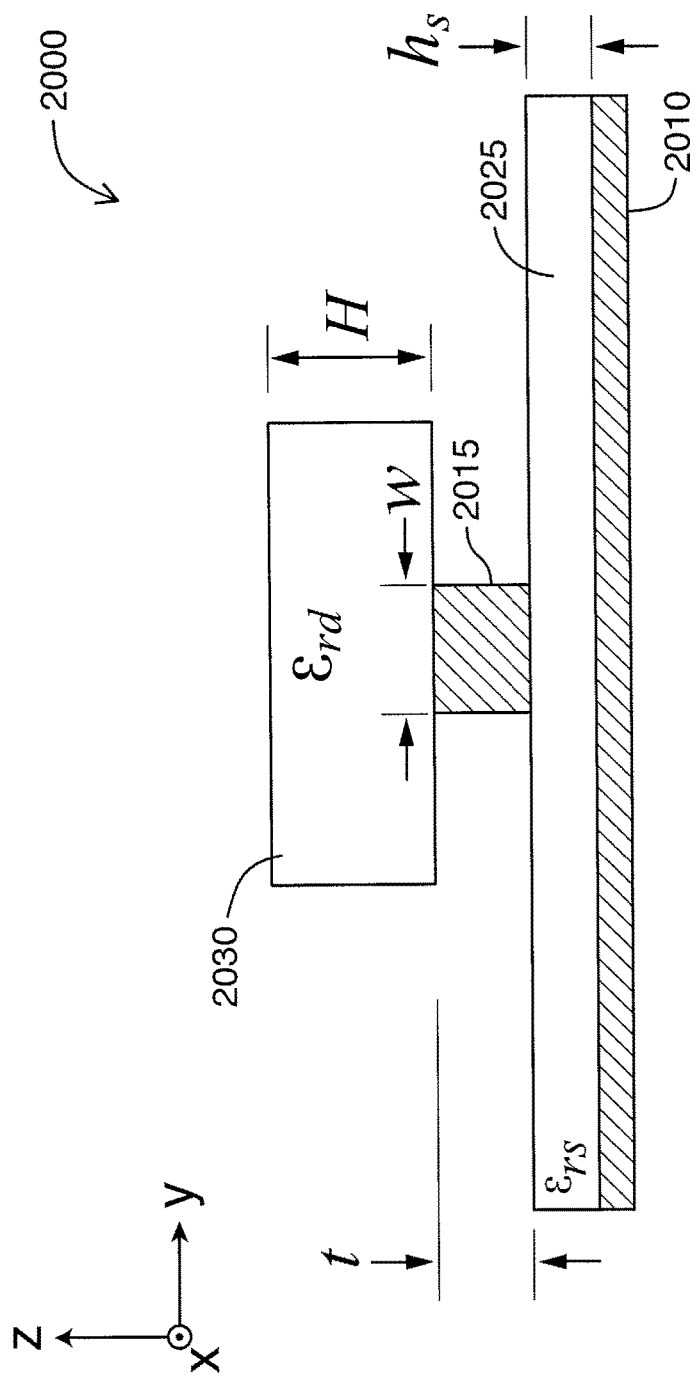
FIG. 20A illustrates a side view of an example PRA embodiment with improved feedline.
Figure 20B:
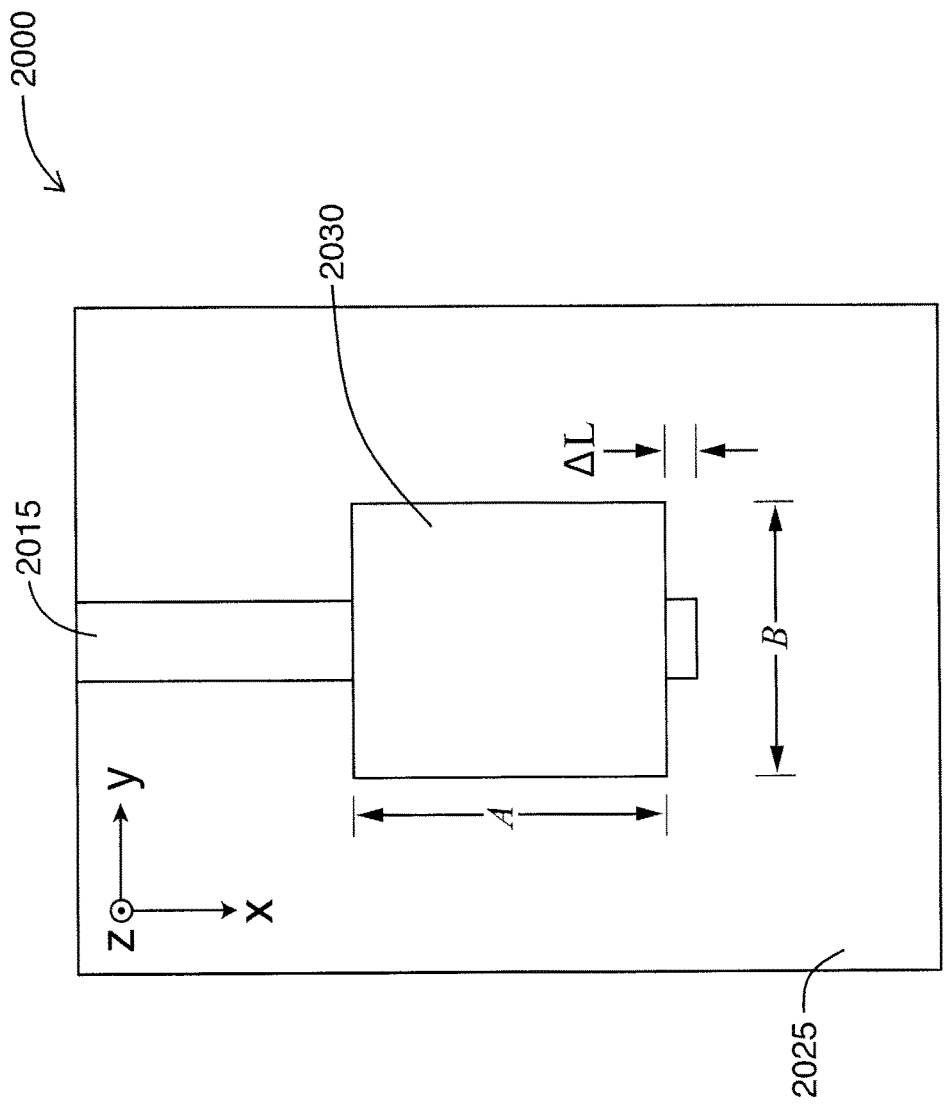
FIG. 20B illustrates a plan view of the DRA of FIG. 20A.

Referring now to FIG. 20A, there is illustrated a side view of an example DRA embodiment with TML feedline. DRA 2000 generally comprises a ground layer 2010, substrate 2025, TML feedline 2015, and a resonator body 2030. TML feedline 2015 is an all-metal feedline. FIG. 20B illustrates a plan view of DRA 2000.

Figure 20C:
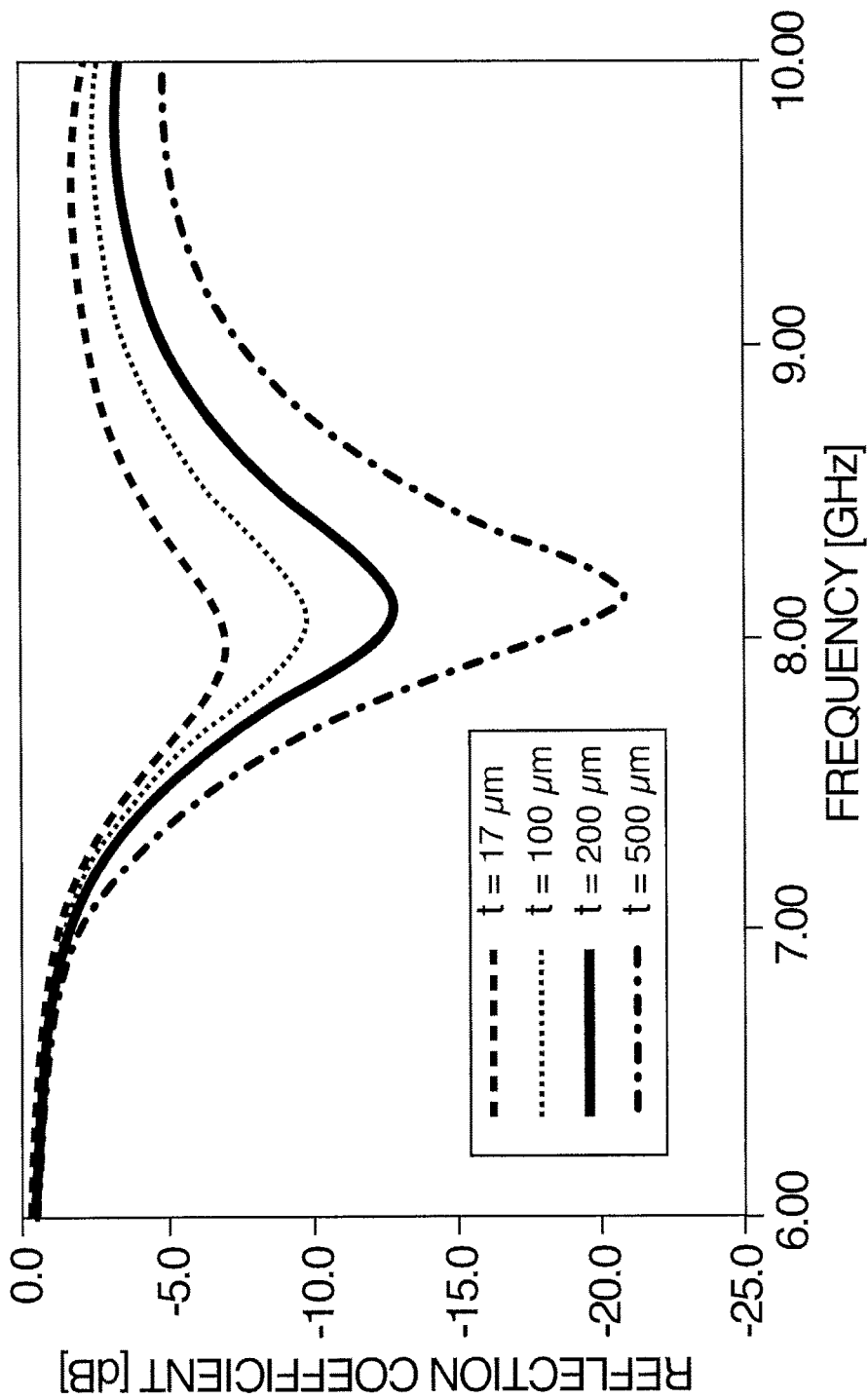
FIG. 20C illustrates a plot of reflection coefficients for various feedline thicknesses.

FIG. 20C illustrates a plot of reflection coefficients for various TML feedline thicknesses. Reflection coefficients are plotted for feedline thicknesses (heights) of 17 μm, 100 μm, 200 μm and 500 μm. In each case, the width of the TML feedline is adjusted to maintain impedance of 50Ω for the feedline. Weak coupling to the DRA occurs for a microstripline with thickness 17 μm, which corresponds to a planar metal waveguide (i.e., conventional metal conductor deposited on the substrate). However, the amount of coupling is significantly improved as the TML feedline thickness is increased to 500 μm.

Figure 21A:
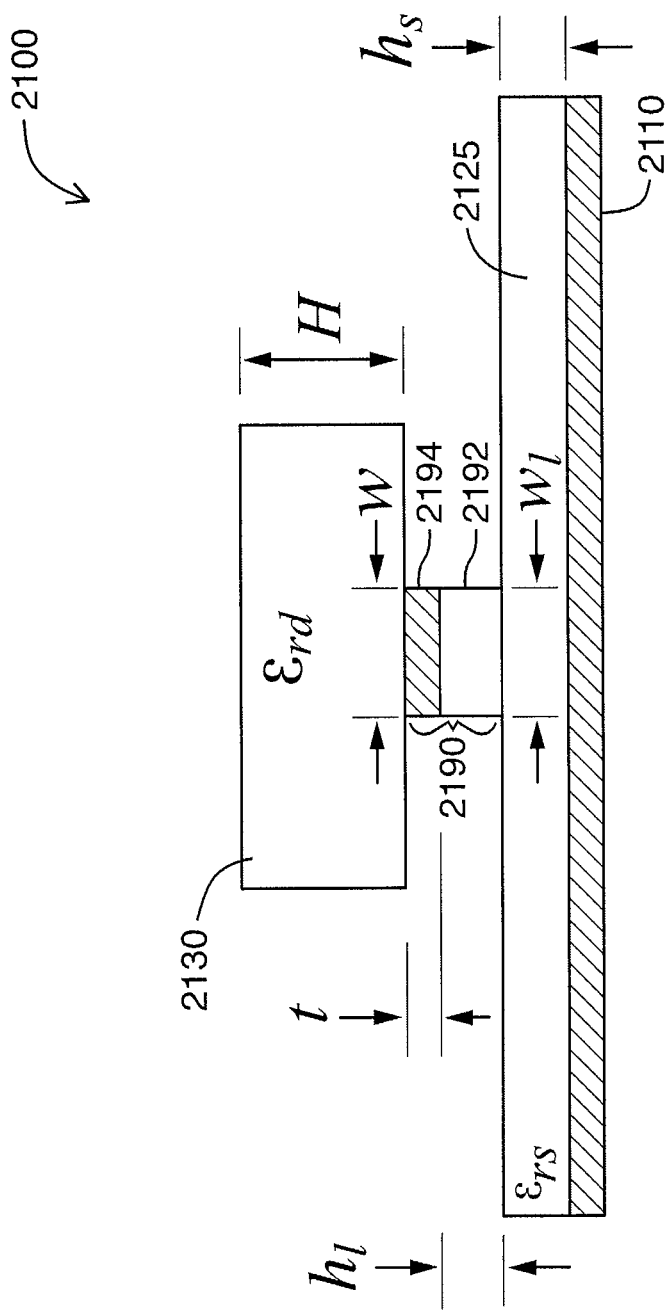
FIG. 21A illustrates a side view of an example DRA embodiment with improved feedline and dielectric support.
Figure 21B:
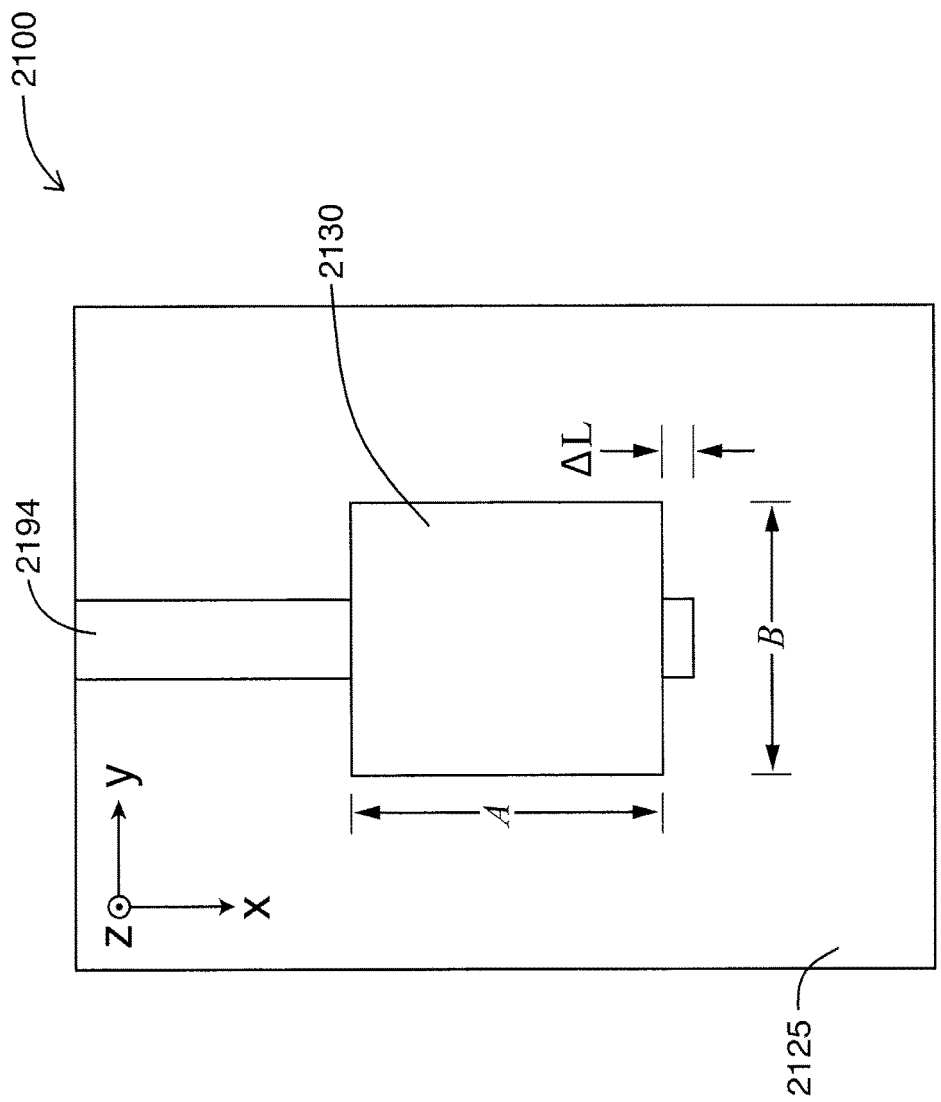
FIG. 21B illustrates a plan view of the DRA of FIG. 21A.

Referring now to FIG. 21A, there is illustrated a side view of an example DRA embodiment with TML feedline and dielectric support. DRA 2100 is generally analogous to DRA 2000, and comprises a ground layer 2110, substrate 2125, resonator body 2130 and TML feedline 2190. TML feedline 2190 is a polymer-metal feedline, which comprises feedline 2192 and dielectric support 2194. FIG. 21B illustrates a plan view of DRA 2100.

Figure 21C:
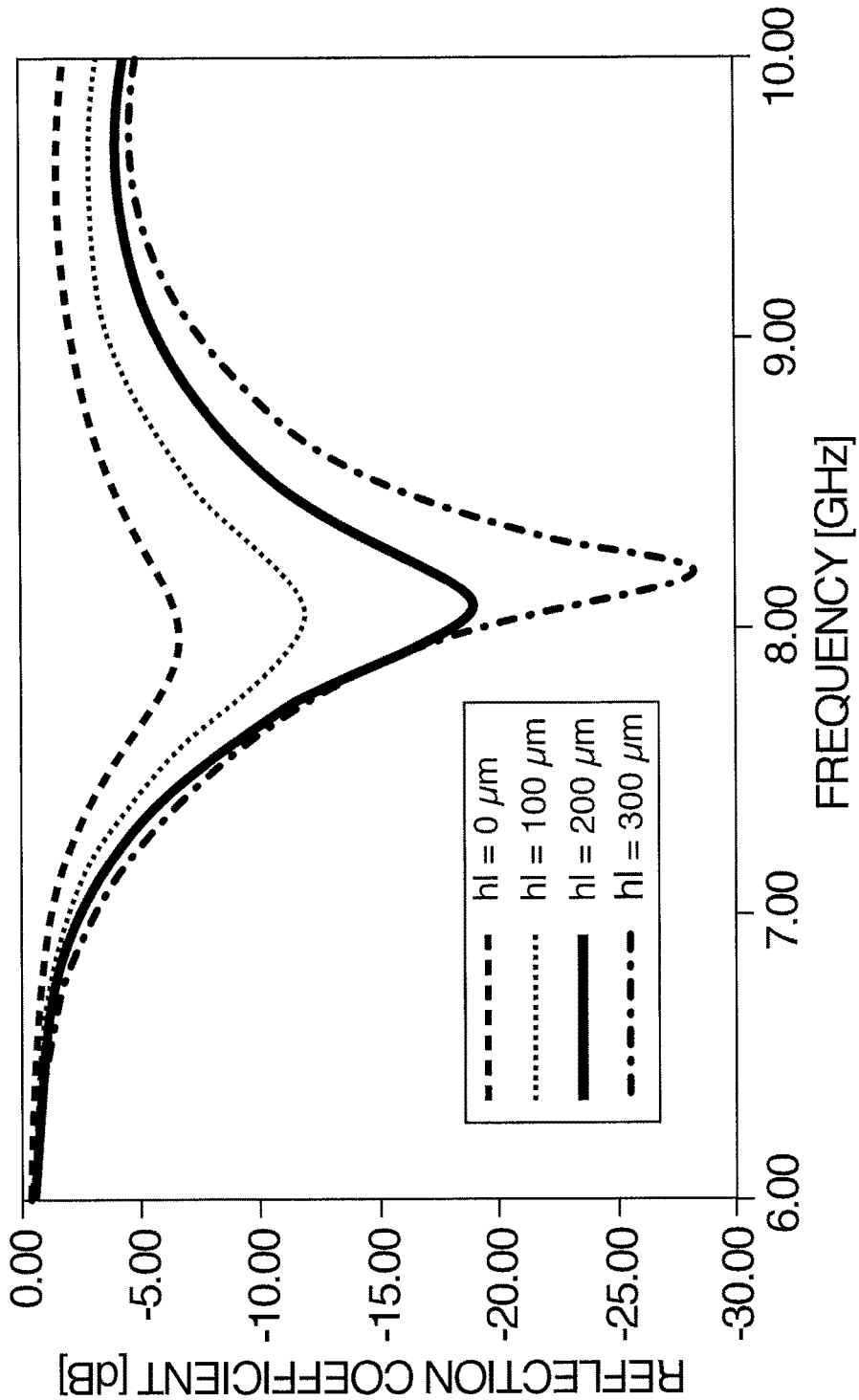
FIG. 21C illustrates a plot of reflection coefficients for various dielectric support thicknesses.

FIG. 21C illustrates a plot of reflection coefficients for various dielectric support thicknesses. Feedline 2192 thickness is kept constant at 17 μm. Reflection coefficients are plotted for dielectric support thicknesses (heights) of 0 μm, 100 μm, 200 μm and 300 μm. In each case, the width of the dielectric support is kept equal to the metal feedline width, and the feedline width is adjusted to maintain impedance of 50Ω for the feedline. Weak coupling to the DRA occurs for a (planar) microstripline with t=17 μm. However, the amount of coupling is significantly improved as the TML feedline thickness is increased to t=500 μm. The dielectric constant of the dielectric support is $\varepsilon_{ri}=2.2$.

As compared to a planar microstripline (i.e., no dielectric support), coupling is considerably improved when dielectric supports are provided. A return loss better than 25 dB is achieved for a dielectric support thickness of 300 μm.

In planar microstripline excitation, the electromagnetic energy is generally confined in the substrate. However, in the case of all-metal TMLs the electromagnetic energy is coupled into the low permittivity DRA, while only a small portion remains in the substrate. With dielectric-metal TMLs, this effect is even more pronounced.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments. Various modifications and variations may be made to these exemplary embodiments without departing from the scope of the invention, which is limited only by the appended claims.

The invention claimed is:

1. A dielectric resonator antenna comprising:
   a substrate with at least a first planar surface;
   a feedline formed on the first planar surface of the substrate;
   a polymer-based resonator body comprising at least a first body portion disposed on the first planar surface of the substrate and at least partly upon the feedline, wherein the first body portion at least partly defines a first cavity and at least one second cavity extending through the resonator body in a plane substantially perpendicular to the first planar surface, wherein the first cavity exposes a first feedline portion of the feedline; and a conductive feed structure disposed within the first cavity, the conductive feed structure disposed at least partly upon the first feedline portion, the conductive feed structure electrically coupled to the first feedline portion, the conductive feed structure extending away from the feedline through the first cavity by an amount between 10-100% of a height of the first cavity.

2. The dielectric resonator antenna of claim 1, wherein the first body portion is comprised of dielectric material that is retained following fabrication.

3. The dielectric resonator antenna of claim 2, wherein the polymer-based resonator body comprises at least one second body portion provided within the at least one second cavity.

4. The dielectric resonator antenna of claim 1, wherein the polymer-based resonator body comprises a second body portion provided in abutment to the first body portion.

5. The dielectric resonator antenna of claim 4, wherein the second body portion is in abutment with an outer wall of the first body portion, and wherein the feed structure is fittingly engaged between the first body portion and the second body portion.

6. The dielectric resonator antenna of claim 4, wherein the at least one second body portion is comprised of a different material than the first body portion.

7. The dielectric resonator antenna of claim 1, wherein the first body portion has a relative permittivity less than 10.

8. The dielectric resonator antenna of claim 1, wherein the polymer-based resonator body is comprised of a pure polymer photoresist material.

9. The dielectric resonator antenna of claim 1, wherein the polymer-based resonator body is comprised of a composite polymer-based photoresist material.

10. The dielectric resonator antenna of claim 1, further comprising a tapered feedline portion, the tapered feedline portion having a first side with a first width and a second side with a second width, wherein the second width is wider than the first width, wherein the conductive feed structure is electrically coupled to the feedline via the tapered feedline portion at the second side, and wherein the feedline is electrically coupled to the conductive feed structure via the tapered feedline portion at the first side.

11. The dielectric resonator antenna of claim 1, wherein the polymer-based resonator body comprises a plurality of metal inclusions extending through the polymer-based resonator body in a direction generally perpendicular to the substrate, and wherein the plurality of metal inclusions are provided in a regular pattern to enhance an effective relative permittivity of the polymer-based resonator body.

12. The dielectric resonator antenna of claim 11, wherein the plurality of metal inclusions have a generally H-shaped profile.

13. The dielectric resonator antenna of claim 1, wherein the feedline is a microstrip feedline extending at least partially between the resonator body and the substrate, wherein the feedline abuts the resonator body at a first distance from the substrate surface, and wherein the feedline has a width and a thickness selected to provide a predetermined impedance.

14. The dielectric resonator antenna of claim 13, wherein the thickness of the feedline substantially exceeds a planar metal waveguide thickness.

15. The dielectric resonator antenna of claim 14, wherein the thickness is between 100 μm and 1000 μm.

16. The dielectric resonator antenna of claim 13, further comprising a dielectric support positioned between the feedline and the substrate.

17. The dielectric resonator antenna of claim 16, wherein the dielectric support has a low relative permittivity.

18. The dielectric resonator antenna of claim 17, wherein the dielectric support has a relative permittivity less than 10.

19. The dielectric resonator antenna of claim 16, wherein the width of the feedline corresponds to the width of the dielectric support.

20. The dielectric resonator antenna of claim 16, wherein the first distance is equal to the thickness of the feedline and a thickness of the dielectric support.

21. The dielectric resonator antenna of claim 13, wherein the predetermined impedance is 50Ω.

22. The dielectric resonator antenna of claim 1, further comprising:

a dielectric feed section having an inner wall, an outer wall, a top wall and a bottom wall, the bottom wall opposite the top wall, the dielectric feed section disposed at least partly upon the feedline along its bottom wall and abutting the resonator body along the inner wall; and an external strip disposed along the outer wall of the dielectric feed section, the external strip extending substantially perpendicular to the first planar surface toward the bottom wall from the top wall of the dielectric feed section.

23. The dielectric resonator antenna of claim 22, wherein the feed structure extends away from the feedline through the cavity by an amount between 10-100% of a height of the cavity.

24. The dielectric resonator antenna of claim 22, wherein the external strip extends away from the top wall by an amount between 10-100% of a height of the dielectric feed section.

25. The dielectric resonator antenna of claim 22, wherein the dielectric feed section is comprised of a different material than the resonator body.

26. The dielectric resonator antenna of claim 22, wherein the resonator body has a relative permittivity less than 10.

27. A method of fabricating a dielectric resonator antenna, the method comprising:

forming a substrate with at least a first planar surface;

depositing and patterning a feedline on the first planar surface of the substrate;

forming a polymer-based resonator body, comprising at least a first body portion, on the first planar surface of the substrate and at least partly upon the feedline;

exposing the polymer-based resonator body to a lithographic source via a pattern mask, wherein the pattern mask defines a first cavity and at least one second cavity to be formed in the polymer-based resonator body, the first cavity extending in a plane substantially perpendicular to the first planar surface and at least partially exposing a first feedline portion of the feedline;

developing at least one exposed portion of the polymer-based resonator body and removing the at least one exposed portion to reveal the first and at least one second cavities;

depositing a conductive feed structure within the first cavity, the feed structure electrically coupled to the first feedline portion and extending away from the feedline through the first cavity, wherein the feed structure extends away from the first feedline portion through the first cavity, and wherein depositing the feed structure within the first cavity comprises depositing a conductive material upon the first feedline portion to a height between 10-100% of the height of the first cavity.

28. The method of claim 27, wherein the forming is performed multiple times to progressively increase a thickness of the polymer-based resonator body.

29. The method of claim 27, wherein the forming comprises bonding at least one polymer-based material sheet.

30. The method of claim 27, wherein the forming comprises casting the polymer-based resonator body and baking at temperatures below 200° C.

31. The method of claim 27, wherein the lithographic source is an X-ray source.

32. The method of claim 27, wherein the lithographic source is an ultraviolet light source.

33. The method of claim 27, wherein the developing is performed at temperatures below 250° C.

34. The method of claim 27, wherein the feed structure is deposited using electroplating.

35. The method of claim 27, further comprising tuning the dielectric resonator antenna by controlling a feed structure height during the depositing.

36. The method of claim 27, wherein the first body portion is comprised of a dielectric material that is retained following fabrication.

37. The method of claim 27, wherein the forming the polymer-based resonator body, further comprises forming at least a second body portion in abutment to the first body portion.

38. The method of claim 37, wherein the second body portion is in abutment with an outer wall of the first body portion, and wherein the feed structure is fittingly engaged between the first body portion and the second body portion.

39. The method of claim 37, further comprising forming at least one second body portion within the at least one second cavity.

40. The method of claim 39, further comprising removing the first body portion after the second body portion is formed.

41. The method of claim 37, wherein the at least one second body portion is comprised of a different material than the first body portion.

42. The method of claim 27, wherein the polymer-based resonator body is comprised of a pure polymer photoresist material.

43. The method of claim 27, wherein the polymer-based resonator body is comprised of a composite polymer-based photoresist material.

44. A method of fabricating a dielectric resonator antenna, the method comprising:
  forming a substrate with at least a first planar surface;
  depositing and patterning a feedline formed on the first planar surface of the substrate;
  forming a polymer-based resonator body comprising:
    forming a first body portion disposed on the first planar surface of the substrate and at least partly upon the feedline;
    exposing the polymer-based resonator body to a lithographic source via a pattern mask, wherein the pattern mask defines a first cavity to be formed in the first body portion extending in a plane substantially perpendicular to the first planar surface, and wherein the pattern mask further defines a second cavity to be formed between a wall of the first cavity and an outer wall of the first body portion, wherein the second cavity exposes a first feedline portion of the feedline; and
    developing at least one exposed portion of the polymer-based resonator body and removing the at least one exposed portion to reveal the first cavity and the second cavity;
  further forming a second body portion provided within the first cavity; and
  depositing a conductive feed structure disposed within the second cavity, the feed structure electrically coupled to the first feedline portion and extending away from the feedline through the second cavity, wherein the feed structure extends away from the first feedline portion through the second cavity, and wherein depositing the conductive feed structure within the second cavity comprises depositing a conductive material upon the first feedline portion to a height between 10-100% of the height of the second cavity.

* * * * *